(12) United States Patent
Kai et al.

(10) Patent No.: US 6,782,017 B1
(45) Date of Patent: Aug. 24, 2004

(54) WAVELENGTH LOCKER AND WAVELENGTH DISCRIMINATING APPARATUS

(75) Inventors: Yutaka Kai, Kawasaki (JP); Hideyuki Miyata, Kawasaki (JP); Hiroshi Onaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/560,151

(22) Filed: Apr. 28, 2000

(30) Foreign Application Priority Data

May 6, 1999 (JP) .......................................... 11-126008

(51) Int. Cl.[7] .............................. H01S 3/13; H01S 3/10; H01S 3/098; G02F 1/07
(52) U.S. Cl. .............................. 372/29.02; 372/29.011; 372/9; 372/18; 372/32; 372/28; 359/247; 359/260
(58) Field of Search .............................. 372/29, 29.011, 372/29.02, 32, 28, 9, 18, 29.01, 23; 359/247, 260

(56) References Cited

U.S. PATENT DOCUMENTS 5,798,859 A * 8/1998 Colbourne et al. ......... 359/247

6,477,190 B1 * 11/2002 Komiyama et al. ........... 372/34

OTHER PUBLICATIONS

Patent Abstracts of Japan, of Japanese Patent Publication No. 10–322287 dated Dec. 4, 1998.

* cited by examiner

Primary Examiner—Don Wong
Assistant Examiner—Armando Rodriguez
(74) Attorney, Agent, or Firm—Staas & Halsey LLP

(57) ABSTRACT

An object of the invention is to provide a wavelength locker which has a wider locking range than that of the wavelength locker in the prior art and which can cope with a plurality of wavelengths. The aforementioned objects are achieved by a wavelength locker, which comprises a periodic filter, a detecting part for detecting the intensity of a laser beam through the periodic filter, and a controlling part for controlling the wavelength of the laser beam to a desired wavelength in accordance with the output of the detecting part. In this wavelength locker, the FSR of the periodical filter is controlled according to space between the wavelengths, and refers to the number of wavelength to be locked, so that the characteristics corresponding to output wavelengths that vary in every period twice the space of wavelengths and are complementary to each other, can be obtained, and the locking range will become wider.

18 Claims, 39 Drawing Sheets

| channel | wavelength | target value |
|---|---|---|
| ch 0 | $\lambda 0$ | Tg10 |
| ch 1 | $\lambda 1$ | Tg11 |
| ch 2 | $\lambda 2$ | Tg12 |
| ch 3 | $\lambda 3$ | Tg13 |
| ch 4 | $\lambda 4$ | Tg14 |
| ch 5 | $\lambda 5$ | Tg15 |
| ch 6 | $\lambda 6$ | Tg16 |
| ch 7 | $\lambda 7$ | Tg17 |

FIG. 28

|  | ch0 | ch1 | ch2 | ch3 | ch4 | ch5 | ch6 | ch7 |
|---|---|---|---|---|---|---|---|---|
| first PD 262-1 | ◎ |  |  | ◎ |  |  | ◎ |  |
| first PD 262-2 |  | ◎ |  |  | ◎ |  |  | ◎ |
| first PD 262-3 |  |  | ◎ |  |  | ◎ |  |  |
| second PD 264-1 | ◎ |  |  |  | ◎ |  |  |  |
| second PD 264-2 |  | ◎ |  |  |  | ◎ |  |  |
| second PD 264-3 |  |  | ◎ |  |  |  | ◎ |  |
| second PD 264-4 |  |  |  | ◎ |  |  |  | ◎ |

FIG. 30

|  |  | ch0 | ch1 | ch2 | ch3 | ch4 | ch5 | ch6 | ch7 |  |  |
|---|---|---|---|---|---|---|---|---|---|---|---|
| first PD 262-1 | ◎ |  |  | ◎ |  |  | ◎ |  |  | ◎ |  |  |
| first PD 262-2 |  | ◎ |  |  | ◎ |  |  | ◎ |  |  | ◎ |  |
| first PD 262-3 |  |  | ◎ |  |  | ◎ |  |  | ◎ |  |  | ◎ |
| second PD 264-1 | ◎ |  |  | ◎ |  |  | ◎ |  |  |  |  |  |
| second PD 264-2 |  | ◎ |  |  | ◎ |  |  | ◎ |  |  |  |  |
| second PD 264-3 |  |  | ◎ |  |  | ◎ |  |  | ◎ |  |  |  |
| second PD 264-4 |  |  |  | ◎ |  |  | ◎ |  |  |  | ◎ |  |

PMC : polarization maintaining couper
SLA : semiconductor laser amplifer
⇒ : polarization maintaining fiber
→ : single-mode fiber
— : signal line ⟹ : polarization maintaining fiber PMC : polarization maintaining couper
⇒ : polarization maintaining fiber

A.

B.

A.

B.

WAVELENGTH LOCKER AND WAVELENGTH DISCRIMINATING APPARATUS

BACKGROUND OF THE INVENTION

1. Field of the Invention

The present invention relates to a wavelength locker for locking the wavelength of a laser beam outputted from a laser source, at a specific wavelength and, more particularly, to a wavelength locker capable of arbitrarily setting a specific wavelength to be locked. The invention relates further to a multi-constant wavelength light source and a wavelength-division multiplexing light source using that wavelength locker. Further related is a wavelength discriminating apparatus for discriminating the wavelength of a laser beam to identify what the wavelength is of.

Especially, the WDM light source to be used in the WDM system has to output a laser beam in a plurality of wavelengths, whose spaces have to be given a grid determined for each channel (as will be abbreviated into the "ch") according to the advice of ITU-T. For this necessity, there has been investigated and developed the WDM light source.

2. Description of the Related Art

In the case of a WDM optical communication system, for example, in the prior art for wavelength-multiplexing eight optical signals, the WDM light source is provided with eight semiconductor lasers for oscillating laser beams with wavelengths different from each other. As these semiconductor lasers, moreover, there is used a distributed feedback laser (as will be abbreviated into the "DFB") and a distributed Bragg reflector laser (as will be abbreviated into the "DBR").

On the other hand, these semiconductor lasers are designed on the pitch of a diffraction grating so that a single-mode laser beam of a specific wavelength may be oscillated in a steady state. The semiconductor lasers will not always oscillate in the specific wavelength when they are ignited. In a steady state, too, some fluctuations are present so that the oscillation wavelength is not always locked at the specific wavelength.

In order to lock the oscillation wavelength at the specific wavelength, therefore, a wavelength locker is employed in the WDM light source.

In FIG. 38A, a laser beam outputted from a DFB laser 710 is inputted into a coupler 711 in a wavelength locker 700 for branching an input beam into two. After a portion of the laser beam was branched, the remaining laser beam is outputted from the wavelength locker 700. The DFB laser 710 is a semiconductor laser for oscillating, when in the steady state, a laser beam having a wavelength corresponding to a ch0.

In the wavelength locker 700, a portion of the laser beam branched by the coupler 711 is inputted into and branched by a coupler 712 for branching an input beam into two. One laser beam branched by the coupler 712 is inputted through a Fabry-Perot Etalon filter (as will be abbreviated into the "ET filter") into a first photodiode (as will be abbreviated into the "PD") 714 for outputting an electric current in accordance with a light-intensity so that its intensity is detected by the PD 714. This first PD 714 has an output value PDo1. On the other hand, the other laser beam branched by the coupler 712 is inputted into a second PD 715 for outputting an electric current in accordance with the light-intensity so that its intensity is detected by the PD 715. This second PD 715 has an output value PDo2.

The wavelength of the ET filter 713 for giving the maximal value of a light transmittance is so set that the value PDo1 standardized with the PDo2 in the wavelength to be locked, that is, the value PDo1/PDo2 may become a target value of 0.5.

And, a controlling CPU 716 receives those values PDo1 and PDo2 and sends a control signal for locking the oscillation wavelength of the DFB laser 710 at a specific wavelength in accordance with those detected values, to the DFB laser 710.

The wavelength locker 700 thus constructed operates in the following manners to lock the oscillation wavelength of the DFB laser 710 at the ch0.

After having ignited the DFB laser 710, the controlling CPU 716 receives the values PDo1 and PDo2 and calculates the value PDo1/PDo2. When this value PDo1/PDo2 is larger than the target value of 0.5, moreover, the controlling CPU 716 controls the DFB laser 710 by adjusting the drive current or temperature of the DFB laser 710 so that the oscillation wavelength may become longer. When the value PDo1/PDo2 at the time of igniting the DFB laser 710 is smaller than the target value of 0.5, on the other hand, the controlling CPU 716 controls the DFB 710 so that the oscillation wavelength may become shorter. Thus, the DFB laser 710 is controlled so that the value PDo1/PDo2 may always become 0.5, and the oscillation wavelength is locked at the ch0.

By the way, the controlling CPU 716 controls the oscillation wavelength merely by comparing the magnitudes of the value PDo1/PDo2 and the target value of 0.5. So, when the DFB laser 710 is ignited at wavelengths of points a, b, c and d of FIG. 38B, the oscillation wavelength can be locked at the desired ch0, but when the DFB laser 710 is ignited at wavelengths of points e and f, the oscillation wavelength is locked at wavelengths other than the ch0.

Considering the wavelength range at the ignition time of the DFB laser, therefore, the wavelength locker is designed to one specific wave to be locked.

Here, the wavelength range within which the wavelength locker can lock the oscillation wavelength of the laser at a desired wavelength with respect to the wavelength at the laser igniting time will be called the "locking range". Moreover, this locking range is determined by the free spectrum range (as will be abbreviated as "FSR") of the ET filter and can be widened by enlarging the FSR.

When the DFB laser 710 in FIG. 38A is replaced by a tunable wavelength laser capable of oscillating a single mode and making the oscillation wavelength continuously variable, on the other hand, there is employed a wavelength locker capable of oscillating a specific wavelength from a plurality of wavelengths to lock the oscillation wavelength.

In FIG. 39A, on the other hand, the construction of a wavelength locker 750 is similar to that of FIG. 38A excepting that the ET filter 713 of FIG. 38A is replaced by an ET filter 754 having an FSR conforming to the wavelength space to be locked, and its description will be omitted.

This locking range of the wavelength locker 750 is determined with the wavelength space of the WDM system, as shown in FIG. 39B, when it is used in the WDM tunable wavelength laser. This is because the ET filter is a periodic filter so that the value PDo1/PDo2 takes an identical value for every constant periods and because a controlling CPU 757 merely receives the values PDo1 and PDo2 so that it cannot discriminate points g and h, for example.

The locking range is about ±30 GHz in the wavelength locker which is used when each ch is located having wavelength spaces of 0.8 nm.

Thus, the WDM light source is constructed to include semiconductor lasers of different oscillation wavelengths in a number corresponding to that of wavelengths to be multiplexed. When preparatory semiconductor lasers are to be prepared for a breakage of the semiconductor lasers, therefore, they have to be prepared for every semiconductor lasers of different oscillation wavelengths. In the WDM light source for thirty two waves, for example, thirty two ordinary semiconductor lasers of different oscillation wavelengths are provided for every thirty two ch so that thirty two semiconductor lasers have to be individually prepared for the preparatory ones.

This means that a number of semiconductor lasers will become necessary when the degree of multiplicity increases with the future increase in the traffic.

By preparing a tunable wavelength laser capable of outputting a plurality of wavelengths, on the other hand, the number of semiconductor lasers could be reduced. In this case, however, there is no suitable wavelength locker.

Specifically, this light source outputs the plurality of wavelengths so that it cannot be easily coped with by the one-wave wavelength locker which is designed for one specific wave to be locked.

Since the locking range is narrow when the wavelength locker is used to cover a plurality of wavelengths, on the other hand, the tunable wavelength laser is locked at an unexpected wavelength when it is ignited over that locking range. In FIG. 39B, for example, the tunable wavelength laser is ignited to oscillate a wavelength of a ch1. When the tunable wavelength laser is ignited at the point h, the oscillation wavelength is locked at a ch2.

When the tunable wavelength laser capable of outputting the wavelengths is employed, moreover, an optical signal in operation of an optical communication system connected with the tunable wavelength laser is adversely affected if the laser beam is outputted into the optical communication system before the locking at the specific wavelength.

SUMMARY OF THE INVENTION

An object of the invention is to provide a wavelength locker and a WDM light source which have a wider locking range than of the wavelength locker in the prior art.

Another object of the invention is to provide a wavelength locker and a WDM light source, each of which can cope with a plurality of wavelengths.

Still another object of the invention is to provide a wavelength locker and a WDM light source which can lock an oscillation wavelength at a desired wavelength no matter what wavelength they might be ignited with at the start of an emission.

A further object of the invention is to provide a laser light source which can output a laser beam after the wavelength of the laser beam is locked at the desired wavelength.

A further object of the invention is to provide a wavelength discriminating apparatus making use of a major portion of a wavelength locker according to the invention for detecting the wavelength of a beam.

The aforementioned objects are achieved by a wavelength locker, which comprises a filter, a detecting part for detecting the intensity of a light through the filter, and a controlling part for controlling the wavelength of the light to a desired wavelength in accordance with the output of the detecting part.

In this wavelength locker, for example, the filter is exemplified by an interferometer, and the controlling part may decide the evenness/oddness of the desired wavelength when numbers are sequentially assigned to a plurality of wavelengths.

In this wavelength locker, on the other hand, the plurality of wavelengths are equally spaced so that the several characteristics of the filter may be determined according to the equal space and so that the controlling part may decide the evenness/oddness of the desired wavelength or may store a plurality of target values corresponding to the wavelengths when numbers are sequentially assigned to the wavelengths.

In this wavelength locker, moreover, the filter may be exemplified by a plurality of filters having different FSRs so as to provide a plurality of locking ranges, and the controlling part may lock the wavelength stepwise by using those locking ranges.

In this wavelength locker, moreover, the plurality of wavelengths are equally spaced so that the filter may be exemplified by a plurality of filters having several characteristics filter determined according to the equal spaces.

On the other hand, the WDM light source is constructed by providing such wavelength locker with a light source capable of oscillating a beam having a plurality of wavelengths. Alternatively, the WDM light source is, for example, constructed by providing such wavelength locker with a shading part for changing a light transmittance in accordance with the wavelength of a beam to be outputted from the light source. This light source is suited for a preparatory light source.

Moreover, the wavelength discriminating apparatus is constructed of a plurality of filters which have several characteristics determined according to equal spaces.

BRIEF DESCRIPTION OF THE DRAWINGS

The nature, the principle, and utility of the invention will become apparent from the following detailed description when read in conjunction with the accompanying drawings in which like parts are designated by identical reference numbers, in which:

FIG. 20 is a table enumerating relations between wavelengths and target values corresponding to the individual ch;

FIG. 28 is a table enumerating first corresponding relations between target value PD pairs and the individual ch;

FIG. 30 is a table enumerating second corresponding relations between target value PD pairs and the individual ch;

DESCRIPTIONS OF THE PREFERRED EMBODIMENTS

Figure 1:
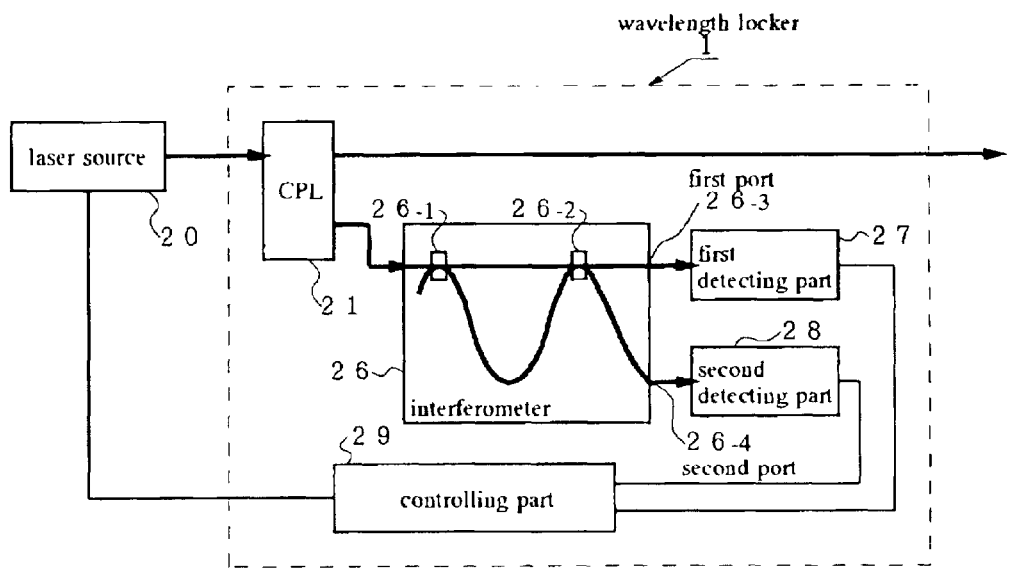
FIG. 1A is a diagram showing a construction of a first embodiment.
FIG. 1B illustrates output characteristics of individual detecting parts against a ch (wavelength)
Figure 1:
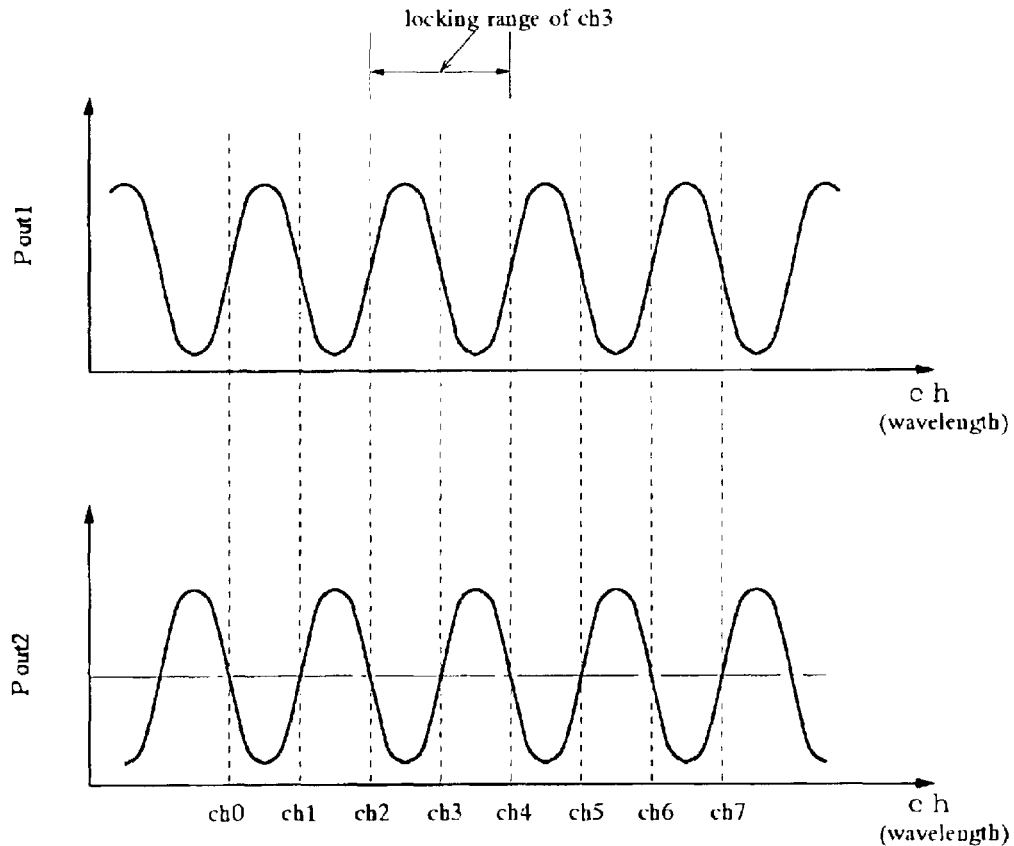

Embodiments of the invention will be described with reference to the accompanying drawings. In these Figures, the same constructions are designated by the same reference numerals, and their repeated description may be omitted.

[First Embodiment]

In FIG. 1A, a laser beam outputted from a laser source 20, which is an object of a control, is inputted into a wavelength locker 1. The laser beam inputted is branched in the wavelength locker 1 by a beam branching coupler 21. A portion of the branched laser beam is utilized for locking its own wavelength stably to a desired wavelength, and the remainder is outputted as an output light locked at the desired wavelength, from the wavelength locker 1.

In this wavelength locker 1, the portion of the laser beam, as branched in the aforementioned coupler 21, is inputted into an interferometer 26.

In this interferometer 26, the laser beam inputted is further branched into two by a branching part 26-1. The individual laser beams branched in the branching part 26-1 propagate through individual optical waveguides having optical path different from each other, and is inputted to an interfering part 26-2 to establish an interference. The optical path difference between the individual optical waveguides is made as a result of the interference between the individual laser beams such that an interference fringe is caused for a period corresponding to twice the wavelength space of the ch in the WDM system. Moreover, the interfering part 26-2 branches the interfering light, which is the interfering laser beam into two beams. The first interfering light thus interfered and branched in the interfering part 26-2 is outputted from a first port 26-3. On the other hand, the second interfering light thus interfered and branched in the interfering part 26-2 is outputted from a second port 26-4 by forming such an optical path difference between an optical path from the interfering part 26-2 to the first port 26-3 and an optical path from the interfering part 26-2 to the second port 26-4 as to delay the phase of the second interfering beam by a half period at the second port 26-4.

With these settings, the output value PDo2 is outputted after a half-period delay from the output value PDo1. As illustrated in FIG. 1B, therefore, the characteristics corresponding to wavelengths of the PDo1 and the characteristics corresponding to wavelengths of the Pdo2 are inverted from each other. As a result, the same value the PDo1/PDo2 appears twice the period of the wavelength space of the ch of the WDM system.

Here in FIG. 1B, the upper half illustrates the characteristics of the first detecting part, and the lower half illustrates the characteristics of the second detecting part. Moreover, the ordinates indicate the outputs of the individual detecting parts, and the abscissa indicates the ch (wavelength).

The first interfering beam outputted from the first port 26-3 is inputted into a first detecting part 27 for detecting the light-intensity thereof. The second interfering beam outputted from the second port 26-4 is inputted into a second detecting part 28 for detecting the light-intensity thereof.

Moreover, a controlling part 29 judges whether the ch of the desired wavelength is even-numbered or odd-numbered. The controlling part 29 receives the output of the first detecting part 27 and the output of the second detecting part 28 and calculates a detected value by dividing the output of the first detecting part 27 by the output of the second detecting part 28. The controlling part 29 outputs such a control signal to the laser source 20 that the detected value may become a target value. This target value is the value PDo1/PDo2 which is obtained when the laser source to be controlled oscillates with the desired wavelength, and is actually measured or theoretically calculated in advance.

In this wavelength locker 1, it is judged whether or not the ch of the desired wavelength is even-numbered or odd-numbered. Moreover, this locker 1 outputs the control signal to the laser source 20 to be controlled, so that the detected value of the output of the first detecting part 27 divided by the output of the second detecting part 28 may become the target value. As a result, the locker 1 is enabled to lock the wavelength of the laser beam, as outputted from the controlled laser source 20, at the desired wavelength by adjusting the drive current or temperature of the laser source 20 in accordance with that control signal. In short, the laser beam can be locked at the ch corresponding to the desired wavelength.

Not only between the even ch but also between the odd ch, on the other hand, the same value PDo1/PDo2 appears at every twice periods of the wavelength space of the ch of the WDM system. Therefore, the locking range of each ch is twice the wavelength space of the ch around the desired wavelength.

The wavelength locker 1 is enabled by using the interferometer 26 to produce the output signal which varies for twice the period of the wavelength space of the ch and which has characteristics corresponding to output wavelengths complementary to each other, so that it can have a wider locker range than that of the wavelength locker of the prior art.

Here, the controlling part 29 outputs the control signal by calculating the value PDo1/PDo2 but may calculate the value PDo1/PDo2 itself. This is similar in the following embodiments, too.

[Second Embodiment]

Figure 2:
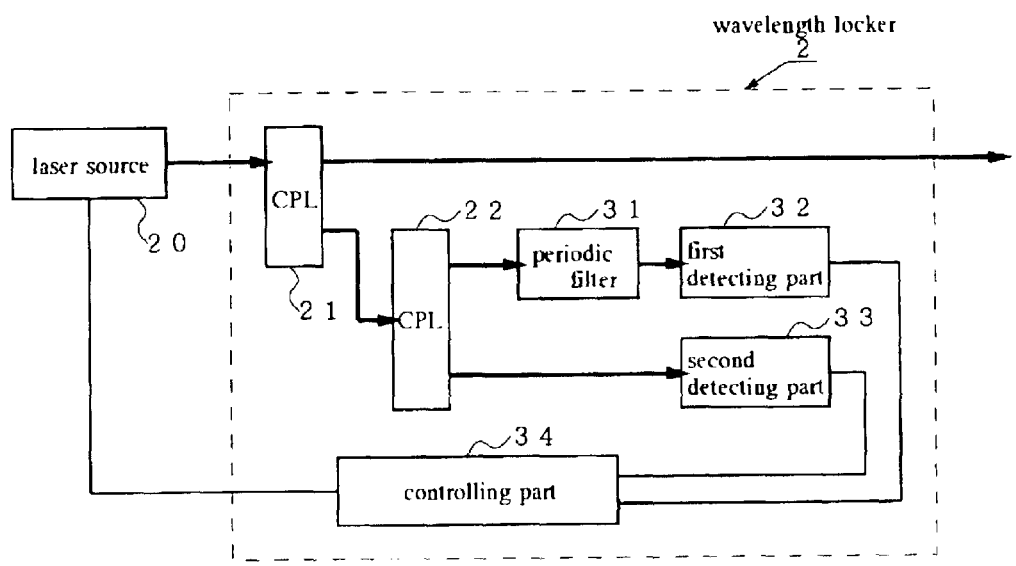
FIG. 2A is a diagram showing a construction of a second embodiment.
FIG. 2B illustrates output characteristics of a first detecting part against the ch (wavelength)
Figure 2:
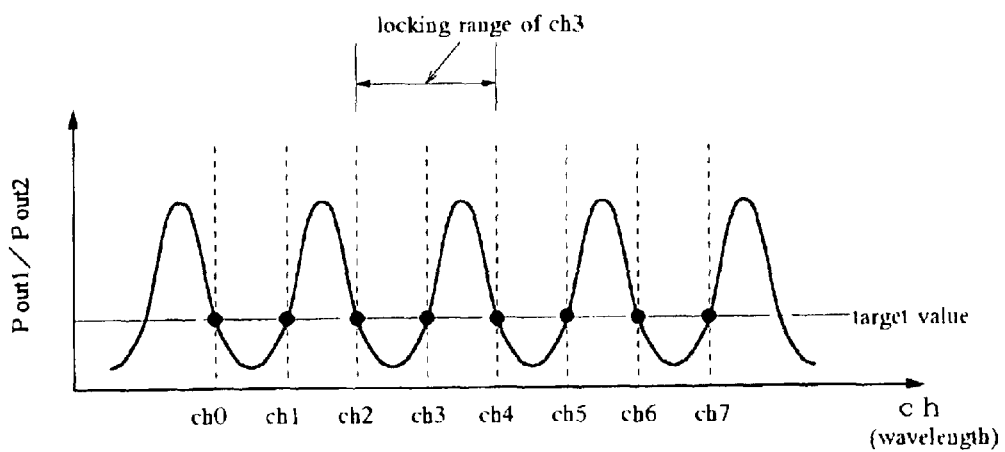

In FIG. 2A, a laser beam outputted from a laser source 20, which is an object of a control, is inputted into a wavelength locker 2. The laser beam inputted is branched in the wavelength locker 2 by a beam branching coupler 21. A portion of the branched laser beam is utilized for locking its own wavelength stably to a desired wavelength, and the remainder is outputted as an output light locked at the desired wavelength, from the wavelength locker 2.

In this wavelength locker 2, portions of the laser beams, as branched by the coupler 21, are further branched by a beam branching coupler 22. One laser beam, as branched by the coupler 22, is inputted into a first detecting part 32 for detecting the light-intensity of the laser beam through a periodic filter 31. The FSR of this periodic filter 31 is set to a period corresponding to twice the wavelength space of the ch in the WDM system. Moreover, the finesse of the periodic filter is so set that the space of two adjoining wavelengths for any value (target value) of a light transmittance may become the wavelength space of the ch. The finesse is a ratio between the FSR and a full width half maximum. As illustrated in FIG. 2B, moreover, the light transmittance as a function of wavelengths of the periodic filter is so set that the wavelength for that target value and the wavelength for each ch may coincide.

Here, the ordinate of FIG. 2B indicates the output of the first detecting part, as standardized with the output of the second detecting part, and the abscissa indicates the ch (wavelength).

With these settings, as illustrated in FIG. 2B, any even ch is arranged on a shoulder from the maximal value to the minimal value, but any odd ch is also arranged at a should from the minimal value to the maximal value. Between the even ch, therefore, the same value PDo1/PDo2 appears at twice the period of the wavelength space of the ch of the WDM system. Between the odd ch, too, the same value PDo1/PDo2 appears for twice the period of the ch wavelength space of the WDM system.

On the other hand, the other laser beam branched by the coupler 22 is inputted into a second detecting part 33 for detecting the light-intensity thereof.

Moreover, a controlling part 34 receives the output of the first detecting part 32 and the second detecting part 33 and standardizes the former with the latter. The controlling part 34 outputs the control signal to the controlled laser source 20 so that the standardized detected value may become the aforementioned target value.

In this wavelength locker 2, it is judged whether or not the ch of the desired wavelength is even-numbered or odd-numbered. Moreover, this locker 2 outputs the control signal to the laser source 20 to be controlled, so that the detected value of the output of the first detecting part 32 divided by the output of the second detecting part 33 may become the target value. As a result, the locker 1 is enabled to lock the wavelength of the laser beam, as outputted from the controlled laser source 20, at the desired wavelength by adjusting the drive current or temperature of the laser source 20 in accordance with that control signal. In short, the laser beam can be locked at the ch corresponding to the desired wavelength.

Not only between the even ch but also between the odd ch, on the other hand, the same value PDo1/PDo2 appears at every twice periods of the wavelength space of the ch of the WDM system. Therefore, the locking range of each ch is twice the wavelength space of the ch around the desired wavelength.

In the wavelength locker 2 can adjust a space between the locking points of the desired wavelength to be equal to the wavelength space of the ch by adjusting the FSR and the finesse thereby to make the locking range wider than that of the wavelength locker of the prior art.

Since the output of the first detecting part 32 is standardized with the output of the second detecting part 33, moreover, it is possible to compensate the output fluctuation of the first detecting part 32 which is caused by noises or aging.

In the description made above, any even ch is arranged on a shoulder from the maximal value to the minimal value, and any odd ch is arranged on a shoulder from the minimal value to the maximal value, but vice versa.

[Third Embodiment]

Figure 3:
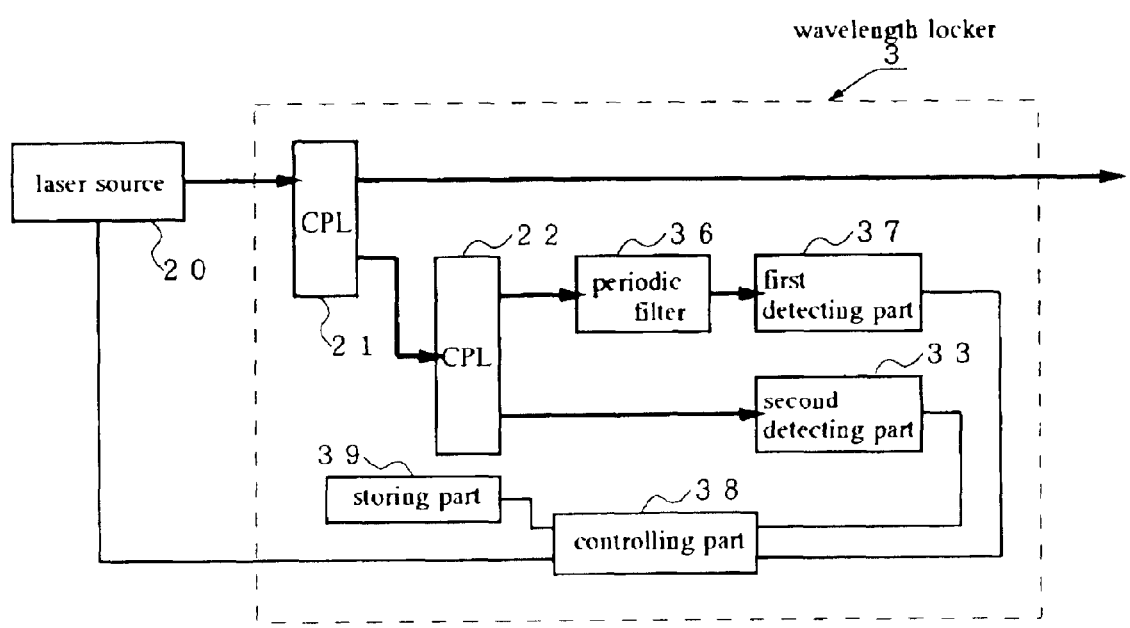
FIG. 3 is a diagram showing a construction of a third embodiment.

In FIG. 3, a laser beam outputted from a laser source 20, which is an object of a control, is inputted into a wavelength locker 3. The laser beam inputted is branched in the wavelength locker 3 by a beam branching coupler 21. A portion of the branched laser beam is utilized for locking its own wavelength stably to a desired wavelength, and the remainder is outputted as an output light locked at the desired wavelength, from the wavelength locker 3.

In this wavelength locker 3, portions of the laser beams, as branched by the coupler 21, are further branched by a beam branching coupler 22. One laser beam, as branched by the coupler 22, is inputted into a first detecting part 37 for detecting the light-intensity of the laser beam through a periodic filter 36.

This periodic filter 36 is so fabricated that one half of the FSR may be no less than the wavelength space between the first ch and the last ch of the WDM system. Moreover, the other laser beam, as branched by the coupler 22, is inputted into the second detecting part 33 for detecting the light-intensity thereof.

The output of the first detecting part 37 and the output of the second detecting part 33, as obtained with the laser beam of the wavelength corresponding to each ch, is actually measured or theoretically calculated in advance. From this result, the target value is obtained as the output of the first detecting part 37, as standardized with the output of the second detecting part 33. In a storing part 39, moreover, there is prepared a table showing relations the wavelengths of the individual ch and the target value in the WDM system, and these relations are stored.

Moreover, a controlling part 38 receives the output of the first detecting part 37 and the output of the second detecting part 33, and standardizes the former output with the latter output. The controlling part 38 outputs the control signal to the controlled laser source 20 so that the standardized detected value may become the target value corresponding to the desired wavelength, as defined by the relations stored in the storing part 39.

In this wavelength locker 3, the wavelength of the laser beam outputted from the controlled laser source 20 can be locked at the desired wavelength by adjusting the drive current or temperature of the controlled laser source 20 so that the detected value of the standardized output of the first detecting part 37 may become the target value obtained from the relations in the storing part 39.

Even when the multiplicity of the WDM system increases or decreases so that the wavelength range to be oscillated by the controlled laser source 20 changes, on the other hand, this change can be coped with in the wavelength locker 3 by adjusting the FSR of the periodic filter 36. This can be applied to the case in which the controlled laser source 20 is not only a tunable wavelength laser capable of oscillating a plurality of wavelengths but also a laser for oscillating only one wavelength. The locking range of this case is changed from the maximal value to the minimal value of the FSR.

Moreover, the value of the output of the first detecting part 37, as standardized with the output of the second detecting part 33, corresponds to the light transmittance of the periodic filter 36. The individual values, as corresponding to the wavelengths of the individual ch, of the output of the first detecting part 37 standardized with the output of the second detecting part 33 are arranged at the wavelength space of the ch on the light transmittance as a function of wavelengths of the periodic filter 36. As a result, the locking range of each ch can be extended by one period of the periodic filter 36. In the case of the periodic filter having the FSR of one period of 90 ch (72 nm), for example, the locking range is 72 nm. Here, the boundary of the locking range corresponding to each ch is not contained.

In the wavelength locker 3, the individual locking points are arranged at an interval according to the wavelength space of the ch in the inclined portion of the light transmittance of the periodic filter, so that the locking range can be made wider than that of the wavelength locker of the prior art.

Since the output of the first detecting part 37 is standardized with the output of the second detecting part 33, moreover, it is possible to compensate the output fluctuation of the first detecting part 37 which is caused by noises or aging.

[Fourth Embodiment]

Figure 4:
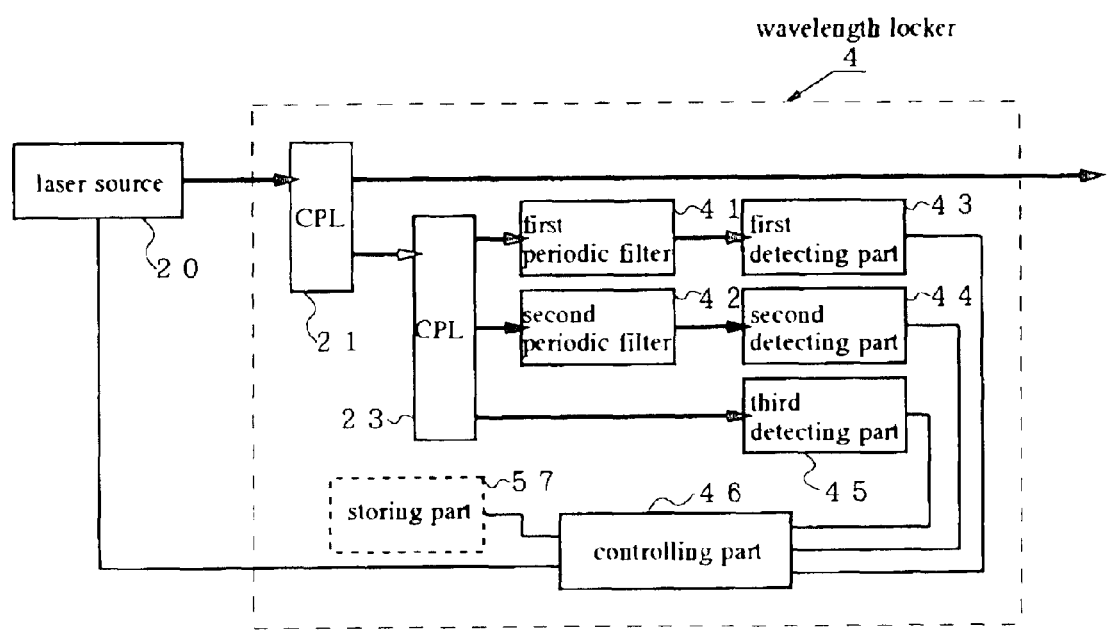
FIG. 4 is a diagram showing a construction of a fourth embodiment.

In FIG. 4, a laser beam outputted from a laser source 20, which is an object of a control, is inputted into a wavelength locker 4. The laser beam inputted is branched in the wavelength locker 4 by a beam branching coupler 21. A portion of the branched laser beam is utilized for locking its own wavelength stably to a desired wavelength, and the remainder is outputted as an output light locked at the desired wavelength, from the wavelength locker 4.

In a wavelength locker 4, as shown in FIG. 4, portions of the laser beams, as branched by the coupler 21, are further branched by a coupler 23 for branching it. One of the laser beams, as branched by the coupler 23, is inputted into a first detecting part 43 for detecting the light-intensity thereof through a first periodic filter 41 having a first FSR. On the other hand, the other laser beam branched by the coupler 23 is inputted into a second detecting part 44 for detecting the light-intensity thereof through a second periodic filter 42 having a second FSR different from the first FSR.

Moreover, a controlling part 46 controls the wavelength of the laser beam according to the output of the first detecting part 43, and then outputs the control signal to the controlled laser source 20 so that the wavelength of the laser beam may become the desired wavelength, according to the output of the second detecting part 44.

Especially, the wavelength locker 4 may be modified, as shown in FIG. 4, such that the coupler 23 is replaced by a coupler for branching the beam into three, and such that it is additionally provided with a third detecting part 45 for receiving the third laser beam branched by the coupler 23, and for detecting the light-intensity of the third laser beam.

In this modification, the first periodic filter 41, the second periodic filter 42 and the controlling part 46 are fabricated in the following manners.

The first periodic filter 41 is set to have such a first FSR that the oscillation wavelength of the laser beam at the start of emission of the laser beam may exist between two wavelengths which are the closest to an initial locking wavelength $\lambda$int for giving the same light transmittance as that for the initial locking wavelength $\lambda$int. The second periodic filter 42 is set such that the second FSR is different from the first FSR and has the wavelength space of the ch in the WDM system. Here, the initial target value is set to the output of the first detecting part 43, as standardized with the output of the third detecting part 43, when the laser beam of the $\lambda$int is received.

Moreover, the controlling part 46 receives the outputs of the first detecting part 43 to the third detecting part 45 and calculates the first detected value by standardizing the output of the first detecting part 43 with the output of the third detecting part 45. The controlling part 46 controls the controlled laser source 20 so that the first detected value may become the aforementioned value of the light transmittance, i.e., the initial target value. After this, the controlling part 46 calculates the second detected value by standardizing the output of the second detecting part 44 with the output of the third detecting part 45. According to this detected value, the controlling part 46 outputs the control signal to the controlled laser source 20 so that the wavelength of the laser beam may become the desired wavelength.

Especially, the wavelength locker 4 may be modified, as shown in FIG. 4, such that the coupler 23 is replaced by a coupler for branching the beam into three, and such that it is additionally provided with the third detecting part 45 for receiving the third laser beam branched by the coupler 23 and for detecting the light-intensity of the third laser beam, and a storing part 57 for outputting the stored content to the controlling part 46. Here, the output of the first detecting part 43 and the output of the third detecting part 45, as obtained with the laser beam having the wavelength corresponding to each ch, are actually measured or theoretically calculated in advance. These results produce the target value of the output of a first detecting part 53, as standardized with the output of the third detecting part 45. The storing part 57 is prepared with a table showing relations between the wavelengths of the individual ch in the WDM system and that target value, and is stored with those relations.

In this modification, the first periodic filter 41, the second periodic filter 42 and the controlling part 46 are fabricated in the following manners.

The first periodic filter 46 is so set that one half of its FSR is no less than the wavelength space between the first ch and the last ch in the WDM system. On the other hand, the second periodic filter is so set that its FSR is the wavelength space of the ch in the WDM system.

Moreover, the controlling part 46 receives the outputs of the first detecting part 43 to the third detecting part 45, and calculates the first detected value at which the output of the first detecting part 43 is standardized with the output of the third detecting part 45. The controlling part 46 controls the controlled laser source 20 so that the first detected value may become the target value in the desired wavelength, as indicated in the relations stored in the storing part 57. After this, the controlling part 46 calculates the second detected value by standardizing the output of the second detecting part 44 with the output of the third detecting part 45. According to the second detected value, the controlling part 46 outputs the control signal to the controlled laser source 20 so that the wavelength of the laser beam may become the desired wavelength.

According to the output of the first detecting part 43, the wavelength locker 4 controls the oscillation wavelength of the controlled laser source 20 up to the locking range for the desired wavelength of the second periodic filter 42. After this, the wavelength locker 4 controls the oscillation wavelength of the controlled laser source 20 to the desired wavelength, according to the output of the second detecting part 44.

By setting the first FSR wide, therefore, it is possible to widen the locking range for the igniting wavelength (as will be called the "initial locking range").

Since the setting of the first periodic filter 41 can be freely changed independently of the wavelength space of each ch, on the other hand, the initial locking range can be set according to the igniting wavelength.

In the wavelength locker 4, the control is made at the two stages of the control stage for locking the igniting wavelength substantially to the initial locking wavelength and the control stage for locking the initial locking wavelength at the desired wavelength. As a result, the initial locking range for locking the initial locking wavelength can be freely set so that the locking range can be made wider than that of the wavelength locker of the prior art. Moreover, it is unnecessary to make any special design for the laser source.

[Fifth Embodiment]

Figure 5:
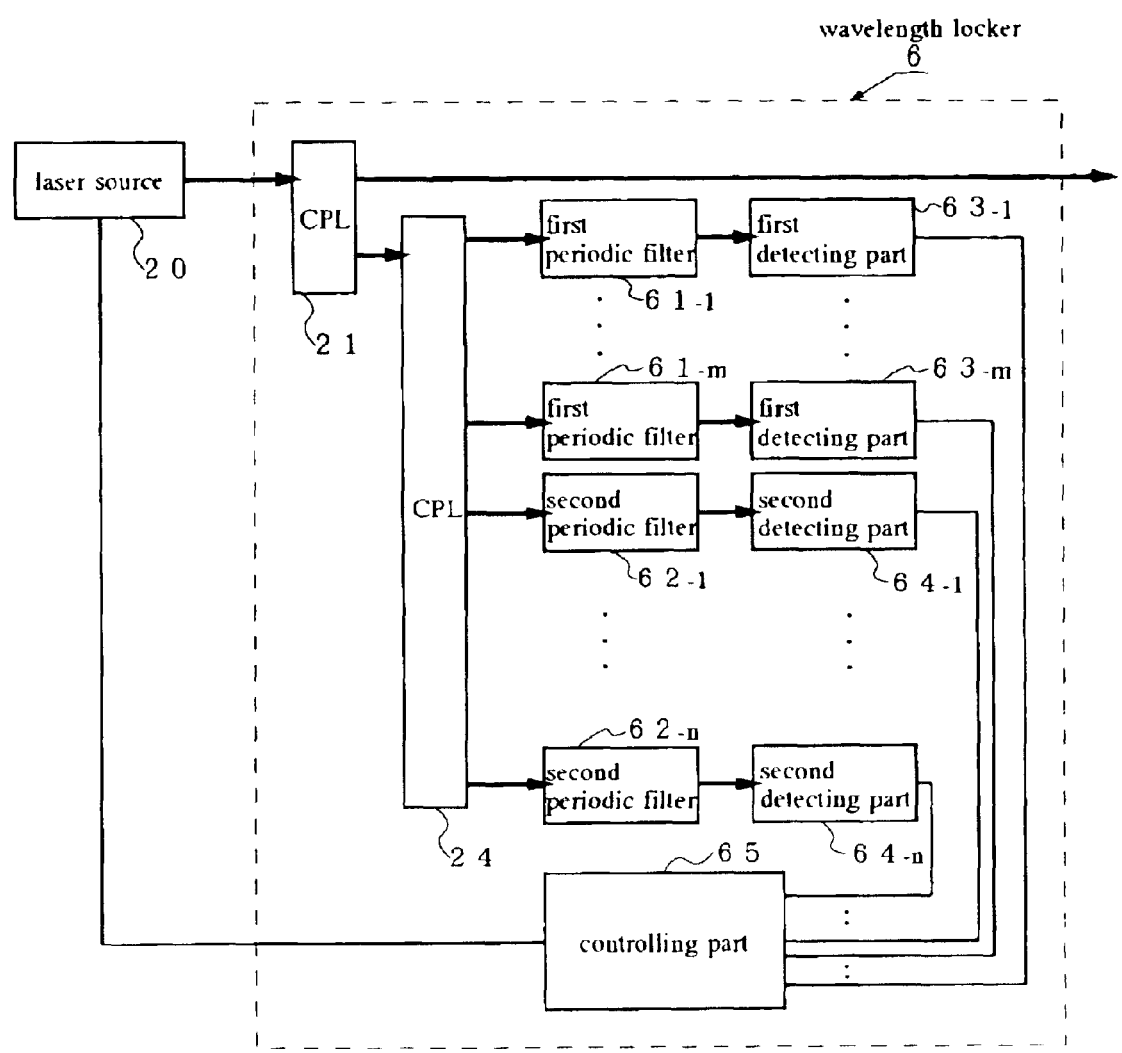
FIG. 5 is a diagram showing a construction of a fifth embodiment.

In FIG. 5, a laser beam outputted from a laser source 20, which is an object of a control, is inputted into a wavelength locker 6. The laser beam inputted is branched in the wavelength locker 6 by a beam branching coupler 21. A portion of the branched laser beam is utilized for locking its own wavelength stably to a desired wavelength, and the remainder is outputted as an output light locked at the desired wavelength, from the wavelength locker 6.

In this wavelength locker 6, portions of the laser beams, as branched by the coupler 21, are further branched by a coupler 24 for branching the beam into all of a plurality of first periodic filters 61-1 to 61-m and a plurality of second periodic filters 62-1 to 62-n, as will be described hereinafter.

Portions of the plurality of laser beams branched by the coupler 24 are inputted into first detecting parts 63-1 to 63-m which are individually connected with the first periodic filters 61-1 to 61-m for detecting the light-intensities of the laser beams through the first periodic filters 61-1 to 61-m connected. Moreover, the other portions of the laser beams branched by the coupler 24 are inputted into second detecting parts 64-1 to 64-n which are individually connected with the second periodic filters 62-1 to 62-n for detecting the light-intensities of the laser beams through the second periodic filters 62-1 to 62-n connected.

The individual first periodic filters 61-1 to 61-m share a common FSR, which is set to integer times of the wavelength space of the ch in the WDM system. The individual second periodic filters 62-1 to 62-n share the common FSR, which is different from the FSR of the first periodic filters 61-1 to 61-m and which is set to integer times of the wavelength space of the ch in the WDM system.

By thus setting the FSR of each periodic filter, a laser beam of a wavelength $\lambda x$ can be outputted, when inputted, at a specific value only from the specific ones of the first detecting parts 63-1 to 63-m but not at a specific value from the remaining ones of the first detecting parts 63-1 to 63-m. In the second detecting parts 64-1 to 64-n, too, the laser beam of the wavelength $\lambda x$ can be outputted at a specific value only from the specific ones of the detecting parts 64-1 to 64-n but not at a specific value from the remaining ones of the detecting parts 64-1 to 64-n.

Moreover, the controlling part 65 receives the outputs of the first detecting parts 61-1 to 61-m and the second detecting parts 62-1 to 62-n, and outputs the control signal to the controlled laser source 20 so that the outputs may be obtained at a specific value from the first detecting parts 63-1 to 63-m and the second detecting parts 64-1 to 64-n for outputting against the desired wavelength.

This wavelength locker 6 is enabled to discriminate the wavelength of the laser beam at the raising time of the controlled laser source 20 by identifying what of the first detecting parts 63-1 to 63-m and the second detecting parts 64-1 to 64-n it has receives the outputs at the specific values from. By comparing the discriminated wavelength and the desired wavelength, the wavelength locker 6 decides whether the oscillation wavelength of the controlled laser source 20 is to be shifted to the shorter or longer wavelength side, and outputs the control signal to the controlled laser source 20. The wavelength locker 6 is enabled to lock the oscillation wavelength at the desired wavelength by receiving the outputs at the specific values from only those, as will output the specific value against the desired wavelength, of the first detecting parts 63-1 to 63-m and the second detecting parts 64-1 to 64-n.

The wavelength locker 6 is enabled to output to the specific detecting parts for the specific ch by using the plurality of periodic filters of different FSRs so that its locking range can be made wider than that of the wavelength locker of the prior art. Moreover, it is unnecessary to make any special design for the laser source.

[Sixth Embodiment]

Figure 6:
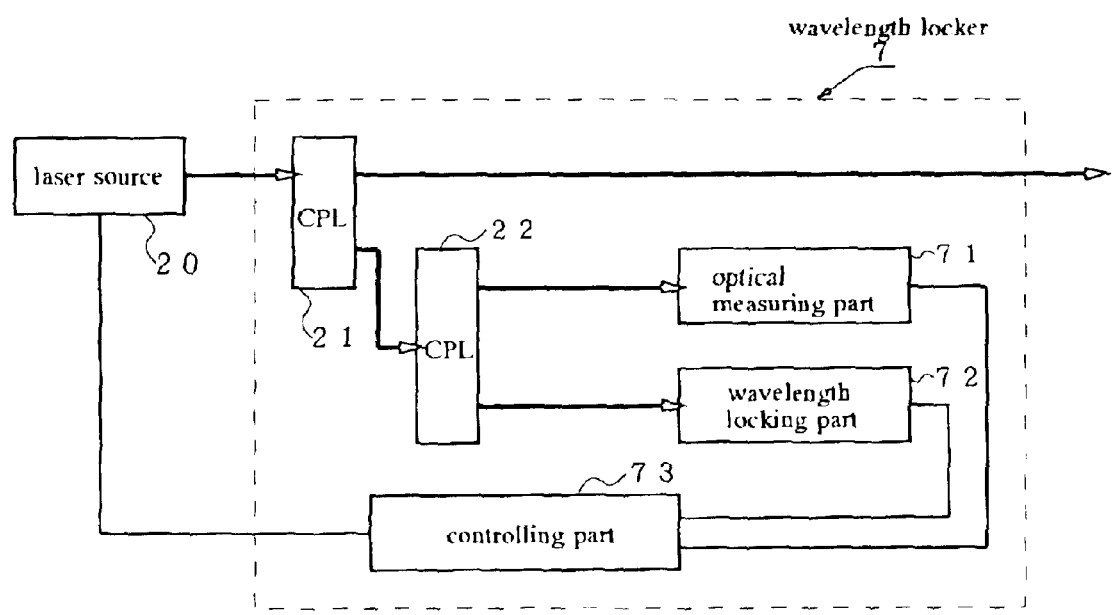
FIG. 6 is a diagram showing a construction of a sixth embodiment.

In FIG. 6, a laser beam outputted from a laser source 20, which is an object of a control, is inputted into a wavelength locker 7. The laser beam inputted is branched in the wavelength locker 7 by a beam branching coupler 21. A portion of the branched laser beam is utilized for locking its own wavelength stably to a desired wavelength, and the remainder is outputted as an output light locked at the desired wavelength, from the wavelength locker 7.

In this wavelength locker 7, portions of the laser beams branched by the coupler 21 are further branched by the coupler 22 for branching the beam. One laser beam branched by the coupler 22 is inputted an optical measuring part 71 for receiving the laser beam to measure the light-intensity of the laser beam and the wavelength at the light-intensity. A controlling part 73 receives the output of the optical measuring part 71 and outputs a control signal for adjusting the wavelength of the laser beam to be equal to the locking range of a desired wavelength in a wavelength locking part 72, to the controlled laser source 20 in accordance with the output of the optical measuring part 71.

The other laser beam branched by the coupler 22 is inputted into the wavelength locking part 72. After the wavelength of the laser beam to be outputted from the controlled laser source 20 was fitted for the locking range in the desired wavelength by the controlling part 73, the wavelength locking part 72 receives the laser beam and outputs the control signal for locking the beam wavelength at the desired wavelength, to the controlled laser source 20 in accordance with the light-intensity of that laser beam.

In this wavelength locker 7, the igniting wavelength is measured at first by the optical measuring part 71, and the oscillation wavelength of the controlled laser source 20 is so adjusted according to the measurement result as to fit for the locking range of the desired wavelength in the wavelength locking part 72. After this, the oscillation wavelength is locked at the desired wavelength by the wavelength locking part 72. No matter what wavelength the laser source 20 to be controlled might ignite at, therefore, it can be locked at the desired wavelength. Moreover, it is unnecessary to make any special design for the laser source.

[Seventh Embodiment]

Figure 7:
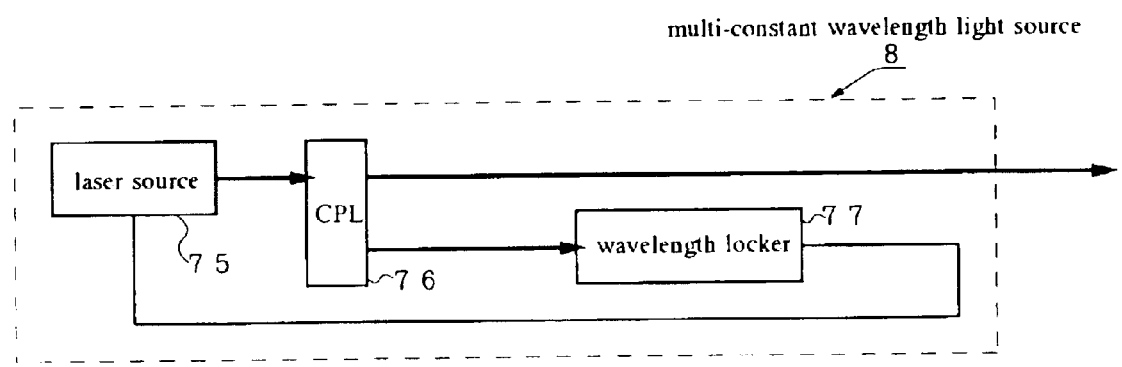
FIG. 7 is a diagram showing a construction of a seventh embodiment.

In FIG. 7, a multi-constant wavelength light source 8 for stably outputting a laser beam of a specific wavelength locked at a desired wavelength is constructed to include a laser source 75 capable of emitting a laser beam of the desired wavelength, and a wavelength locker 77 for receiving the laser beam to lock it substantially at the desired wavelength according to the light-intensity of the laser beam. The wavelength locker 77 is constructed of the wavelength locker 1, 2, 3, 4, 6, or 7, as has been described in connection with the first to sixth embodiments.

This multi-constant wavelength light source 8 is enabled to output a laser beam of a wavelength locked at a specific value even for any wavelength because it incorporates the wavelength locker 1, 2, 3, 4, 6, or 7.

[Eighth Embodiment]

Figure 8:
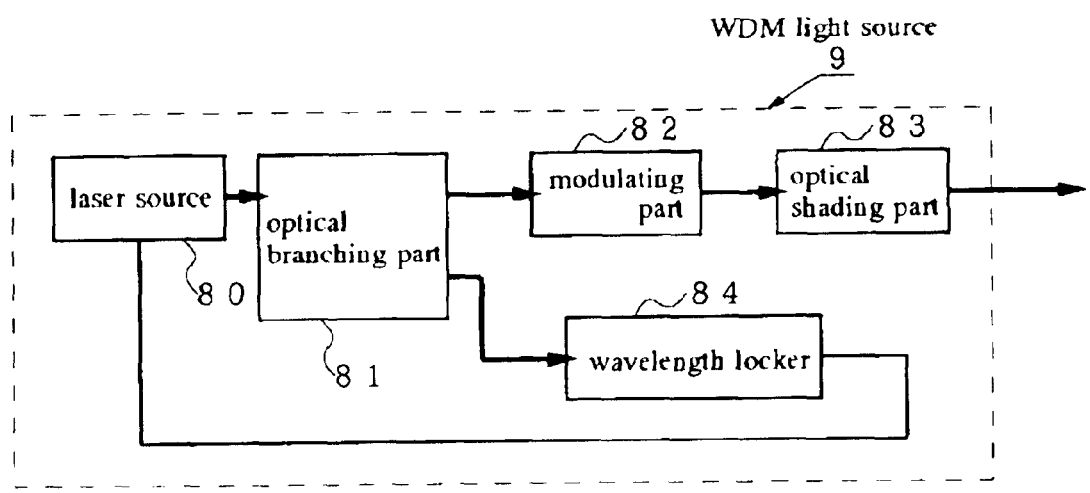
FIG. 8 is a diagram showing a construction of an eighth embodiment.

In a WDM light source 9, as shown in FIG. 8, a laser beam, as outputted from a laser source 80 capable of emitting laser beams of a plurality of wavelengths, is inputted into an optical branching part 81 for branching the laser beam into two while maintaining its polarization.

The first branched beam is inputted into and modulated by a modulating part 82 for modulating it with an information to be sent out. The laser beam outputted from the modulating part 82 is inputted into an optical shading part 83. This optical shading part 83 transmits the output light of the modulating part 82, if at the desired wavelength, but shades it otherwise.

The second branched beam, as branched by the optical branching part 81, is inputted into a wavelength locker 84. This wavelength locker 84 receives the second branched beam and locks the laser beam substantially at the desired wavelength according to the light-intensity of the second branched beam.

Especially in the WDM light source 9, as shown in FIG. 8, the wavelength locker 84 may be constructed of the wavelength locker 1, 2, 3, 4, 6, or 7, as has been described in connection with the first to sixth embodiments.

This WDM light source 9 is provided with the optical shading part 83 for transmitting/shading the laser beam in dependence upon whether or not the beam is at the desired wavelength. Even when the laser source is ignited not at the desired wavelength or when the desired wavelength is not established after the ch was changed in the WDM system, therefore, the laser beam is not outputted from the optical shading part 83 till the desired wavelength is locked. In an optical communication system having the WDM light source 9 connected therewith, therefore, an optical signal being operated is not adversely affected by a crosstalk or the like.

Therefore, this WDM light source 9 is suitable especially as a preparatory light source in the WDM light source.

[Ninth Embodiment]

Figure 9:
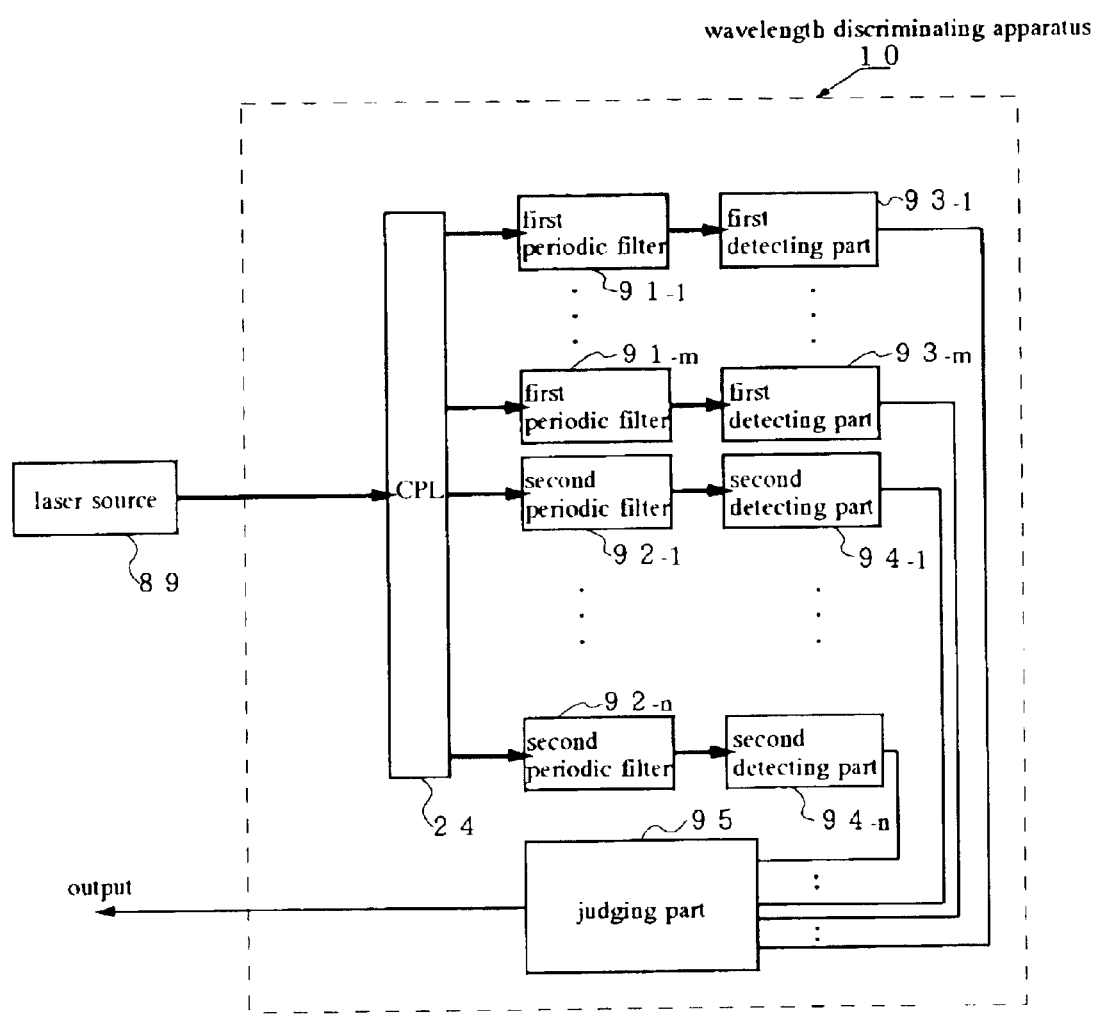
FIG. 9 is a diagram showing a construction of a ninth embodiment.

In FIG. 9, a beam outputted from a light source 89 to be examined is inputted into a coupler 90 disposed in a wavelength discriminating apparatus 10 for branching the beam. The coupler 90 branches the beam to all of a plurality of first periodic filters 91-1 to 91-m and a plurality of second periodic filters 92-1 to 92-n, as will be described in the following. Portions of the branched beams are inputted into first detecting parts 93-1 to 93-m which are individually connected with the first periodic filters 91-1 to 91-m for detecting the light-intensities through the first periodic filters 91-1 to 91-m connected. The others of the beams branched by the coupler 90 are inputted into second detecting parts 94-1 to 94-n which are individually connected with the second periodic filters 92-1 to 92-n for detecting the light-intensities of the laser beams through the second periodic filters 92-1 to 92-n connected.

The individual first periodic filters 91-1 to 91-m share a common FSR, which is set to integer times of a resolution. The individual second periodic filters 92-1 to 92-n share the common FSR, which is different from that of the first periodic filters 91-1 to 91-n and which is set to integer times of a resolution.

When a beam of a wavelength $\lambda y$ is inputted into this wavelength discriminating apparatus 10, an output of the maximal value light-intensity can be obtained at the specific ones of the first detecting parts 93-1 to 93-m, and only a lower output can be obtained from the remainder. For the beam of the wavelength $\lambda y$, too, the output of the maximal value light-intensity can be obtained from the specific ones of the second detecting parts 94-1 to 94-n, and only a lower output can be obtained from the remainder.

Moreover, a judging part 95 receives the outputs of the first detecting parts 93-1 to 93-m and the second detecting parts 94-1 to 94-n, and identifies what of the first detecting parts 93-1 to 93-m and the second detecting parts 94-1 to 94-n the maximum output is obtained. According to this identification result, the judging part 95 judges the wavelength of the detected light source 89, and outputs a signal indicating the judgment result.

Therefore, the wavelength discriminating apparatus 10 can discriminate the wavelength of the beam of the examined light source 89 according to the judgment result.

Here, in the first to ninth embodiments, the controlled laser source may be either a laser source aiming at emitting only one wavelength or a tunable wavelength laser source aiming at emitting a plurality of wavelengths, if it can emit a laser beam of a desired wavelength.

[Tenth Embodiment]

Figure 10:
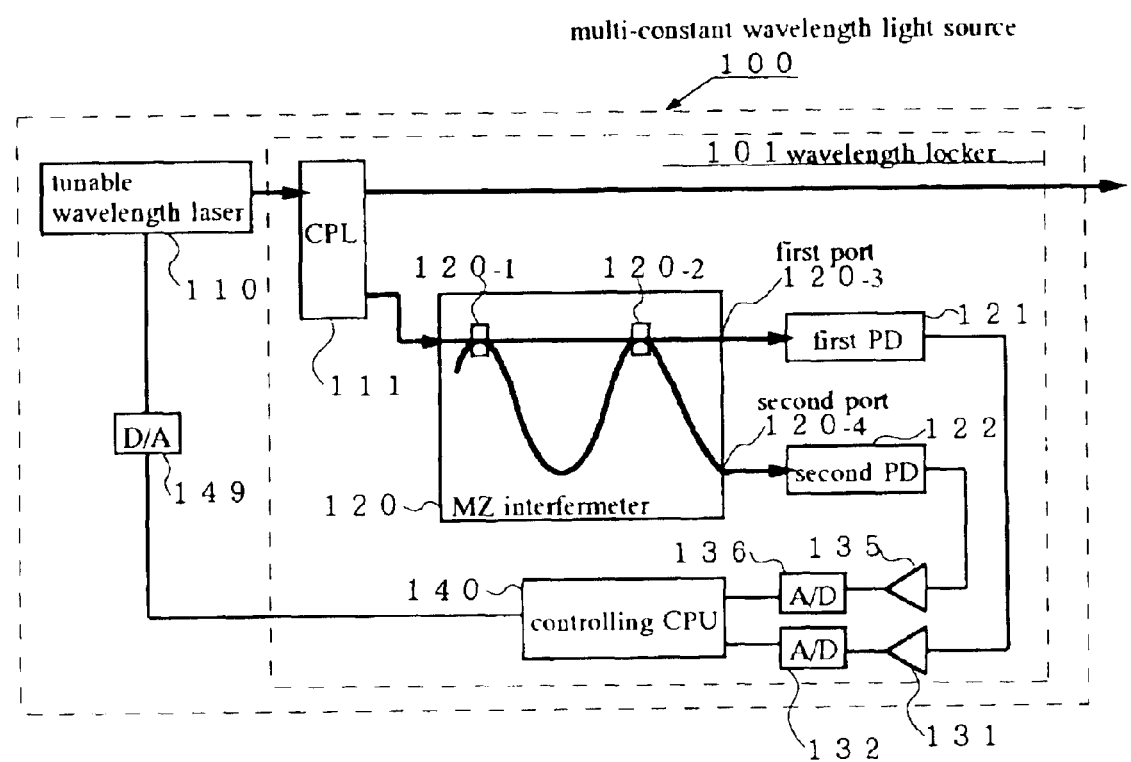
FIG. 10 is a diagram showing a construction of a tenth embodiment.

In FIG. 10, a laser beam outputted from a tunable wavelength laser 110 is inputted into a coupler (CPL) 111 in a wavelength locker 101 for branching the beam into two. After a portion of the laser beam was branched, the remaining laser beam is outputted from the wavelength locker 101 and is further outputted as an output beam from the multi-constant wavelength light source 100. The tunable wavelength laser 110 is a tunable wavelength DBR laser which is enabled to emit laser beams of a plurality of wavelengths by increasing/decreasing a drive current (an injection current). The tunable wavelength DBR laser can output eight-wave single-mode laser beams of different wavelengths.

In the wavelength locker 101, portions of the laser beams branched by the coupler 111 are inputted into a Mach-Zehnder interferometer (as will be abbreviated into the "MZ interferometer") 120.

In this MZ interferometer 120, the inputted laser beam is further branched by a branching portion 120-1 for branching the beam into two. The first laser beams branched are inputted into an interfering part 120-2 after having propagated through a first optical waveguide. The second laser beams branched are inputted into the interfering part 120-2 after having propagated through a second optical waveguide.

Here, the second optical waveguide is provided with such an optical path difference with respect to the first optical waveguide as to form interference fringes for a period of 1.6 nm (200 GHz) twice the wavelength space of the ch in the WDM system as a result of the interference's of the individual laser beams. Moreover, the interfering part 120-2 causes the individual lasers having propagated through the first optical waveguide and the second optical waveguide to interfere with each other, and branches the interfering light into two laser beams. The first interfering light branched is outputted from a first port 120-3. The second interfering light, as caused to interfere and branched in the interfering part 120-2, is outputted from a second port 120-4 while forming such an optical path difference between an optical path from the interfering part 120-2 to the first port 120-3 and an optical path from the interfering part 120-2 to the second port 120-4 as to delay the phase of the second interfering light at the second port 120-4 by a half period (0.8 nm) from the phase of the first interfering line at the first port 120-3.

Figure 11:
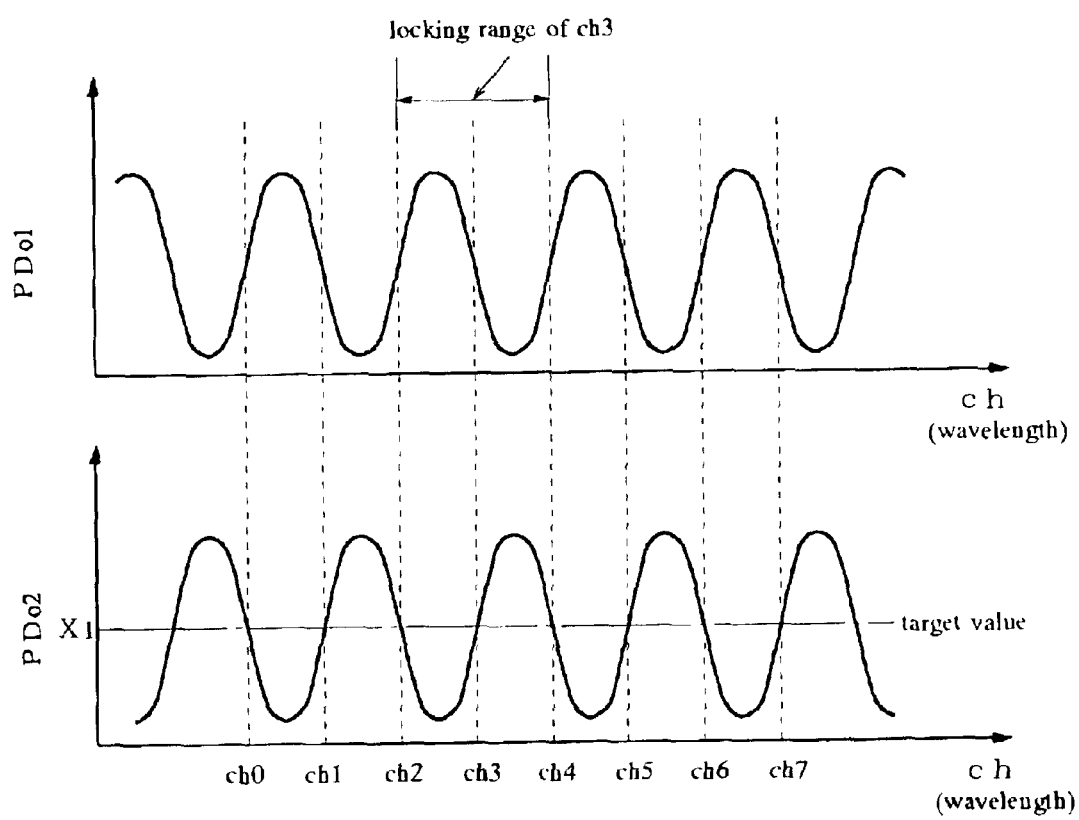
FIG. 11 is a diagram illustrating characteristics corresponding to output wavelengths of individual PD.

With these settings, the output value PDo2 is outputted after a delay of one half period from the output value PDo1. As illustrated in FIG. 11, therefore, the characteristics corresponding to wavelengths of the PDo1 and the characteristics corresponding to wavelengths of the PDo2 are inverted from each other. Here, the curve of the upper half of FIG. 11 illustrates the characteristics corresponding to output wavelengths of the first PD 121, and the curve of the lower half illustrates the characteristics corresponding to output wavelengths of the second PD 121. The ordinate of FIG. 11 indicates the outputs of the individual PDS, and the abscissa indicates the ch (the wavelength). The output of the first PD 121 and the output of the second PD 122 are designated by PDo1 and PDo2, respectively.

On the other hand, a target value X1 is used for making a control to lock the oscillation wavelength of the tunable wavelength laser at the desired wavelength and is arranged on the shoulder from the maximal value to the minimal value of the PDo2. This target value X1 is made to correspond to the wavelength of the ch0. Here, the target value X1 may be arranged on the shoulder of the PDo1.

Here, the shoulder means a curve portion excepting the external values on the graph having the external values at a space and is used herein to have a similar meaning.

With these arrangements, the space from the wavelength taking the same value as the target value X1 and shorter than the desired adjacent wavelength to the wavelength taking the same value as the target value X1 and longer than the desired adjacent wavelength, that is, the locking range is 1.6 nm, i.e., the optical path difference between the first optical waveguide and the second optical waveguide.

With these arrangements, moreover, when the desired wavelength is even ch, the value PDo1/PDo2 is smaller than the target value X1 for a wavelength shorter than the desired wavelength within the locking range of the ch corresponding to the desired wavelength, but is larger than the target value X1 for a wavelength longer than the desired wavelength within the locking range of the ch corresponding to the desired wavelength. When the desired wavelength is odd ch, on the other hand, the value PDo1/PDo2 is larger than the target value X1 for a wavelength shorter than the desired wavelength within the locking range of the ch corresponding to the desired wavelength, but is smaller than the target value X1 for a wavelength longer than the desired wavelength within the locking range of the ch corresponding to the desired wavelength.

Here, the aforementioned relation between the magnitude of the wavelength and the magnitude of the target value X1 is reversed if the target value X1 corresponding to the ch0 is arranged on the shoulder from the minimal value to the maximal value.

Reverting to FIG. 10, the first interfering light outputted from the first port 120-3 is inputted into the first PD 121 for detecting its light-intensity. The second interfering light outputted from the second port 120-4 is inputted into the second PD 122 for detecting its light-intensity.

Moreover, a controlling CPU 140 receives the PDo1 from the first PD 121 through an amplifier 131 and an analog/digital converter (as will be abbreviated into "A/D") 132. The controlling CPU 140 receives the PDo2 from the second PD 122 through an amplifier 135 and an A/D 136. The amplifiers 131 and 135 are operation amplifiers for amplifying input signals at desired gains, and the A/Ds 132 and 136 convert analog inputs into digital signals of desired bits such as 12 bits. The controlling CPU 140 processes, as will be described hereinafter, to output the control signal for locking the oscillation wavelength of the tunable wavelength laser 110 at the desired wavelength, to the tunable wavelength laser 110 through a digital/analog converter (as will be abbreviated into the "D/A") 149 for converting a digital input into an analog signal.

The tunable wavelength laser 110 is adjusted on its drive current by the control signal and locked at the desired wavelength.

Figure 12:
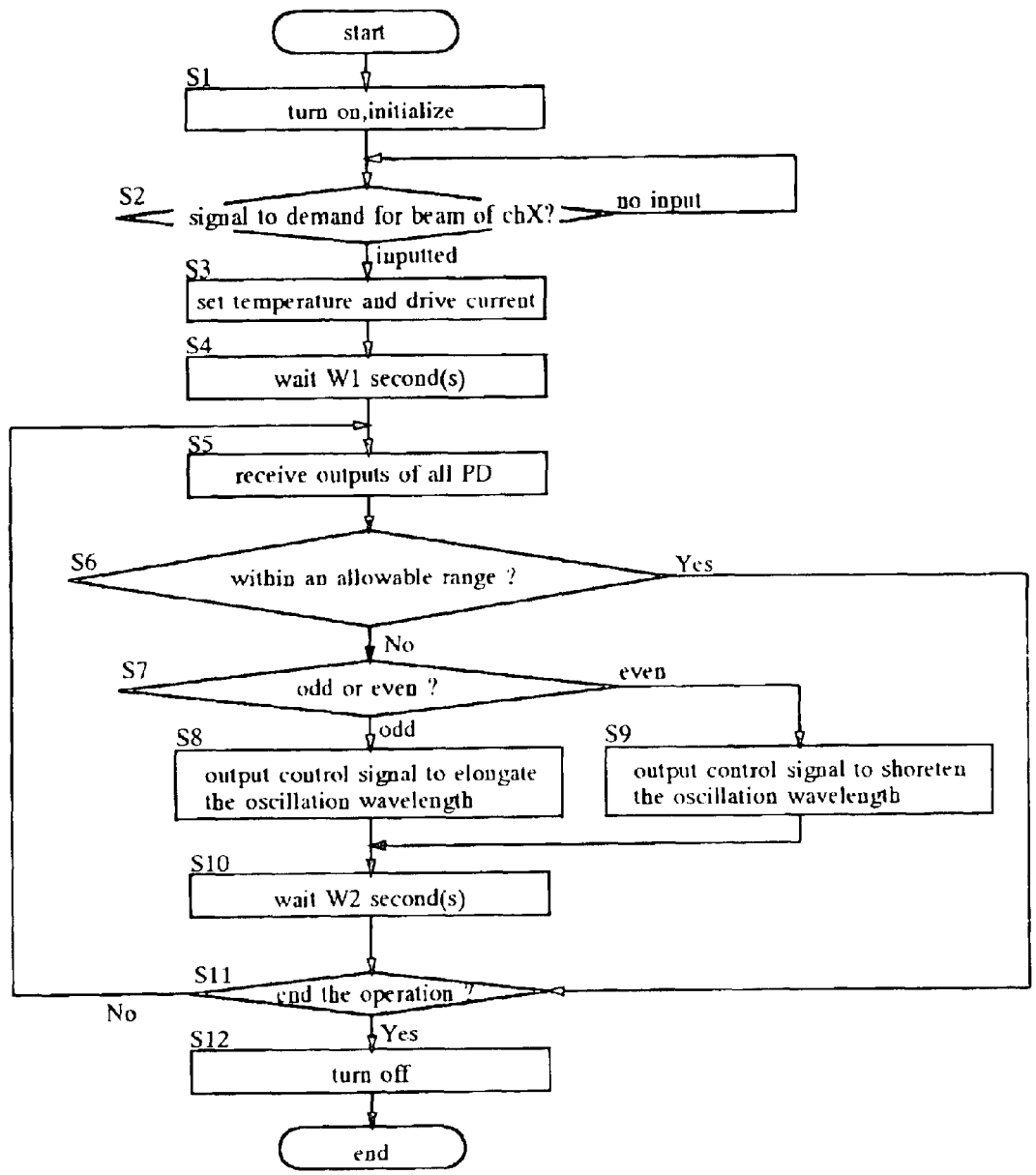
FIG. 12 is a flow chart of a controlling CPU of the tenth embodiment.

The operations of the multi-constant wavelength light source 100 and the wavelength locker 101 will be described in the following with reference to FIGS. 11 and 12.

The multi-constant wavelength light source 100 is turned ON by a system controlling apparatus, although not shown in FIG. 10, for controlling the WDM optical communication system generally. By this ON, a program stored in the controlling CPU 140 is started to initialize (at S1) the circuits in the multi-constant wavelength light source 100.

The controlling CPU 140 decides (at S2) whether or not the tunable wavelength laser 110 has been demanded for igniting a means corresponding to the ch. If this answer is NO, the operation of S2 is repeated till the demand is made.

With this demand, e.g., with a demand for igniting a means corresponding to the ch3, the controlling CPU 140 sets (at S3) the temperature and a drive current corresponding to the ch3 of the tunable wavelength laser 110, and sends the control signal to the tunable wavelength laser 110.

In accordance with this control signal, the tunable wavelength laser 110 starts its laser oscillation with the igniting wavelength.

The controlling CPU 140 interrupts (at S4) the operations at and after S5 for W1 seconds so as to wait for that the laser oscillation of the tunable wavelength laser 110 is locked.

The first PD 121 and the second PD 122 receive the laser beam, as outputted from the tunable wavelength laser 110, individually through the Mach-Zehnder interferometer 120, and output electric current according to the quantities of the received beams, to the controlling CPU 140. This controlling CPU 140 measures the current values to calculate the PDo1/PDo2 (i.e., the detected value).

The controlling CPU 140 calculates the difference between the value PDo1/PDo2 and the target value X1 at the locking point by subtracting the value PDo1/PDo2 from the target value X1, and judges (at S6) whether or not the calculated value is within an allowable range. This calculation of the difference between the value PDo1/PDo2 and the target value X1 at the locking point corresponds to a calculation of the difference between the present oscillation wavelength and the desired wavelength of the tunable wavelength laser 110.

When the decision results in that the calculated value (i.e., the wavelength difference) is not within the allowable range, on the other hand, it is decided (at S7) whether the ch designated by the aforementioned system controlling apparatus is even-numbered or odd-numbered. This is because the increase/decrease of the control signal is different depending upon the even ch or the odd ch even for the same sign of the calculated value.

When the decision results in the odd ch, what is outputted (at S8) is the control signal according to the calculated value (i.e., the wavelength difference) for the odd ch. The control signal for the odd ch is a signal for increasing the drive current to shorten the oscillation wavelength because the present oscillation wavelength is longer than the desired wavelength for the minus calculated value, as described hereinbefore. For the plus calculated value, the control signal is a signal for decreasing the drive current to elongate the oscillation wavelength because the present oscillation wavelength is shorter than the desired wavelength. Now that the desired ch is the ch3, the operation of S8 is performed.

When the decision results in the even ch, on the other hand, what is outputted (at S9) is the control signal corresponding to the calculated value (i.e., the wavelength difference) for the even ch. The control signal of this even ch case is reversed from the case of the odd ch in the relation between the sign of the calculated value and the increase/decrease of the drive current. This is because the locking point of the even ch is arranged for the even ch on the shoulder from the maximal value to the minimal value.

The controlling CPU 140 interrupts (at S10) the operations at and after S11 for W2 seconds so as to wait for that the laser oscillation of the tunable wavelength laser 110 is locked, and performs (S10) the operation of S11 after the W2 seconds.

The controlling CPU 140 decides (at S11) whether or not a signal for ending the operation of the multi-constant wavelength light source 100 has been received from the system controlling apparatus. When the operation ending signal is received, the power is turned OFF (S12) to end the routine.

When the operation ending signal is not received, on the other hand, the controlling CPU 140 returns the routine to S5 to repeat the operations of S5 to S11 till the calculated value falls within the allowable range. By repeating these operations, the oscillation wavelength of the tunable wavelength laser 110 is adjusted from the igniting wavelength to the desired wavelength of the ch3 so that it is locked at the ch3. Furthermore, by operating these operations, the discrepancy is compensated, if caused in the oscillation wavelength by noises, to lock the oscillation wavelength.

The multi-constant wavelength light source 100 (the wavelength locker 101) according to the tenth embodiment decides whether the ch corresponding to the desired wavelength belongs to the even ch or the odd ch, so that the locking range of each ch can be made twice the wavelength space of the ch of the WDM system. As a result, the locking range of each ch can be made wider than that of the prior art.

In the tenth embodiment, the controlling CPU 140 processes the outputs of the first PD 121 and the second PD 122 and sends the control signal to the tunable wavelength laser 110. However, the multi-constant wavelength light source 100 may process those outputs with an operation circuit.

Figure 13:
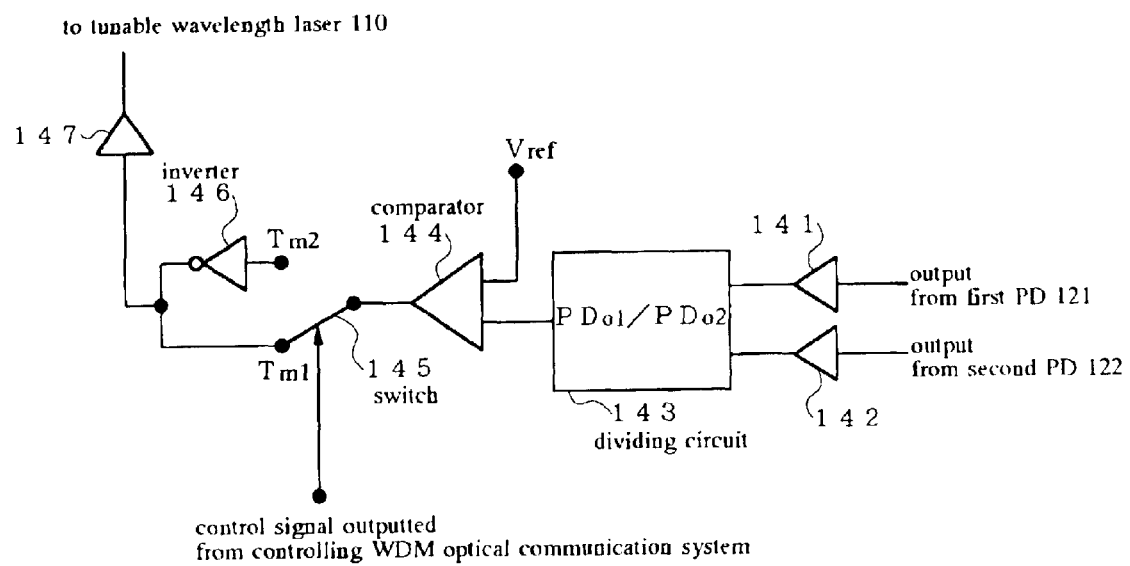
FIG. 13 is a diagram showing one construction example of an operation circuit corresponding to the controlling CPU.

In FIG. 13, the output of the first PD 121 is inputted through an amplifier 141 to a dividing circuit 143. The output of the second PD 122 is inputted through an amplifier 142 to the dividing circuit 143.

This dividing circuit 143 is a circuit for calculating the value PDo1/PDo2, and its output is inputted to a comparator 144. This comparator 144 compares the input signal with a reference voltage Vref, and outputs a signal proportional to the difference. The reference voltage Vref is set to a voltage corresponding to the target value X1. The output of the comparator 144 is inputted a switch 145 which is controlled by the control signal outputted from the system controlling apparatus for controlling WDM optical communication system generally. The switch 145 is connected with a terminal Tm1, as shown in FIG. 13, for the even ch and with a terminal Tm2 for the odd ch, in accordance with the output signal of the system controlling apparatus.

The terminal Tm1 of the switch 145 is connected as it is with the tunable wavelength laser 110 through an amplifier 147. On the other hand, the terminal Tm2 of the switch 145 is connected with the tunable wavelength laser 110 through an inverter 146 for inverting and outputting an input signal and through the amplifier 147.

With this construction, the target value X1 and the value PDo1/PDo2 are compared by the comparator 144, and the increasing/decreasing direction of the control signal is adjusted by the switch 145 in accordance with the even/odd of the ch of the desired wavelength, so that operations similar to those of the aforementioned flow chart of the controlling CPU can be performed.

Here, the tenth embodiment employs the Mach-Zehnder interferometer, but the invention should not be limited thereto. The Michelson interferometer could also be employed if it can realize the characteristics corresponding to output wavelengths shown in FIG. 11.

[Eleventh Embodiment]

Figure 14:
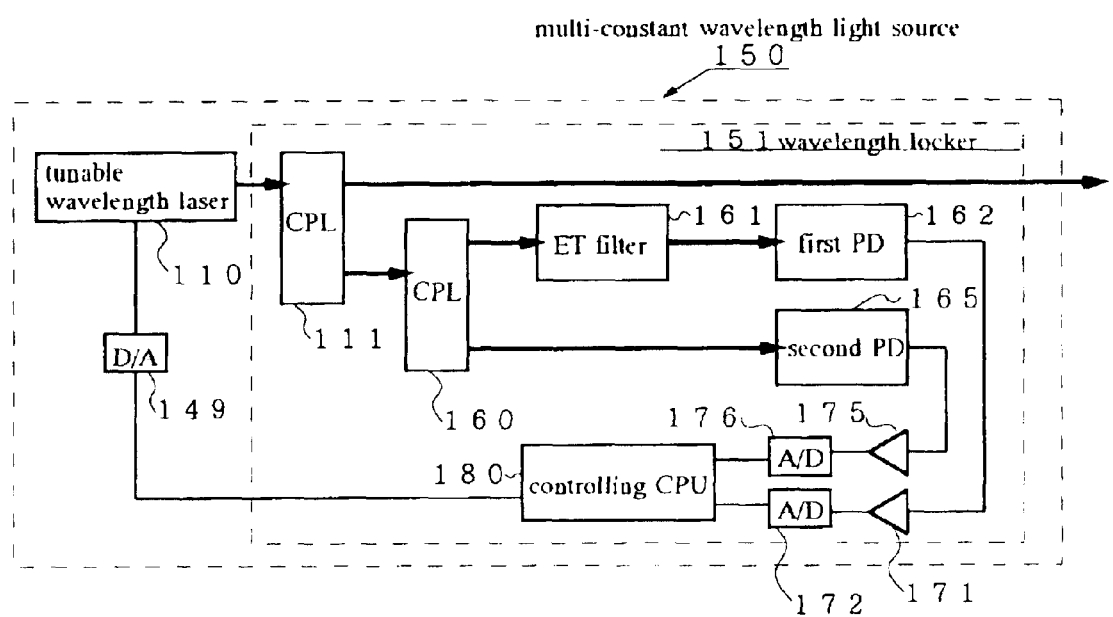
FIG. 14 is a diagram showing a construction of an eleventh embodiment.

In FIG. 14, the laser beam, as outputted from the tunable wavelength laser 110 which is the DBR laser for emitting laser beams of eight variable wavelengths, is inputted into the coupler 111 disposed in a wavelength locker 151 for branching the beam into two. After a portion of the laser beam was branched, the remaining laser beam is outputted from the wavelength locker 151 and is further outputted as an output beam from a multi-constant wavelength light source 150.

In the wavelength locker 151, the portion of the laser beam branched by the coupler 111 is further branched by a coupler 160 for branching the beam into two. One branched laser beam is inputted through an ET filter 161 into a first PD 162 so that its light-intensity is detected. The output value of the first PD 162 is designated by PDo1. The other laser beam branched by the coupler 160 is inputted into a second PD 165 so that its light-intensity is detected. The output value of the second PD 165 is designated by PDo2. The first PD 162 and the second PD 165 output electric currents according to the light-intensities.

Figure 15:
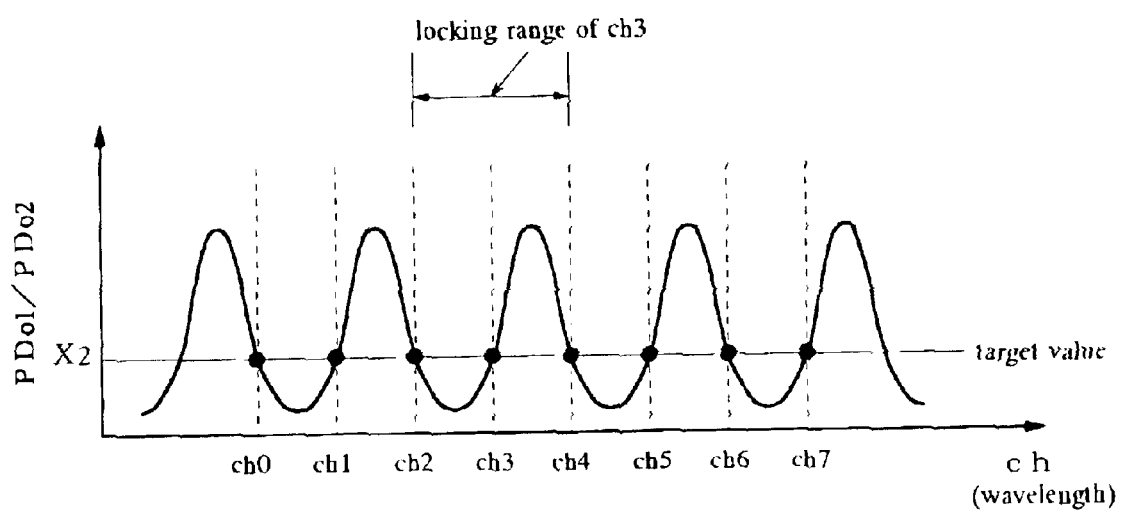
FIG. 15 is a diagram of the case in which target values of even ch are arranged on a shoulder from the maximal value to the minimal value.

For the WDM system in which the wavelength space of the ch is 0.8 nm (the grid space of 100 GHz), the FSR of the ET filter 161 is set to 1.6 nm by adjusting the resonance space. The finesse is so set, as shown in FIG. 15, that the light transmittance (PDo1/PDo2) at each wavelength corresponding to each ch may become the same value X2 (the target value). With these settings, any even ch is arranged on a shoulder from the maximal value to the minimal value, whereas any odd ch is arranged on a shoulder from the minimal value to the maximal value. Here, the ordinates of FIGS. 15 to 17 indicate the value PDo1/PDo2 (the light transmittance), as will be described hereinafter, and the abscissas indicate the ch (the wavelength). Curves of the individual Figures illustrate the characteristics corresponding to output wavelengths of the PDo1, as standardized with the PDo2.

With these arrangements, the space from the wavelength taking the same value as the target value X2 in the desired wavelength or the wavelength shorter than the adjoining desired wavelength to the wavelength taking the same value as the target value X2 in the desired wavelength or the wavelength longer than the adjoining desired wavelength, that is, the locking range is 1.6 nm or twice the wavelength space of the ch from the value of the FSR.

With these arrangements, moreover, when the desired wavelength is even ch, the value PDo1/PDo2 is larger than the target value X1 for a wavelength shorter than the desired wavelength within the locking range of the ch corresponding to the desired wavelength, but is smaller than the target value X1 for a wavelength longer than the desired wavelength within the locking range of the ch corresponding to the desired wavelength. When the desired wavelength is odd ch, on the other hand, the value PDo1/PDo2 is smaller than the target value X1 for a wavelength shorter than the desired wavelength within the locking range of the ch corresponding to the desired wavelength, but is larger than the target value X1 for a wavelength longer than the desired wavelength within the locking range of the ch corresponding to the desired wavelength.

Between the adjoining even ch, therefore, the target value X2 appears twice the period of the wavelength space of the ch of the WDM system. Between the adjoining odd ch, the target value X2 also appears twice the period of the wavelength space of the ch of the WDM system. Therefore, the locking range of each ch is twice the wavelength space of the ch so that it ranges by ±0.8 nm (±100 GHz) around the wavelength corresponding to the ch.

Figure 16:
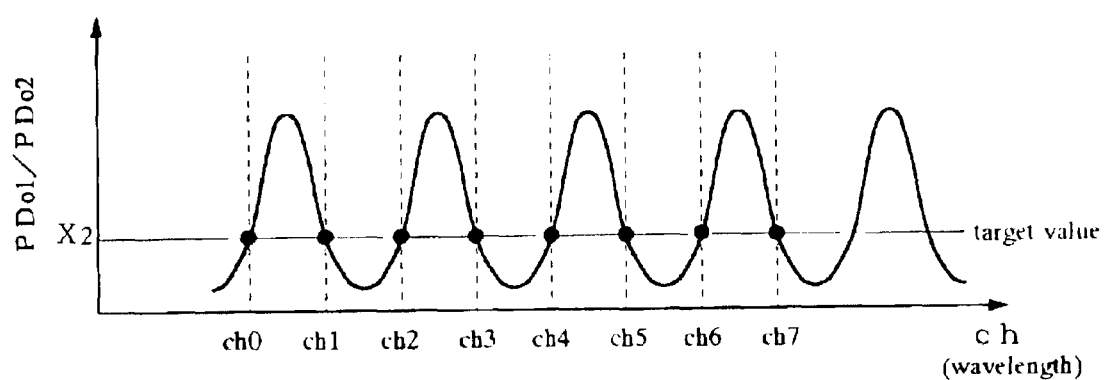
FIG. 16 is a diagram of the case in which target values of even ch are arranged on a shoulder from the minimal value to the maximal value.

Here, as illustrated in FIG. 16, the even ch may be arranged on the shoulder from the minimal value to the maximal value, whereas the odd ch may be arranged on the shoulder from the maximal value to the minimal value. In this case, the relation between the magnitude of the wavelength and the magnitude of the target value X2 is reversed.

Figure 17:
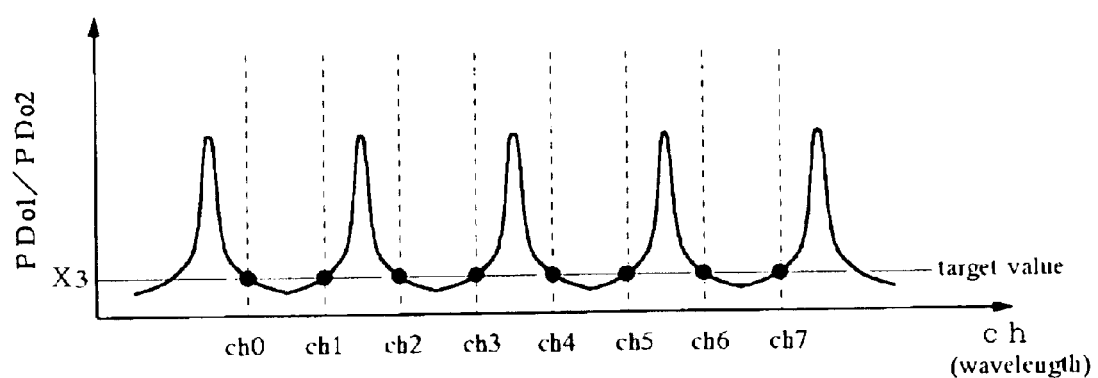
FIG. 17 is a diagram illustrating the case in which a finesse is enlarged.

The FSR of the ET filter 161 is constant at 1.6 nm because it has to be set to twice the wavelength space of the ch. With a large finesse, therefore, the full width half maximum is reduced so that a target value X3 also has to be reduced, as illustrated in FIG. 17. With an excessively small target value, the SNR of the PDo1/PDo2 to be compared is also deteriorated to degrade the accuracy for locking the value at the desired wavelength.

In the eleventh embodiment, the full width half maximum is from 0.7 to 1.1 nm, and the FSR is at 200 GHz because of the characteristics of the ET filter 161, so that the finesse can be changed from 1.4 to 2.3.

In the eleventh embodiment, the finesse is set to 2.0 from the demand for the communication quality of the WDM optical communication system so that the target value X2 is accordingly set. Here, even if the wavelength space of the ch is changed from 0.8 nm to 0.4 nm, both the FSR and the full width half maximum are doubled so that the finesse becomes the same value.

A controlling CPU 180 receives the output PDo1 of the first PD 162 through an amplifier 171 and an A/D 172. The controlling CPU 180 receives the output PDo2 of the second PD 165 through an amplifier 175 and an A/D 176. The controlling CPU 180 performs the operations, as will be described hereinafter, and outputs a control signal for locking the oscillation wavelength of the tunable wavelength laser 110 at the desired wavelength, to the tunable wavelength laser 110 through the D/A 149. According to this control signal, the tunable wavelength laser 110 is adjusted on its drive current and locked at the desired wavelength.

The operations of the multi-constant wavelength light source 150 and the wavelength locker 151 can be described as in the tenth embodiment mainly by causing the first PD 121 to correspond to the first PD 162 and the second PD 122 to correspond to the second PD 165 between the tenth embodiment and the eleventh embodiment, and their description will be omitted.

In the multi-constant wavelength light source 150 (the wavelength locker 151) according to the eleventh embodiment, the same value of the PDo1/PDo2 between the even ch appears twice the period of the wavelength space of the ch of the WDM system, and the same value of the PDo1/PDo2 between the odd ch appears twice the period of the wavelength space of the ch of the WDM system. As a result, the locking range of each ch is made wider at twice the wavelength space of ch around the desired wavelength than that of the prior art.

[Twelfth Embodiment]

Figure 18:
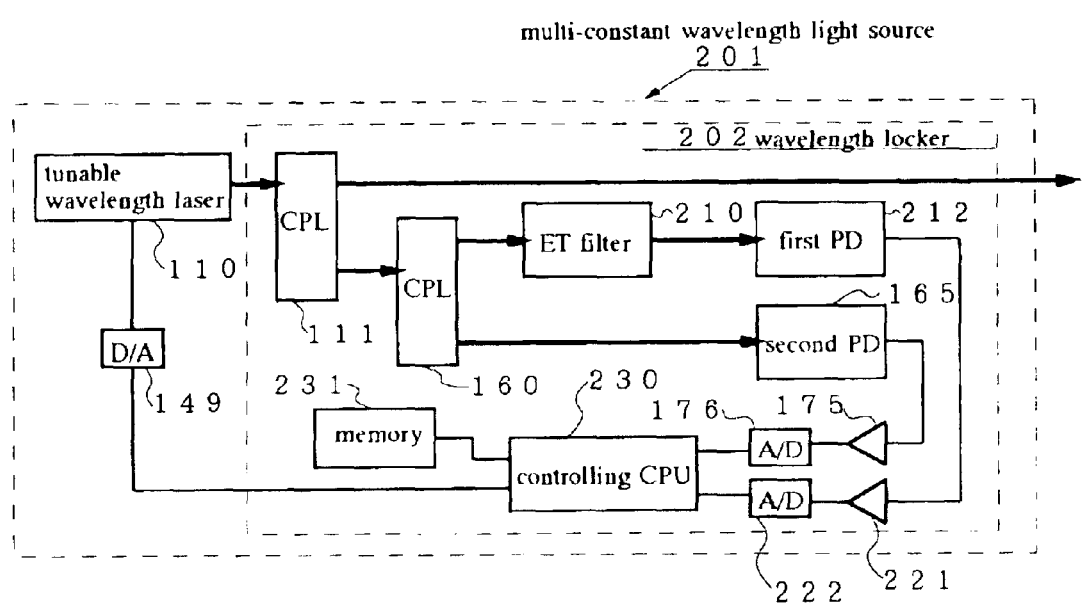
FIG. 18 is a diagram showing a construction of a twelfth embodiment.

In FIG. 18, the laser beam, as outputted from the tunable wavelength laser 110 which is the DBR laser for emitting laser beams of eight variable wavelengths, is inputted into the coupler 111 disposed in a wavelength locker 202 for branching the beam into two. After a portion of the laser beam was branched, the remaining laser beam is outputted from the wavelength locker 202 and is further outputted as an output beam from a multi-constant wavelength light source 201.

In the wavelength locker 202, the portion of the laser beam branched by the coupler 111 is further branched by a coupler 160 for branching the beam into two. One branched laser beam is inputted through an ET filter 210 into a first PD 212 so that its light-intensity is detected. The output value of the first PD 212 is designated by PDo1. The other laser beam branched by the coupler 160 is inputted into a second PD 165 so that its light-intensity is detected. The output value of the second PD 165 is designated by PDo2. The first PD 212 and the second PD 165 output electric currents according to the light-intensities.

The ET filter 210 is so set in the case of an eight-wave WDM type having a ch wavelength space of 0.8 nm (a grid space of 100 GHz), that a half FSR is no less than 5.6 nm, e.g., 6.4 nm by adjusting the resonance space. Here, conforming to the ITU-T advice, the reflectivity and resonance space of a reflecting face forming the resonator of the ET filter 210 is adjusted so that all the conforming ch may arranged on the shoulders of the FSR.

Figure 19:
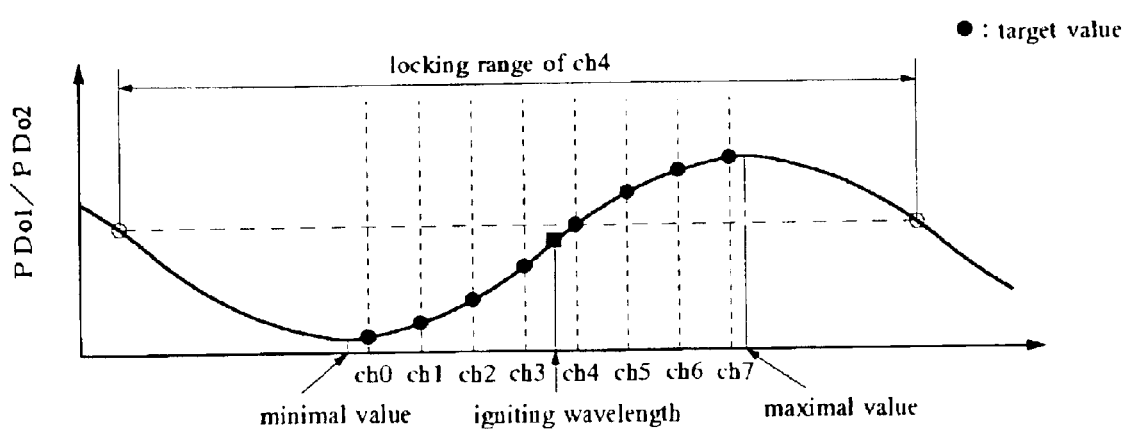
FIG. 19 is a diagram of the case in which target values of the individual ch are arranged on a shoulder from the minimal value to the maximal value.

Each ch is arranged on the shoulder from the minimal value to the maximal value, as shown in FIG. 19. The ordinate of FIG. 19 indicates the value PDo1/PDo2 (the light transmittance), and the abscissa indicates the ch (the wavelength). The curve of FIG. 19 illustrates the characteristics corresponding to wavelengths of the PDo1, as standardized with the PDo2. The ch0 is arranged close to the wavelength giving the minimal value of the PDo1/PDo2. The ch0 is not arranged at the wavelength giving the minimal value, because the SNR of the minimal value is poor due to the noises of the PD. The ch1 to the ch7 are arranged every 0.8 nm or the wavelength space of the ch from the wavelength of the ch0.

With these arrangements, for example, the value PDo1/PDo2 for the wavelength of the ch4 between the minimal value to the maximal value is only one for one period so that the locking range of the ch 4 can be widened to that of one period of the ET filter 210. FIG. 19 illustrates the locking range of the ch4 by way of example. Likewise, the locking range of each ch is one for one period of the ET filter 210.

On the other hand, the outputs of the first PD 212 and the second PD 165, as obtained by the laser beams of the wavelengths corresponding to the individual ch, are actually measured in advance so that the target value of the PDo1/PDo2 is obtained from the results. A memory 231 is prepared in advance with a table indicating relations between the wavelengths of the ch0 ($\lambda 0$) to the ch7 ($\lambda 7$), as enumerated in FIG. 20, and the target values for the wavelengths are stored.

A controlling CPU 230 receives the PDo1 from the first PD 212 through an amplifier 221 and an A/D 222 and the PDo2 from the second PD 165 through the amplifier 175 and the A/D 176. The controlling CPU 230 performs the operations, as will be described hereinafter, and outputs the control signal for locking the oscillation wavelength of the tunable wavelength laser 110 at the desired wavelength, to the tunable wavelength laser 110 through the D/A 149. According to the control signal, the tunable wavelength laser 110 is adjusted on its drive current and locked at the desired wavelength.

The operations of the multi-constant wavelength light source 201 and the wavelength locker 202 will be described in the following.

The operator of the multi-constant wavelength light source 201 sets the desired wavelength such as the ch4 by the not-shown means. By this setting, the controlling CPU 230 outputs a control signal for feeding a drive current to emit the laser beam of the wavelength $\lambda 4$ of the ch4, to the tunable wavelength laser 110. In accordance with this control signal, the tunable wavelength laser 110 is ignited with a shorter wavelength than that of the ch4, as shown in FIG. 19, to output the laser beam. This laser beam is received directly by the second PD 165 and through the ET filter 210 by the first PD 212 so that its light-intensities are individually detected.

The controlling CPU 230 recognizes the igniting wavelength in terms of the value PDo1/PDo2 (the detected value) calculated from the PDo1 and the PDo2. The controlling CPU 230 reads a target value Tg14 for the wavelength $\lambda 4$ assigned to the ch4, from the table stored in the memory 231.

The controlling CPU 230 outputs a control signal according to the difference between the detected value and the target value Tg14 to the tunable wavelength laser 110, and locks the oscillation wavelength at $\lambda 4$ by adjusting the drive current of the tunable wavelength laser 110.

Here, the shoulder arranging each ch is located on a rightward rising curve from the minimal value to the maximal value. When the detected value is smaller than the target value Tg14, the igniting wavelength is shorter than the $\lambda 4$. When the detected value is larger than the target value Tg14, on the other hand, the igniting wavelength is longer than the $\lambda 4$.

When the target value is smaller than the target value Tg14, therefore, the controlling CPU 230 generates the control signal for increasing the drive current so as to elongate the igniting wavelength. When the detected value is larger than the target value Tg14, the controlling CPU 230 the control signal for decreasing the drive current so as to shorten the igniting wavelength.

This feedback control is repeated till the oscillation wavelength is locked at the $\lambda 4$ and is made when the oscillation wavelength is finely shifted by the temperature change or fluctuation of the tunable wavelength laser 110.

With the operations thus far described, the multi-constant wavelength light source 201 according to the twelfth embodiment can widen the locking range up to one period of the ET filter 210.

Furthermore, the multi-constant wavelength light source 201 (the wavelength locker 202) does not use the PDo1, as obtained by receiving the laser beam through the ET filter 210, as it is for the control but utilizes the PDo2, as obtained by receiving the laser beam directly, as a reference value. As a result, it is possible to compensate the fluctuation of the PDo1 due to the noises or aging.

Figure 21:
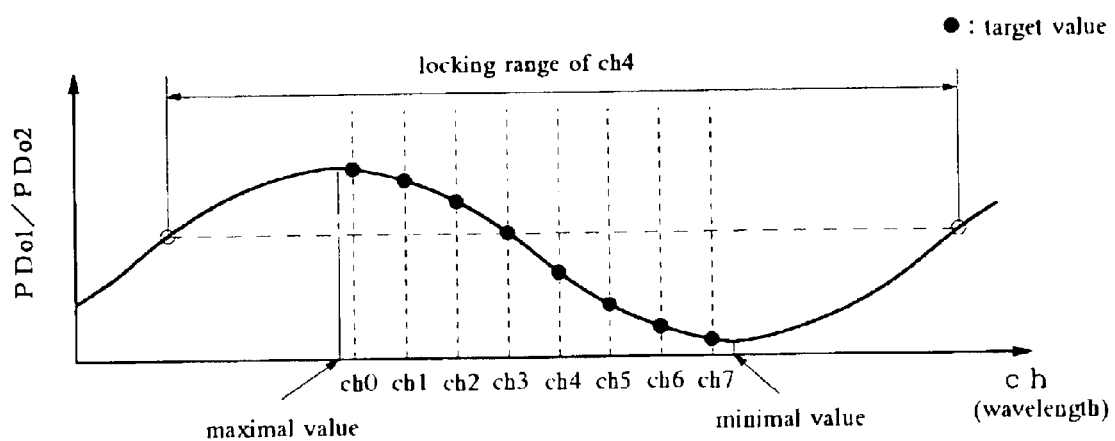
FIG. 21 is a diagram of the case in which target values of the individual ch are arranged on a shoulder from the maximal value to the minimal value.

Here, the twelfth embodiment exemplifies the illustration of FIG. 19, but the target value of each ch may be arranged on the shoulder from the maximal value to the minimal value, as illustrated in FIG. 21.

In the twelfth embodiment, on the other hand, the oscillation wavelength is adjusted by increasing/decreasing the drive current. In a temperature variable type tunable wavelength laser, however, the oscillation wavelength can also be adjusted by changing the temperature. In this modification, the tunable wavelength laser is held in contact with an element capable of controlling the temperature such as the Peltier element. Generally, the controlling CPU generates a control signal for raising the temperature, when the igniting wavelength is shorter than the $\lambda 4$, but a control signal for lowering the temperature when the igniting wavelength is longer than the $\lambda 4$.

[Thirteenth Embodiment]

Figure 22:
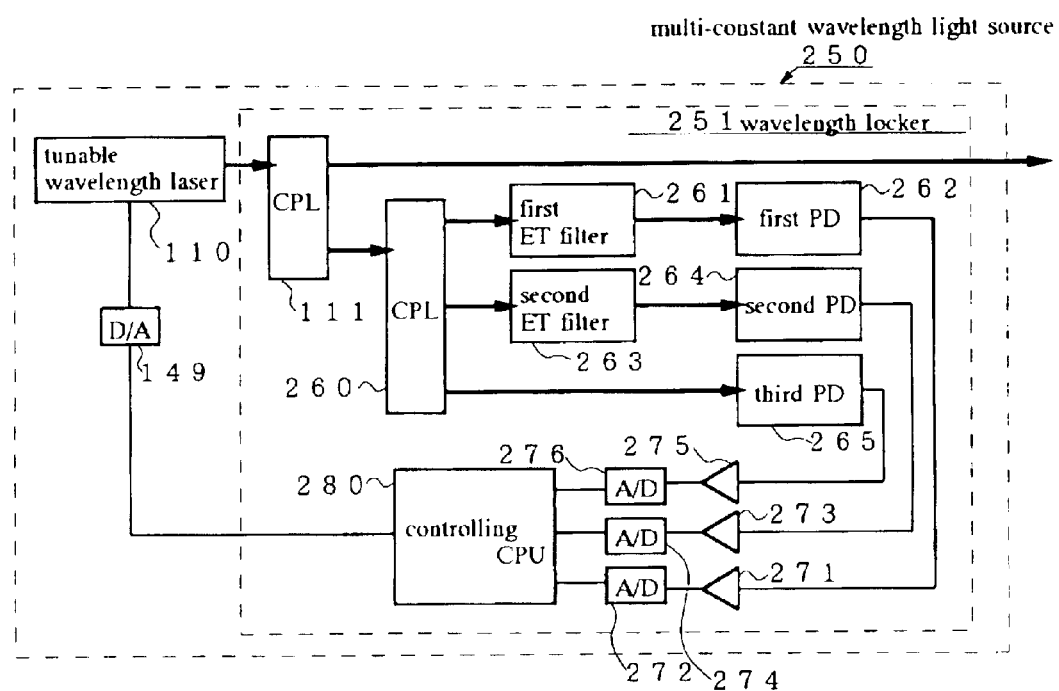
FIG. 22 is a diagram showing a construction of a thirteenth embodiment.

In FIG. 22, the laser beam, as outputted from the tunable wavelength laser 110 which is the DBR laser for emitting laser beams of eight variable wavelengths, is inputted into the coupler 111 disposed in a wavelength locker 251 for branching the beam into two. After a portion of the laser beam was branched, the remaining laser beam is outputted from the wavelength locker 251 and is further outputted as an output beam from a multi-constant wavelength light source 250.

In the wavelength locker 251, the portion of the laser beam branched by the coupler 111 is further branched by a coupler 260 for branching the beam into three. The first branched laser beam is inputted through the first ET filter 261 into a first PD 262 so that its light-intensity is detected. The output value of the first PD 262 is designated by PDo1. The second laser beam branched by the coupler 260 is inputted through the second ET filter 263 into a second PD 264 so that its light-intensity is detected. The output value of the second PD 264 is designated by PDo2. The third laser beam branched by the coupler 260 is inputted into a second PD 265 so that its light-intensity is detected. The output value of the third PD 265 is designated by PDo3. The first PD 262, the second PD 264, and the third PD 265 output electric currents according to the light-intensities.

Moreover, the third laser beam branched by the coupler 260 is inputted into a third PD 265 so that its light-intensity is detected. These first PD 262 to third PD 265 output electric currents according to the light-intensities. The output values of these first PD 262, second PD 264 and third PD 265 are designated by PDo1, PDo2 and PDo3, respectively.

Figure 23:
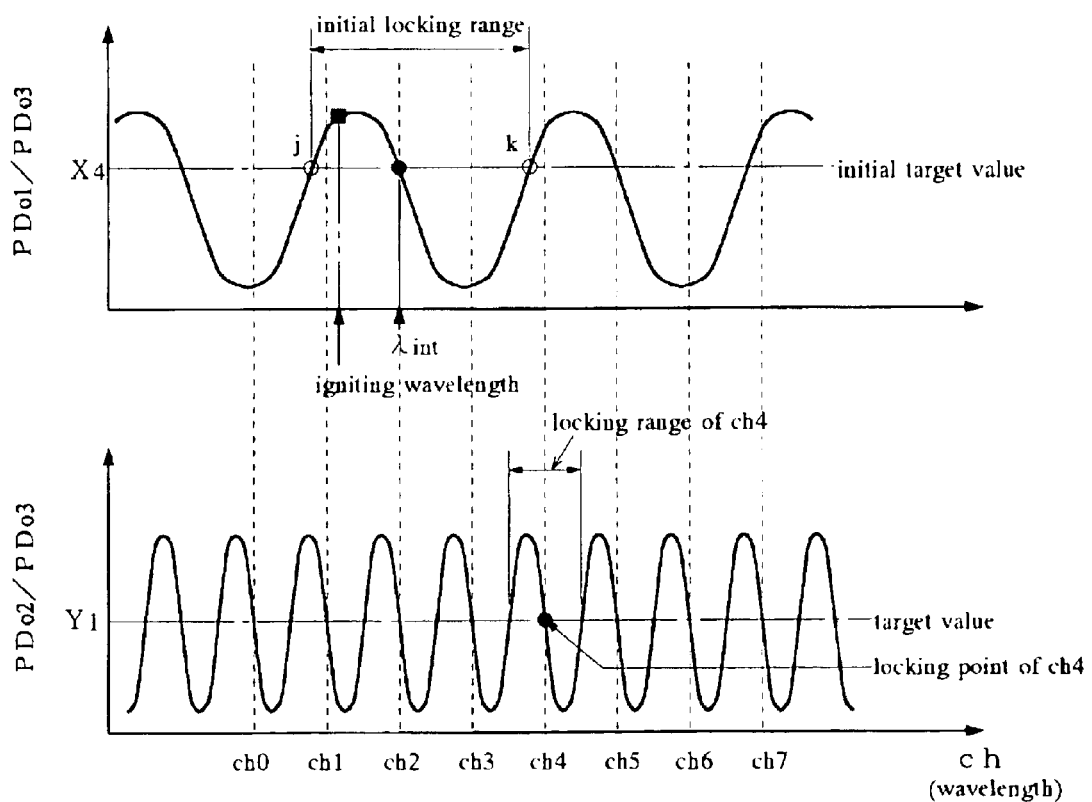
FIG. 23 is a diagram for explaining an operation to lock a predetermined wavelength.

The first ET filter 261 is used for locking the igniting wavelength at the time when the tunable wavelength laser 110 is started to emit, substantially at the initial locking wavelength λint. This λint is set within the locking range in any ch of the second ET filter 263. When the wavelength of the ch2 is to be set with the λint, for example, it is held within the locking range of the ch2, as illustrated in FIG. 23. The ordinates of FIG. 23 indicate a value PDo1/PDo3 (a light transmittance), as will be described hereinafter, for the upper half and a value PDo2/PDo3 (a light transmittance), as will be described hereinafter. The abscissa indicates the ch (the wavelength). A curve at the upper half in FIG. 23 illustrates the characteristics corresponding to wavelengths of the PDo1, as standardized with the PDo3, and a curve at the lower half in FIG. 23 illustrates the characteristics corresponding to wavelengths of the PDo2, as standardized with the PDo3. The FSR of the first ET filter 261 is so set that the igniting wavelength at the time when the tunable wavelength laser 110 is started to emit is contained between two wavelengths (i.e., points j and k in FIG. 23) closest to the value λint for giving the same value as the PDo1/PDo3 (the light transmittance) at the λint, when a constant igniting drive current is always fed to the tunable wavelength laser 110. When the igniting wavelength at the emission starting time of the tunable wavelength laser 110 is within a range of ±1.2 nm around the λ2, for example, the FSR is set at 2.4 nm (300 GHz).

The second ET filter 263 is used for making a lock from the λint to the desired wavelength. The FSR of the second ET filter 263 is set at the wavelength space of the ch in the WDM system so that the locking range may be identical for the individual ch in the WDM system and so that all the ch can be locked.

When the wavelength space of the individual ch is set at 0.8 nm in conformity with the ITU-T, for example, the FSR is set at 0.8 nm.

A controlling CPU 280 receives the outputs PDo1, PDo2 and PDo3 from the first PD 262 to the third PD 265, respectively, through amplifiers 271, 273 and 275 and A/Ds 272, 274 and 276. The controlling CPU 280 performs the operations, as will be described hereinafter, and outputs a control signal for locking the oscillation wavelength of the tunable wavelength laser 110, through the D/A 149. According to this control signal, the tunable wavelength laser 110 is adjusted on its drive current and locked at the desired wavelength.

The operations of the multi-constant wavelength light source 250 and the wavelength locker 251 will be described in the following The operator of the multi-constant wavelength light source 250 starts the tunable wavelength laser 110 by the not-shown means to set it at the desired wavelength such as the ch4. At the start of the tunable wavelength laser 110, the controlling CPU 280 outputs a control signal for feeding an igniting drive current, to the tunable wavelength laser 110. In accordance with this control signal, the tunable wavelength laser 110 rises with a wavelength between the ch1 and the ch2 illustrated in FIG. 24, for example, to output the laser beam. This laser beam is received by the first PD 262 to the third PD 265 so that its light-intensities are individually detected.

The controlling CPU 280 recognizes the igniting wavelength in terms of the value PDo1/PDo3 (the first detected value) calculated from the PDo1 and the PDo3. The controlling CPU 280 compares this detected value with an initial target value X4 at the λint. Moreover, the controlling CPU 280 outputs a control signal according to the difference between the first detected value and the initial target value X4, to the tunable wavelength laser 110, and locks the oscillation wavelength at the int by adjusting the drive current of the tunable wavelength laser 110.

Here, with the λint being arranged on the rightward falling shoulder from the maximal value to the minimal value, as illustrated in FIG. 23, the igniting wavelength is shorter than the λint when the first detected value takes a value larger than the initial target value X4. When the first detected value is smaller than the initial target value X4, on the other hand, the igniting wavelength is longer than the λint. As a result, the controlling CPU 280 generates the control signal for reducing the drive current so as to elongate the igniting wavelength, when the first detected value is larger than the initial target value X4. When the first detected value is smaller than the initial target value X4, the controlling CPU 280 generates the control signal for increasing the drive current so as to shorten the igniting wavelength.

Here, when the λint is arranged on the rightward rising shoulder from the minimal value to the maximal value, the relation between the magnitude of the first detected value for the initial target value and the length of the igniting wavelength for the λint is reversed.

By these operations, the wavelength of the tunable wavelength laser 110 is substantially locked at the λint, i.e., at the wavelength λ2 of the ch2 in the lower half of FIG. 23. The controlling CPU 280 locks the oscillation wavelength from the λ2 to the λ4.

In this procedure, the controlling CPU 280 calculates the value PDo2/PDo3 (the second detected value) from the PDo2 and the PDo3 received from the second PD 264 and the third PD 265. The controlling CPU 280 controls the oscillation wavelength of the tunable wavelength laser 110 to the locking range in the desired wavelength by counting the number of the maximal values of the second detected value. In the case of the ch4, there are two maximal values between the λ2 and the λ4, as illustrated in the lower half of FIG. 23, so that the locking range of the λ4 falls after two maximal values of the second detected value.

After this, the controlling CPU 280 outputs a control signal according to the difference between the second detected value and the target value Y1, to the tunable wavelength laser 110, and locks the oscillation wavelength at the λ4 by adjusting the drive current of the tunable wavelength laser 110. This control signal according to the difference is obtained like the aforementioned control signal according to the difference between the first detected value and the initial target value X4, so that its description will be omitted.

This feedback control according to the difference between the second detected value and the target value Y1 is repeated till the oscillation wavelength is locked at the 4, and is made even when the oscillation wavelength is finely shifted by the temperature change or fluctuation of the tunable wavelength laser 110.

The multi-constant wavelength light source 250 (the wavelength locker 251) according to the thirteenth embodiment controls the oscillation wavelength of the tunable wavelength laser 110 at the two stages of the control stage, at which the igniting wavelength is locked substantially at the initial locking wavelength λint, and the control stage at which the igniting wavelength is locked at the desired wavelength of the desired ch, so that the locking ranges at the individual stages can be independently set by setting the FSR individually. Since the initial locking range can be freely set, therefore, the wavelength locker can be applied to any laser source without being especially designed as in the prior art for a specific laser source. The multi-constant wavelength light source 250 (the wavelength locker 251) can change the oscillation wavelength from the initial locking wavelength to any wavelength so that it can be applied to not only a laser source for outputting one wave but also a laser source for outputting a plurality of wavelengths.

Here in the thirteenth embodiment, the igniting drive current is always made constant. It is generally known for the semiconductor laser, however, that the wavelength at the ignition time is deviated by the aging even an electric current at the same value is fed. By latching the deviations of the wavelength at the ignition time due to the aging as data in a storing part such as a memory, therefore, the igniting drive current may be changed according to the operation period to compensate the deviations. Thus, the multi-constant wavelength light source 250 (the wavelength locker 251) will not deviate from the initial locking range even after a long operation.

Figure 24:
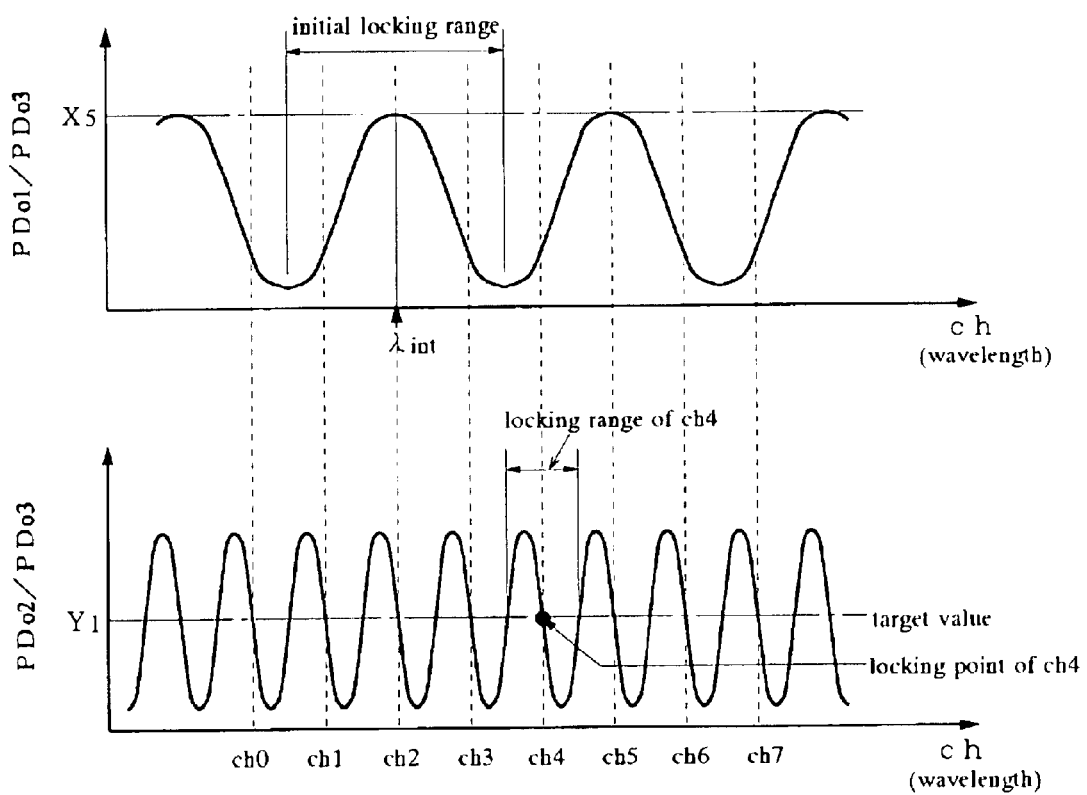
FIG. 24 is a diagram of the case in which the target value is set to the maximal value.

In the thirteenth embodiment, on the other hand, the initial locking wavelength is arranged on the shoulder, as illustrated in the upper half of FIG. 23, a control can be made to the desired locking wavelength even if the initial locking wavelength is arranged at the maximal value, as illustrated in the upper half of FIG. 24. In this modification, the initial locking range falls not between the wavelengths for giving the two maximal values adjacent to the maximal value of the initial locking wavelength but between the wavelengths for giving the two minimal values adjacent to the maximal value of the initial locking wavelength. This is because two wavelengths taking the same value exist from the maximal value of the initial locking wavelength to another maximal value, so that what wavelength the first detected value corresponds to cannot be discriminated.

[Fourteenth Embodiment]

Figure 25:
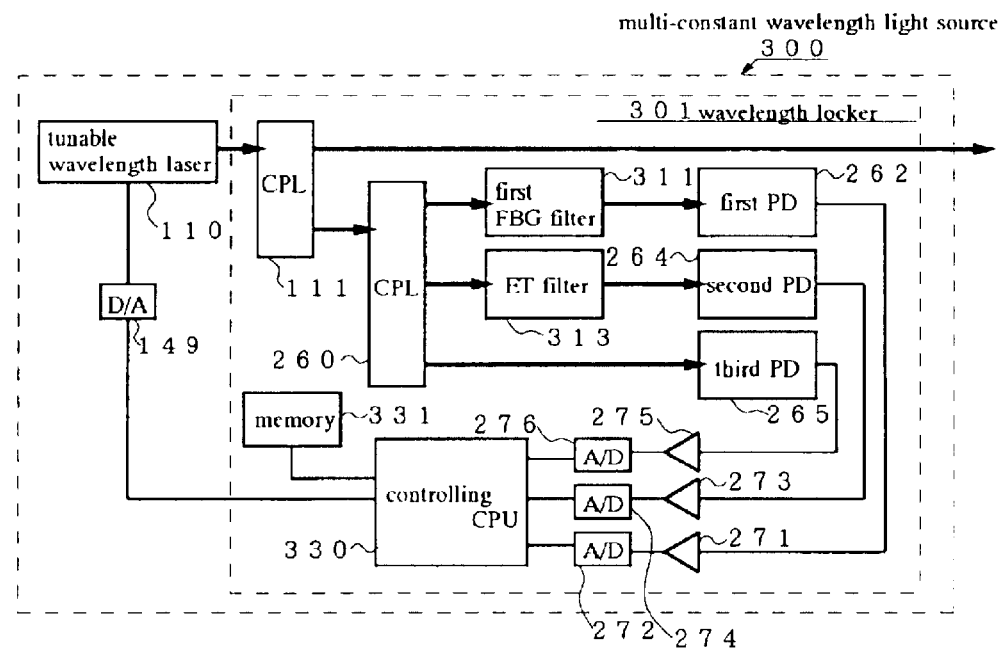
FIG. 25A is a diagram showing a construction of a fourteenth embodiment.
FIG. 25B is a diagram for explaining an operation to lock a predetermined wavelength.
Figure 25:
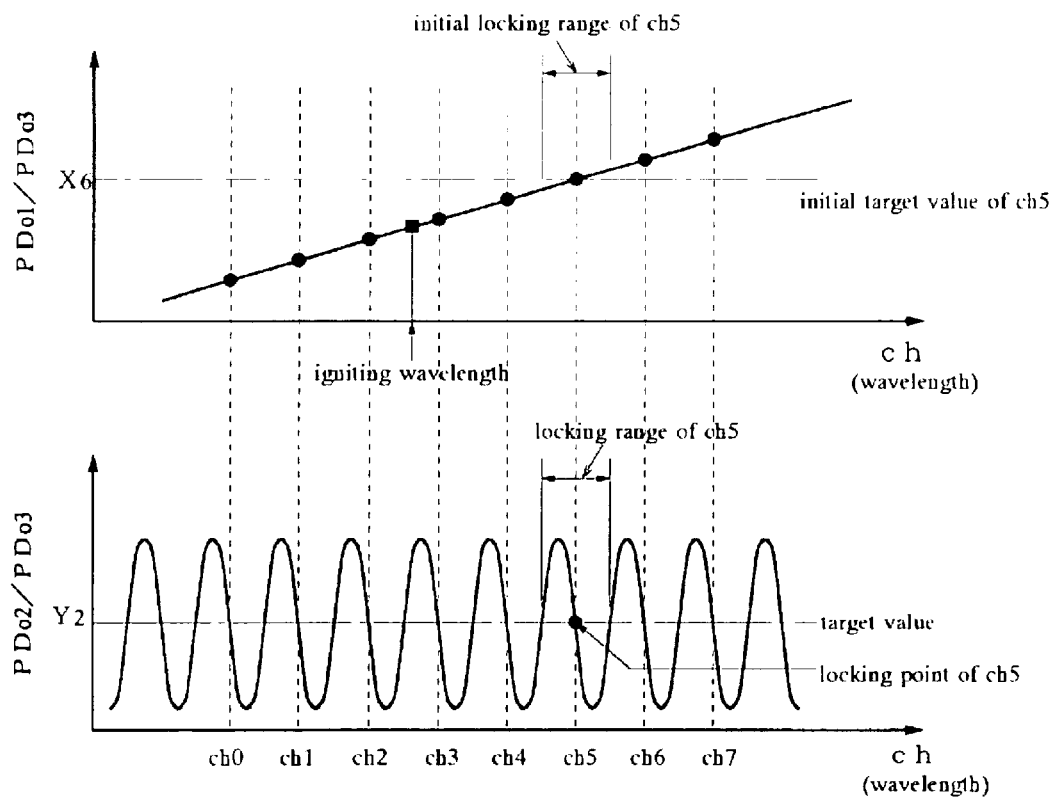

In FIG. 25A, the laser beam, as outputted from the tunable wavelength laser 110 which is the DBR laser for emitting laser beams of eight variable wavelengths, is inputted into the coupler 111 disposed in a wavelength locker 301 for branching the beam into two. After a portion of the laser beam was branched, the remaining laser beam is outputted from the wavelength locker 301 and is further outputted as an output beam from a multi-constant wavelength light source 300.

In the wavelength locker 301, the portion of the laser beam branched by the coupler 111 is further branched by a coupler 260 for branching the beam into three. The first branched laser beam is inputted through an fiber Bragg grating filter(as will be abbreviated into the "FBG") 311 into a first PD 262 so that its light-intensity is detected. The output value of the first PD 262 is designated by PDo1. The second laser beam branched by the coupler 260 is inputted through the second ET filter 313 into a second PD 264 so that its light-intensity is detected. The output value of the second PD 264 is designated by PDo2. The third laser beam branched by the coupler 260 is inputted into a second PD 265 so that its light-intensity is detected. The output value of the third PD 265 is designated by PDo3. The first PD 262, the second PD 264, and the third PD 265 output electric currents according to the light-intensities.

An FBG filter 311 is used to change the oscillation wavelength from the igniting wavelength at the time of starting the emission of the tunable wavelength laser to the locking range in the desired wavelength (the desired ch). As illustrated at the upper half of FIG. 25B, the FBG filter 311 is so arranged in the case of an eight-wave WDM system that the individual wavelengths corresponding to the ch0 to the ch7 are at the slope portions of the light transmittance in the FBG filter 311.

The ordinates of FIG. 25B indicate the later-described PDo1/PDo3 (the light transmittance) for the upper half and the later-described PDo2/PDo3 (the light transmittance) for the lower half, and the abscissa indicates the ch (the wavelength). On the other hand, the straight line in the upper half of FIG. 25B illustrates the characteristics corresponding to wavelengths of the PD01, as standardized with the PDo3, and the curve in the lower half of FIG. 25B illustrates the characteristics corresponding to wavelengths of the PDo2, as standardized with the PDo3.

The ET filter 313 is used to lock the initial locking wavelength in the desired wavelength at the desired wavelength. The FSR of the ET filter 313 is set at the wavelength space of the ch in the WDM system so as to make the locking range identical for the individual ch in the WDM system and to lock all the ch. When the wavelength space of the individual ch is at 0.8 nm in conformity with the ITU-T advice, for example, the FSR is set at 0.8 nm.

The outputs of the first PD 262 to the third PD 265, as obtained with the laser beams of the wavelengths corresponding to the individual ch, are actually measured in advance so that the target value of the PDo1/PDo3 is obtained from the measurement results. A memory 331 is prepared with a table enumerating relations between the wavelengths from the ch0 to the ch7 and the target values for the wavelengths and is stored with the relations.

Moreover, a controlling CPU 330 receives the outputs PDo1, PDo2 and PDo3 from the first PD 262 to the third PD 265, respectively, through the amplifiers 271, 273 and 275 and the A/Ds 272, 274 and 276. The controlling CPU 330 performs the later-described operations and outputs a control signal for locking the oscillation wavelength of the tunable wavelength laser 110, through the D/A 149. The tunable wavelength laser 110 is controlled on its drive current with that control signal and is locked at the desired wavelength.

The operations of the multi-constant wavelength light source 300 and the wavelength locker 301 will be described in the following.

The operator of the multi-constant wavelength light source 300 starts the tunable wavelength laser 110 by the not-shown means to set it at the desired wavelength such as the ch5. At the start of the tunable wavelength laser 110, the controlling CPU 330 outputs a control signal for feeding an igniting drive current, to the tunable wavelength laser 110.

Here, the igniting drive current need not be always set at a constant but may rise on the slope of the light transmittance of the FBG filter 311.

In accordance with this control signal, the tunable wavelength laser 110 rises with a igniting wavelength illustrated in FIG. 25B, for example, to output the laser beam. This laser beam is received by the first PD 262 to the third PD 265 so that its light-intensities are individually detected.

The controlling CPU 330 recognizes the igniting wavelength in terms of the value PDo1/PDo3 (the first detected value) calculated from the PDo1 and the PDo3. The controlling CPU 330 compares this detected value with an initial target value X6 at the ch5(or λ5). Moreover, the controlling CPU 330 outputs a control signal according to the difference between the first detected value and the initial target value X6, to the tunable wavelength laser 110, and locks the oscillation wavelength at the λ5 by adjusting the drive current of the tunable wavelength laser 110.

Here, as illustrated in FIG. 25B, the light transmittance of the FBG filter 311 is rightward rising. The first detected value is smaller than the initial target value X6 when the igniting wavelength is shorter than the λ5. When the first detected value is larger than the initial target value X6, on the other hand, the igniting wavelength is longer than the λ5.

As a result, the controlling CPU 330 generates the control signal for reducing the drive current so as to elongate the igniting wavelength, when the first detected value is smaller than the initial target value X6. When the first detected value is larger than the initial target value X6, the controlling CPU 330 generates the control signal for increasing the drive current so as to shorten the igniting wavelength.

By these operations, the wavelength of the tunable wavelength laser 110 is locked substantially at the λ5, i.e., at the wavelength λ5 of the ch5, as illustrated in the lower half of FIG. 25B, so that the oscillation wavelength of the tunable wavelength laser 110 falls within the locking range of the ch5.

In order to lock the oscillation wavelength at the λ5 more accurately, the controlling CPU 330 outputs a control signal for adjusting the oscillation wavelength, to the tunable wavelength laser 110 and locks the oscillation wavelength at the λ5 by adjusting the drive current of the tunable wavelength laser 110.

In this operation, the controlling CPU 330 outputs a control signal according to the difference between the second detected value and the target value Y2, to the tunable wavelength laser 110 and locks the oscillation wavelength at the λ5 by adjusting the drive current of the tunable wavelength laser 110. The control signal according to this difference is obtained like the control signal according to the difference between the first detected value and the initial target value X4, as has been described in connection with the thirteenth embodiment, so that its description will be omitted.

This feedback control according to this difference is repeated till the oscillation wavelength is locked at the λ5, and is made even when the oscillation wavelength is finely shifted by the temperature change or fluctuation of the tunable wavelength laser 110.

The multi-constant wavelength light source 300 (the wavelength locker 301) can be adjusted to the locking range of the desired wavelength, as described hereinbefore, what wavelength the tunable wavelength laser 110 might be ignited in. This makes it unnecessary unlike the prior art to design the wavelength locking apparatus especially for a specific laser source so that the multi-constant wavelength light source 300 (the wavelength locker 301) can be applied to any laser source. Since the oscillation wavelength can be changed from the wavelength at the ignition time to the locking range of any wavelength, the multi-constant wavelength light source 300 (the wavelength locker 301) can be applied to not only the laser source for outputting one wave but also the laser source for outputting a plurality of wavelengths.

The multi-constant wavelength light source 300 (the wavelength locker 301) is controlled at the two stages of the control state, at which the oscillation wavelength is changed to the locking range of the desired wavelength, and the control stage at which the oscillation wavelength is locked at the desired wavelength, so that it can lock the oscillation wavelength more accurately at the desired wavelength.

[Fifteenth Embodiment]

Figure 26:
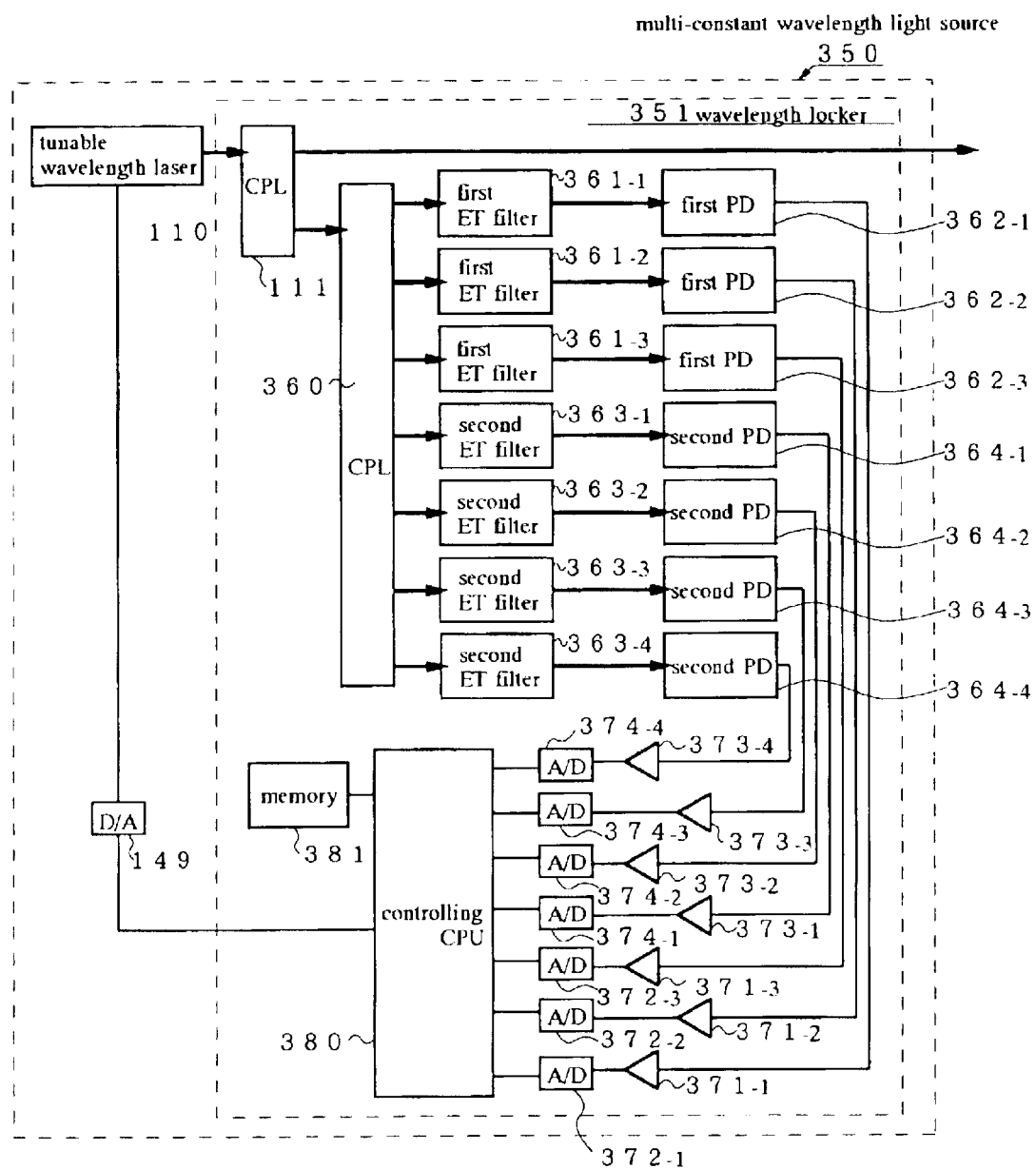
FIG. 26 is a diagram showing a construction of a fifteenth embodiment.
Figure 27:
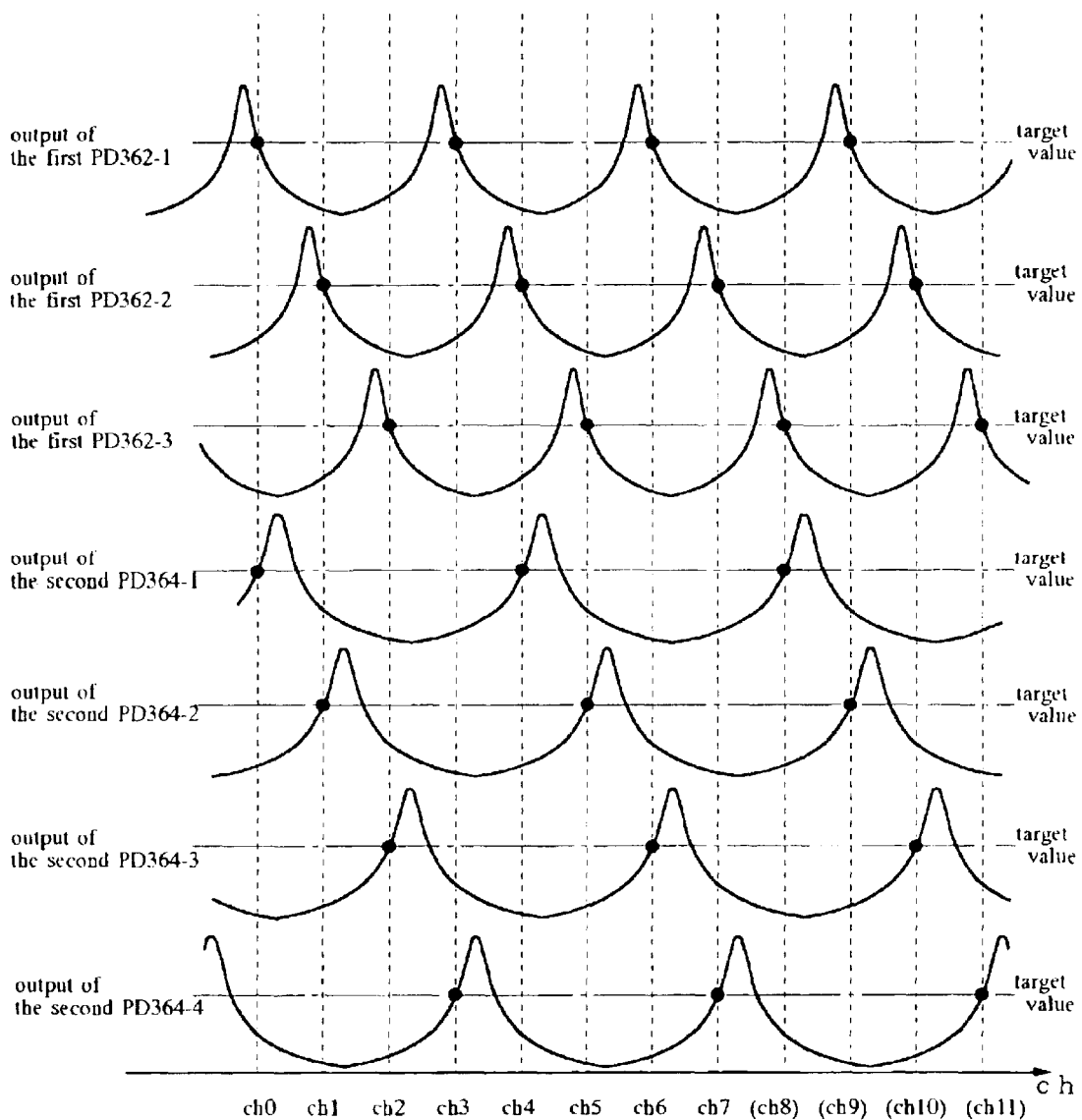
FIG. 27 is a diagram for explaining relations individual ET filters and locking points of the individual ch.

In FIG. 26, the laser beam, as outputted from the tunable wavelength laser 110 which is the DBR laser for emitting laser beams of eight variable wavelengths, is inputted into the coupler 111 disposed in a wavelength locker 351 for branching the beam into two. After a portion of the laser beam was branched, the remaining laser beam is outputted from the wavelength locker 351 and is further outputted as an output beam from a multi-constant wavelength light source 350.

In the wavelength locker 351, a portion of the laser beam, as branched by the coupler 111, is further branched by a coupler 360 for branching it. This coupler 360 branches the beam to the number of first ET filters 361-1 to 361-3 and second ET filters 363-1 to 363-4. This fifteenth embodiment is provided with totally seven filters: the three first ET filters 361-1 to 361-3 and the fourth second ET filters 363-1 5o 363-4, so that the beam is branched into seven. The first laser beam to the third laser beam, as branched by the coupler 360, are inputted into the first ET filters 361-1 to 361-3. The FSR of these first ET filters 361-1 to 361-3 is set at three times of the wavelength space of the ch, i.e., 2.4 nm (300 GHz). The fourth laser beam to the seventh laser beam, as branched by the coupler 360, are inputted into the second ET filters 363-1 to 363-4. The FSR of the second ET filters 363-1 to 363-4 is set four times of the wavelength space of the ch, i.e., 3.2 nm (400 GHz), as different from that of the first ET filters 361-1 to 361-3.

The laser beams, as outputted from the individual first ET filters 361-1 to 361-3, are inputted into first PD 362-1 to 362-3, respectively, for outputting electric currents according to light-intensities, so that the light-intensities of the laser beams are detected. The output values of the individual first PDs are individually designated by the first PDo1, the first PDo2 and the first PDo3.

The laser beams, as outputted from the individual second ET filters 363-1 to 363-4, are inputted into second PD 364-1 to 364-4, respectively, for outputting electric currents according to light-intensities, so that the light-intensities of the laser beams are detected. The output values of the individual first PDs are individually designated by the second PDo1, the second PDo2, the second PDo3, and the second PDo4.

The memory 381 is stored with a corresponding table enumerating relations between target value PD pairs and the individual ch, and the stored contents are outputted to a controlling CPU 380.

This controlling CPU 380 receives the outputs of the individual first PDs 362-1 to 362-4 and the individual second PDs 364-1 to 364-4 individually through amplifiers 371-1 to 371-3 and 373-1 to 373-4 and A/Ds 372-1 to 372-3 and 374-1 to 374-4. And, the controlling CPU 380 performs the later-described operations and outputs a control signal for locking the oscillation wavelength of the tunable wavelength laser 110 from the initial igniting wavelength to the desired wavelength, through the D/A 149. In accordance with this control signal, the tunable wavelength laser 110 is adjusted on the drive current and locked at the desired wavelength.

The operations of the multi-constant wavelength light source 350 and the wavelength locker 351 will be described in the following.

The multi-constant wavelength light source 350 is turned ON by a system controlling apparatus, although not shown in FIG. 26, for controlling the WDM optical communication system generally. By this ON, a program stored in the controlling CPU 380 is started to initialize (at S31) the circuits in the multi-constant wavelength light source 350.

The controlling CPU 380 decides (at S32) whether or not the tunable wavelength laser 110 has been demanded for igniting a means corresponding to the ch. If this answer is NO, the operation of S32 is repeated till the demand is made.

With this demand, e.g., with a demand for igniting a means corresponding to the ch5, the controlling CPU 380 sets (at S33) the temperature and a drive current corresponding to the ch5 of the tunable wavelength laser 110, and sends the control signal to the tunable wavelength laser 110.

In accordance with this control signal, the tunable wavelength laser 110 starts its laser oscillation with the igniting wavelength.

The controlling CPU 380 interrupts (at S34) the operations at and after S35 for W1 seconds so as to wait for that the laser oscillation of the tunable wavelength laser 110 is locked.

The individual first PDs 362-1 to 362-3 and the individual second PDs 364-1 to 364-4 receive the laser beams from the tunable wavelength laser 110 and output electric currents according to the received light-intensities to the controlling CPU 380. This controlling CPU 380 measures these current values and calculates the first PDo1 to the first PDo3 and the second PDo1 to the second PDo4. In these calculations, it is considered (at S36) that the attenuation of light-intensities are not equal, because the laser beams to be inputted into the individual first ET filters 361-1 to 361-3 and the individual second ET filters 363-1 to 363-4 are different in the light-intensities to be attenuated in the coupler 360.

As compared with the first PDo1 to the first PDo3, the controlling CPU 380 identifies (at S36) what of the first PDs 362-1 to 362-3 gives the largest value. As compared with the second PDo1 to the second PDo4, the controlling CPU 380 identifies (at S37) what of the second PDs 364-1 to 364-4 gives the largest value. Here, as tabulated in FIG. 28, the FSR of the first ET filter 361-1 is so set that the first PDo1 becomes the target value in the wavelength corresponding to the ch0.

The FSR of the first ET filter 361-2 is so set that the first PDo2 becomes the target value in the wavelength corresponding to the ch1. The FSR of the first ET filter 361-3 is so set that the first PDo3 becomes the target value in the wavelength corresponding to the ch2. And the FSR of the second ET filter 363-1 is so set that the second PDo1 becomes the target value in the wavelength corresponding to the ch0. The FSR of the second ET filter 363-2 is so set that the second PDo2 becomes the target value in the wavelength corresponding to the ch1. The FSR of the second ET filter 363-3 is so set that the second PDo3 becomes the target value in the wavelength corresponding to the ch2. The FSR of the second ET filter 363-4 is so set that the second PDo4 becomes the target value in the wavelength corresponding to the ch3.

The locking point of each ch to be arranged on the shoulder of the light transmittance of each of the first ET filters 361-1 to 361-3 is arranged on the shoulder from the maximal value to the minimal value, and the locking point of each ch to be arranged on the shoulder of the light transmittance of each of the second ET filters 363-1 to 363-4 is arranged on the shoulder from the maximal value to the minimal value. The reason for the arrangements on the opposite shoulders is to lock the oscillation wavelength accurately at the desired wavelength. If the locking points of the individual ch are arranged on the same shoulders such as the shoulders from the maximal value to the minimal value in the light transmittance of the individual first ET filters 361-1 to 361-3 and the individual second ET filters 363-1 to 363-4, both the outputs of the first PDs 362-1 to 362-3 and the outputs of the second PDs 364-1 to 364-4 change likewise when the wavelength is changed to lock the oscillation wavelength at the desired wavelength. As a result, the noises to the signals increase to make the control difficult, when the control is made in the direction to decrease those outputs (in the direction toward the minimal value). When the arrangements are made on the opposite shoulders, on the other hand, the outputs on one side change in the increasing direction so that the control can be made accurate.

Here, the individual locking points on the light transmittance curve of the individual first ET filters 361-1 to 361-3 may be arranged on the shoulders from the minimal value to the maximal value, and the individual locking points on the light transmittance curve of the individual second ET filters 363-1 to 363-4 may be arranged on the shoulders from the maximal value to the minimal value.

From the viewpoint of locking the wavelength more accurately, moreover, the locking points of the individual ch may be arranged on the shoulders having a high changing rate to the wavelength.

With these settings, for example, the first PDo1 takes the target value at every three ch because the FSR of the first ET filter 361-1 is set three times the wavelength space of the ch. Specifically, the target value appears at the wavelengths corresponding to ch0, ch3, ch6, - - - and so on. This discussion likewise applies to the first PDo2 and the first PDo3. The second PDo1 takes the target value at every four ch because the FSR of the second ET filter 363-1 is set four times the wavelength space of the ch. Specifically, the target value appears at the wavelengths corresponding to ch0, ch4, ch8, - - - and so on. This discussion likewise applies to the second PDo2 to the second PDo4.

As tabulated in FIG. 28, therefore, any ch of the ch0 to ch7 corresponds to one pair of the first PDs 362-1 to 362-3 and the second PDs 364-1 to 364-4 for giving the target value.

Figure 29:
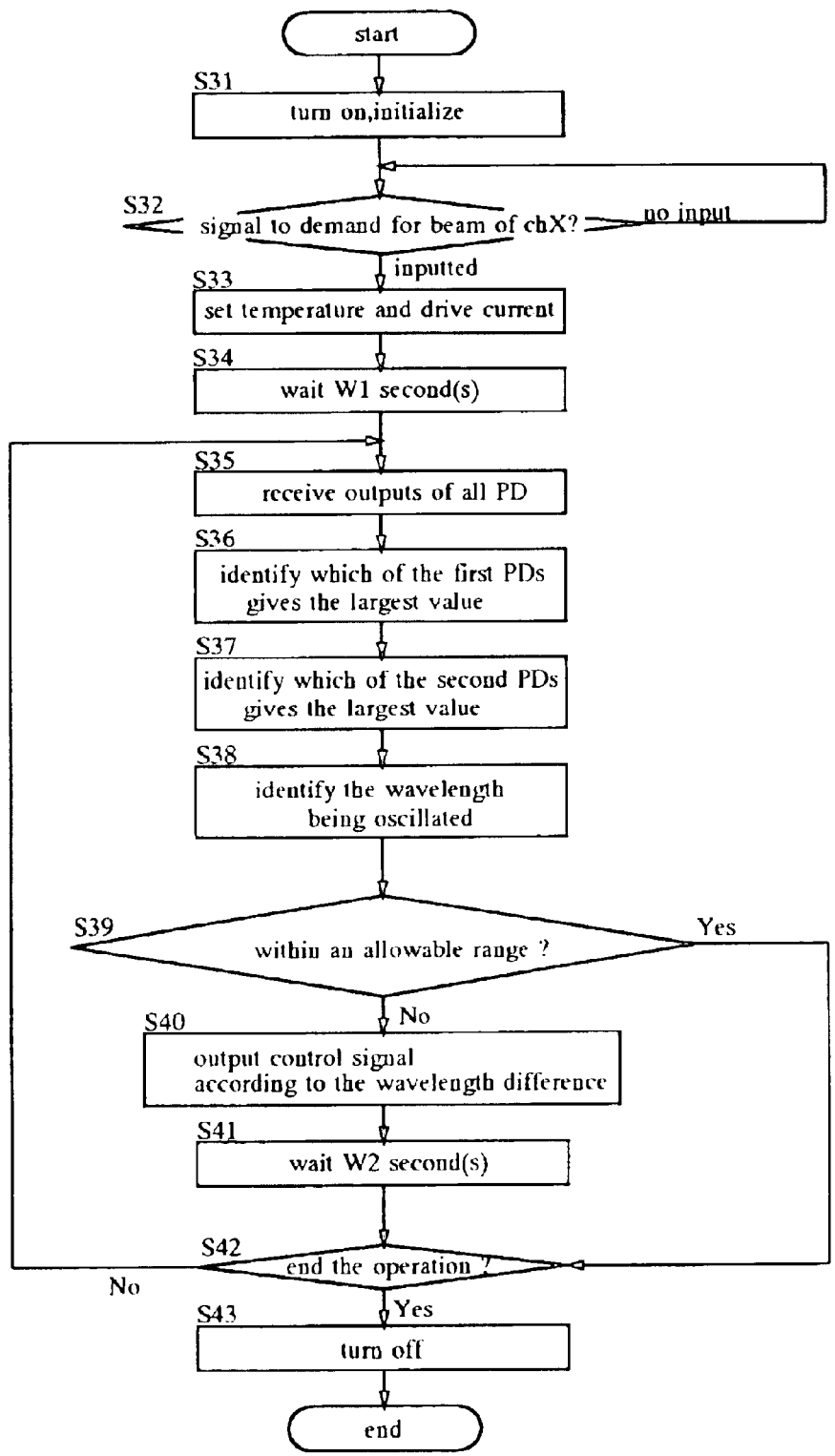
FIG. 29 is a flow chart of a controlling CPU in the fifteenth embodiment.

Reverting to FIG. 29, the controlling CPU 380 satisfies the aforementioned corresponding relations so that it can roughly discriminate the wavelength being oscillated, from the first PDs 362-1 to 362-3 identified at S36 and from the second PDs 364-1 to 364-4 identified at S37. In the case of the pair of the first PD 362-2 and the second PD 364-1, for example, it is discriminated from the corresponding table of FIG. 28 that the oscillation wavelength is in the vicinity of the ch4.

The controlling CPU 380 calculates the difference between the pair for giving the target value at the ch5, i.e., the first PD 362-3 and the second PD 364-2, as detected and calculated at 535, and the target value. And the controlling CPU 350 decides (at S39) whether or not the difference is within an allowable range. It is, therefore, possible to decide whether or not the detected wavelength and the wavelength corresponding to the ch5 is equal within the allowable range.

If the decision results in that the calculated value (the wavelength difference) is within the allowable range, the routine advances to the later-described operation of S42.

If the decision results in that the calculated value (the wavelength difference) is not within the allowable range, a control signal according to the calculated value (the wavelength difference) is outputted (at S40). This control signal is one for identifying the magnitude relation between the wavelength being oscillated and the desired wavelength of the ch5, as discriminated at S36 to S38, to reduce the drive current at a constant rate so as to elongate the oscillation wavelength when the present oscillation wavelength is shorter than the desired wavelength of the ch5. When the present oscillation wavelength is longer than the desired wavelength of the ch5, on the other hand, the control signal increases the drive current at a constant rate so as to shorten the oscillation wavelength.

The controlling CPU 380 interrupts (at S41) the operations at and after S42 for W2 seconds so as to wait for that the laser oscillation of the tunable wavelength laser 110 is locked, and performs (S41) the operation of S42 after the W2 seconds.

The controlling CPU 380 decides (at S42) whether or not a signal for ending the operation of the multi-constant wavelength light source 350 has been received from the system controlling apparatus. When the operation ending signal is received, the power is turned OFF (S43) to end the routine.

When the operation ending signal is not received, on the other hand, the controlling CPU 380 returns the routine to S35 to repeat the operations of S35 to S41 till the calculated value falls within the allowable range. By repeating these operations, the oscillation wavelength of the tunable wavelength laser 110 is adjusted from the igniting wavelength to the desired wavelength of the ch5 so that it is locked at the ch5. Furthermore, by operating these operations, the discrepancy is compensated, if caused in the oscillation wavelength by noises, to lock the oscillation wavelength.

The multi-constant wavelength light source 350 of the fifteenth embodiment can identify the igniting wavelength roughly from the outputs of the first PDs 362-1 to 362-3 and the outputs of the second PDs 364-1 to 364-4 so that it can lock the oscillation wavelength at the desired wavelength even if the wavelength rises from a value different from the wavelength corresponding to the desired ch.

The locking range is as large as 9.6 nm (1,200 GHz) for the number of combinations of 3×4=12 and for an FSR of three and four times of the wavelength space of the ch of 0.8 nm in this embodiment, because it depends upon the combination number and the FSR of the first ET filters 361-1 to 361-3 and the second ET filters 363-1 to 363-4.

Since the same PD pair is present for every least common multiples of the FSR of the first ET filter 361-1 to 361-3 and the FSR of the second ET filters 363-1 to 363-4, the FSR of the first ET filter 361-1 to 361-3 and the FSR of the second ET filters 363-1 to 363-4 have to be so selected that the least common multiples may become larger. When the wavelengths of eight waves are to be locked, for example, in addition to the combination of the present embodiment, the first ET filters may be exemplified by two filters having an FSR of 1.6 nm (200 GHZ), and the second ET filters may be exemplified by five filters having an FSR of 4.0 nm (500 GHz). The number of combinations of this modification is 2×5=10. When the wavelengths of thirty two waves are to be locked, on the other hand, the first ET filters may be exemplified by five filters having an FSR of 4.0 nm (500 GHz), and the second ET filters may be exemplified by seven filters having an FSR of 5.6 nm (700 GHZ). The number of combinations of this modification is 5×7=35.

Here in the fifteenth embodiment, the target value PD pairs and the individual ch are made to correspond, as tabulated in FIG. 28. As tabulated in FIG. 30, however, the unused target value PD pairs may be arranged before and after the ch0 to ch7. With these arrangements, the igniting wavelength can be reliably identified when the ch0 is to be ignited.

[Sixteenth Embodiment]

Figure 31:
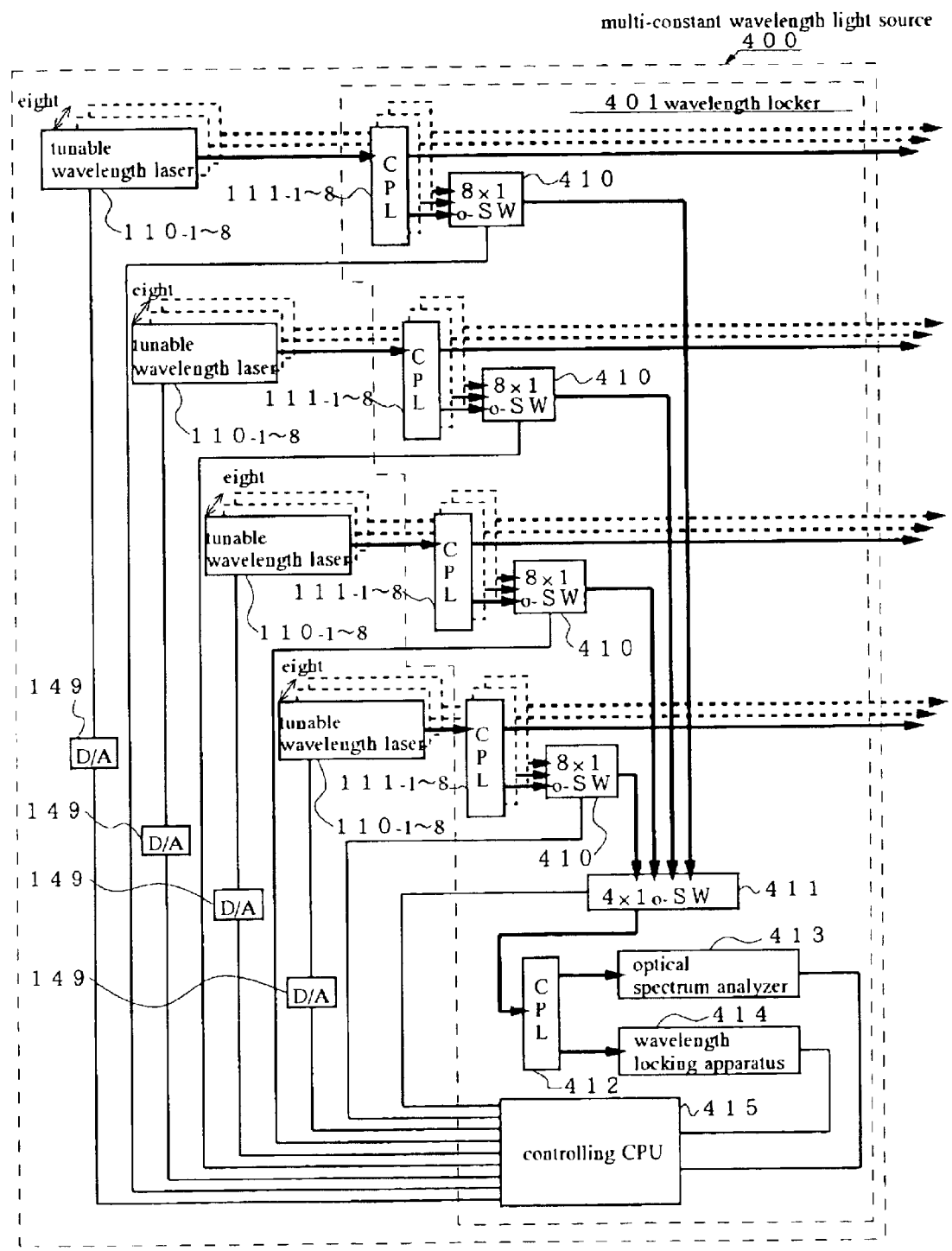
FIG. 31 is a diagram showing a construction of a sixteenth embodiment.

In FIG. 31, the individual laser beams, as outputted from eight tunable wavelength lasers 110-1 to 110-8 or the tunable wavelength DBR lasers, are individually inputted into couplers 111-1 to 111-8 in a wavelength locker 401 for branching the beams into two. After portions of the laser beams were branched, the remaining laser beams are outputted from the wavelength locker 401 and are outputted as output beams from a multi-constant wavelength light source 400.

In the wavelength locker 401, the portions of the individual laser beams branched by the individual couplers 111-1 to 111-8 are inputted into 8×1 optical switches (as will be abbreviated into the "optical SW") for selecting and outputting one of the eight inputted beams. The laser beams to be outputted are selected by a controlling CPU 415.

There are prepared four sets of optical circuits which are constructed of the eight tunable wavelength lasers 111-1 to 111-8, the eight couplers 111-1 to 111-8 and the 8×1 optical SW 410, so that output beams of 32 waves can be obtained.

The laser beams, as outputted from the four 8×1 optical SWs 410, are inputted into a 4×1 optical SW 411 for selecting and outputting one of the four inputted beams. The laser beams to be outputted are selected by the controlling CPU 415.

The laser beam selected by this 4×1 optical SW 411 is branched by a coupler 412 for branching the beam into two. The first laser beam branched is inputted into an optical spectrum analyzer 413. This optical spectrum analyzer 413 measures a light-intensity against the wavelength, i.e. spectrum, within a range covering the wavelength region from the first ch to the last ch of the WDM system.

In the WDM system having 32 waves and a grid space of 0.8 nm and the wavelength of the ch0 of 1,551 nm, for example, the spectrum may be measured within a range from 1,550 nm to 1,575.8 nm while estimating a margin of ±1 nm.

The second laser beam branched by the coupler 412 is inputted into a wavelength locking apparatus 414 for locking the tunable wavelength lasers 110-1 to 110-8 at the desired wavelength. The wavelength locking apparatus 414 is a conventional one. In this wavelength locking apparatus 414, the FSR of a periodic filter to be used for locking the wavelength is set at the grid space of the WDM system, e.g., at 0.8 nm in the aforementioned case. As illustrated in the lower half of FIG. 32, the locking point of each ch for locking the desired wavelength is set at an intermediate point (a target value) of the shoulder from the maximal value to the minimal value in a wavelength—light transmittance curve of the periodic filter. The locking point is set at a point where the light transmittance highly changes relative to the wavelength change so that the oscillation wavelength can be locked highly accurately.

Figure 32:
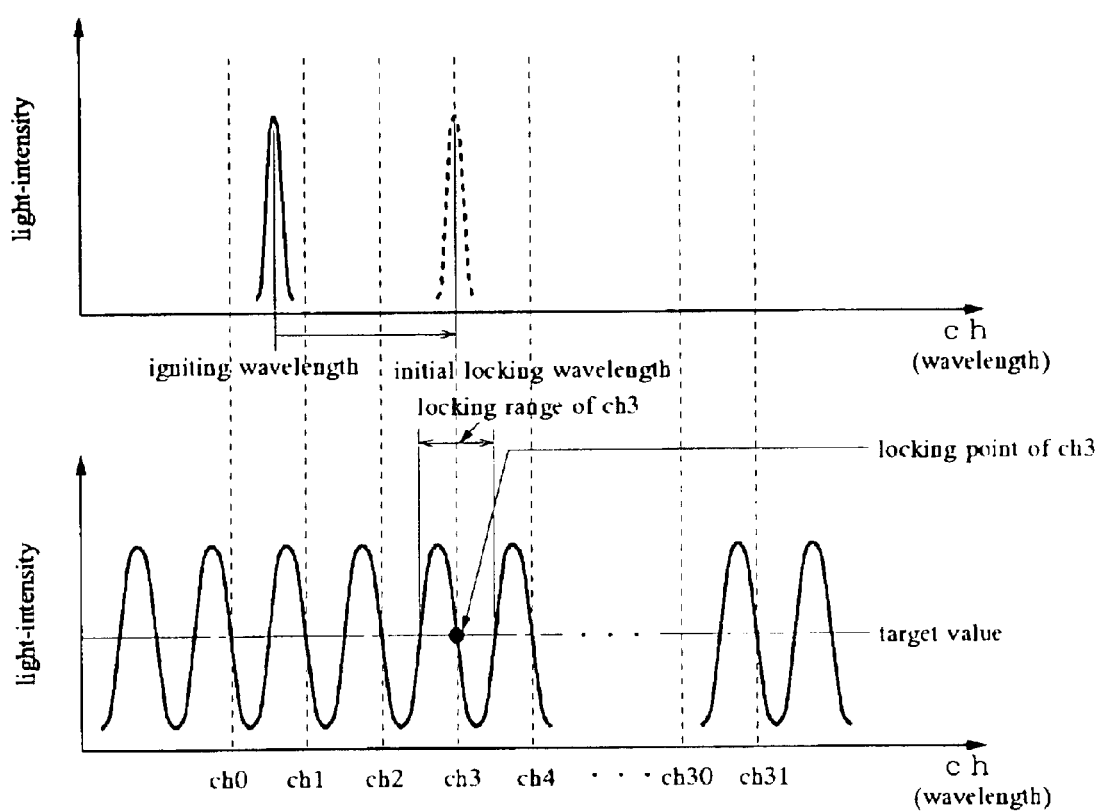
FIG. 32 is a diagram for explaining an operation to lock a predetermined wavelength.
Figure 33:
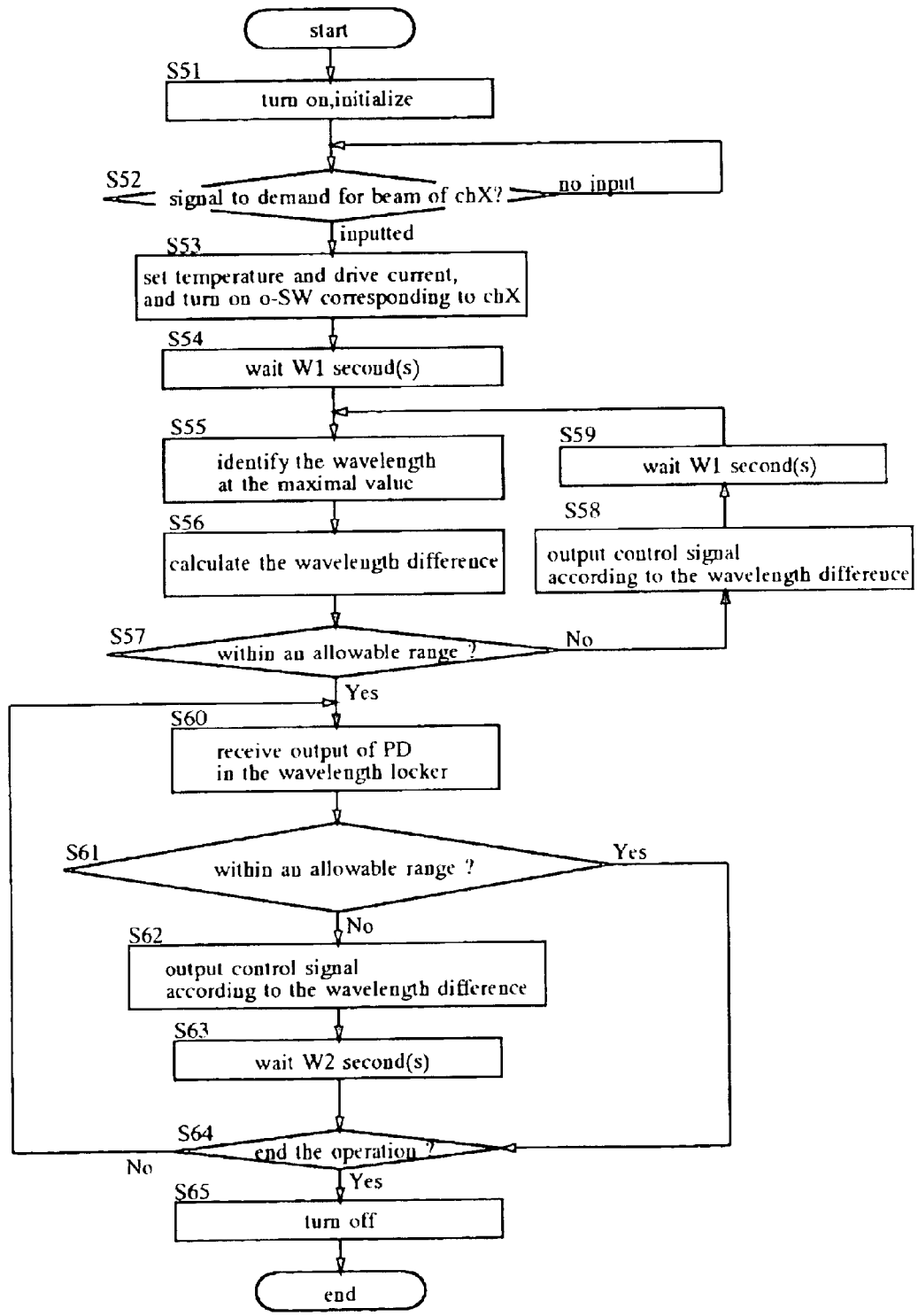
FIG. 33 is a flow chart of a controlling CPU in a sixteenth embodiment.

The ordinate of FIG. 32 indicates the light-intensity, and the abscissa indicates the ch (the wavelength). Curves in the upper half of FIG. 32 illustrate the optical spectrums which are measured by the optical spectrum analyzer. The solid curve illustrates the spectrum at the ignition time of the tunable wavelength lasers, and the broken curve illustrates the spectrum at the time when the oscillation wavelength is changed to the initial locking wavelength.

The controlling CPU 415 receives signals from the optical spectrum analyzer 413 and the wavelength locking apparatus 414, and uses the optical spectrum analyzer 413, as will be described hereinafter, to change the oscillation wavelengths of the tunable wavelength lasers 110-1 to 110-8 from the initial igniting wavelength, i.e., the wavelength at the ignition times of the tunable wavelength lasers 110-1 to 110-8 to the initial locking wavelength corresponding to the desired wavelength. After this, the controlling CPU 415 locks the oscillation wavelength by using the wavelength locking apparatus 414. Here, the initial locking wavelength corresponding to each ch is set within the locking range corresponding to each ch, as set for each ch, of the wavelength locking apparatus 414.

According to control signals from the controlling CPU 415, the tunable wavelength lasers 110-1 to 110-8 are adjusted on the drive currents and are locked at the desired wavelength.

The operations of the multi-constant wavelength light source 400 and the wavelength locker 401 will be described in the following.

The multi-constant wavelength light source 400 is turned ON by a system controlling apparatus, although not shown in FIG. 31, for controlling the WDM optical communication system generally. By this ON, a program stored in the controlling CPU 415 is started to initialize (at S51) the circuits in the multi-constant wavelength light source 400.

The controlling CPU 415 decides (at S52) whether or not one of the thirty-two tunable wavelength lasers 110-1 to 110-8 has been demanded for igniting a means corresponding to the ch. If this answer is NO, the operation of S52 is repeated till the demand is made.

The controlling CPU 415 selects, if demanded for outputting the ch3, for example, one of the thirty two tunable wavelength lasers 110-1 to 110-8, and sets (at S53) the selected tunable wavelength laser with a temperature and a drive current corresponding to the ch3 and sends a control signal. The controlling CPU 415 outputs (at S53) the control signal to the 8×optical SW 410 and the 4×optical SW 411 so that the laser beam outputted from the selected one of the tunable wavelength lasers 110-1 to 110-8 may be inputted into the coupler 412.

In accordance with this control signal, the selected one of the tunable wavelength lasers 110-1 to 110-8 oscillates the laser beam with the initial igniting wavelength, as illustrated in the upper half of FIG. 32. The laser beam, as outputted from the selected one of the tunable wavelength lasers 110-1 to 110-8 by the operation of S53, is inputted into the optical spectrum analyzer 413 and the wavelength locking apparatus 414.

The controlling CPU 415 interrupts (at S54) the operations at and after S55 for W1 seconds so as to wait for that the laser oscillations of the tunable wavelength lasers 110-1 to 110-8 are locked.

The optical spectrum analyzer 413 receives the laser beams outputted from the tunable wavelength lasers 110-1 to 110-8, and measures the spectrum with the wavelength band (for the ch0=1,551 nm) containing the wavelength band of the ch0 to the ch31 and ranging from 1,550 nm to 1,575.8 nm. The optical spectrum analyzer 413 sends the measurement results to the controlling CPU 415. From these measurement results, the controlling CPU 415 detects (at S55) the wavelength for giving the maximal value of the light-intensity. In the case of the first detection, the detected wavelength is the initial igniting wavelength.

The controlling CPU 415 calculates (at S56) the difference between the detected wavelength and the initial locking wavelength corresponding to the ch3 by subtracting the initial locking wavelength corresponding to the ch3 from the detected wavelength. From this calculated value, the controlling CPU 415 decides (at S57) whether or not the wavelength difference inbetween is within an allowable range. This allowable range depends upon the locking range of the wavelength locking apparatus 412 so that it can be enlarged when the locking range is wide but cannot when the locking range is narrow. For example, the allowable range cannot exceed 0.2 nm when the initial locking wavelength is identical to the desired wavelength and when the locking range is ±0.2 nm around the desired wavelength.

When the decision results in that the calculated value (the wavelength difference) is within the allowable range, the routine advances to the later-described operation of S60.

When the decision results in that the calculated value (the wavelength difference) is not within the allowable range, on the other hand, a control signal according to the calculated value (the wavelength difference) is outputted (at S58). This control signal increases the drive current so as to elongate the oscillation wavelength when the calculated value is minus, because the initial igniting wavelength is shorter than the initial locking wavelength of the ch3. The control signal decreases the drive current so as to shorten the oscillation wavelength when the calculated value is plus, because the initial igniting wavelength is longer than the initial locking wavelength of the ch3.

The controlling CPU 415 interrupts (at S59) the operations at and after S55 for W1 seconds so as to wait for that the laser oscillations of the tunable wavelength lasers 110-1 to 110-8 are locked. After the W1 seconds, the operation of S55 is performed (at S59).

The controlling CPU 415 repeats the operations from S55 to S59 till the calculated value is within the allowable range. By repeating these operations, as illustrated in the upper half of FIG. 32, the oscillation wavelengths of the tunable wavelength lasers 110-1 to 110-8 are adjusted from the initial igniting wavelength to the initial locking wavelength of the ch3.

The controlling CPU 415 receives (at S60) the outputs of the PDs in the wavelength locking apparatus 414 for receiving the laser beams through the periodic filter, from the wavelength locking apparatus 414.

The controlling CPU 415 calculates the differences between the received values and the target values at the locking points by subtracting the received values from the target values at the locking points, and decides (at S61) whether or not the calculated values are within an allowable range. The calculations of those differences correspond to the setting of the differences between the present oscillation wavelengths of the tunable wavelength lasers 110-1 to 1108 and the locking wavelength.

If the decision results in that the calculated values are within the allowable range, the later-described operation of S64 is performed.

If the decision results in that the calculated value(or the wavelength difference) is not within the allowable range, a control signal according to the calculated value (or the wavelength difference) is outputted (at 62). This control signal is a signal for increasing the drive current to elongate the oscillation wavelength because the present oscillation wavelength is shorter than the desired wavelength of ch3 for the minus calculated value. For the plus calculated value, the control signal is a signal for decreasing the drive current to shorten the oscillation wavelength because the present oscillation wavelength is longer than the desired wavelength.

The controlling CPU 415 interrupts (at S63) the operations at and after S64 for W2 seconds so as to wait for that the laser oscillation of the tunable wavelength laser 110-1 to 110-8 is locked, and performs (S63) the operation of S64 after the W2 seconds.

The controlling CPU 415 decides (at S64) whether or not a signal for ending the operation of the multi-constant wavelength light source 400 has been received from the system controlling apparatus. When the operation ending signal is received, the power is turned OFF (S65) to end the routine.

When the operation ending signal is not received, on the other hand, the controlling CPU 415 returns the routine to S60 to repeat the operations of S60 to S64 till the calculated value falls within the allowable range. By repeating these operations, the oscillation wavelength of the tunable wavelength laser 110-1 to 110-8 is adjusted from the igniting wavelength to the desired wavelength of the ch3 so that it is locked at the ch3. Furthermore, by operating these operations, the discrepancy is compensated, if caused in the oscillation wavelength by noises, to lock the oscillation wavelength.

Thus, the multi-constant wavelength light source 400 (the wavelength locker 401) according to the sixteenth embodiment is enabled to adjust the initial locking range of the desired wavelength by using the optical spectrum analyzer 413, as described hereinbefore, no matter what wavelength the tunable wavelength lasers 110-1 to 110-8 might be emitted with. The multi-constant wavelength light source 400 (the wavelength locker 401) is enabled to lock the initial locking range at the desired wavelength by using the wavelength locking apparatus 414.

This makes it unnecessary unlike the prior art to design the wavelength locking apparatus especially for a specific laser source so that the multi-constant wavelength light source 400 (the wavelength locker 401) can be applied to any laser source. Since the oscillation wavelength can be changed from the wavelength at the ignition time to the locking range of any wavelength, the multi-constant wavelength light source 400 (the wavelength locker 401) can be applied to not only the laser source for outputting one wave but also the laser source for outputting a plurality of wavelengths.

The multi-constant wavelength light source 400 (the wavelength locker 401) is controlled at the two stages of the control state, at which the oscillation wavelength is changed to the locking range of the desired wavelength, and the control stage at which the oscillation wavelength is locked at the desired wavelength, so that it can lock the oscillation wavelength more accurately at the desired wavelength.

By switching the 8×optical SW 410 and the 4×optical SW 411, on the other hand, the thirty two tunable wavelength lasers 110-1 to 110-8 can be operated in a time-sharing manner, so that the oscillation wavelengths of the thirty two tunable wavelength lasers 110-1 to 110-8 can be locked at the desired wavelength by the single optical spectrum analyzer 413.

Here, in the tenth to sixteenth embodiments, the operations of the multi-constant wavelength light source (the wavelength locker) have been described on the case in which they are locked on a specific ch such as the ch3 or ch4. However, the operations can be likewise described for the remaining ch, so that the oscillation wavelength is locked at the wavelength of a desired ch.

In the tenth to sixteenth embodiments, the operations at the ignition time of the multi-constant wavelength light source have been described. Even while the multi-constant wavelength light source is being operating, however, the wavelength in operation can be likewise changed to and locked at the desired wavelength by deeming the operating wavelength as the igniting wavelength.

In the tenth to sixteenth embodiments, moreover, the tunable wavelength DBR has been used as the tunable wavelength lasers, but the invention should not be limited thereto. The variable DBR laser may be replaced by a tunable wavelength laser capable of outputting laser beams of a plurality of wavelengths, such as a tunable wavelength DFB laser enabled to change the oscillation wavelength by changing the temperature, or a laser array in which laser elements for oscillating different wavelengths are arranged in an array.

In the eleventh to fifteenth embodiments, the ET filter has been used as the periodic filter, but the invention should not be limited thereto. For example, a multi-layered filter. could be utilized.

In the tenth to fifteenth embodiments, moreover, the boundary is not contained in the locking range.

In the tenth to sixteenth embodiments, on the other hand, the description has been made on the case in which the wavelength space of the ch is 0.8 nm, but the wavelength space may be any of those of the ch, such as 0.4 nm.

In the eleventh to fourteenth embodiments, moreover, the PDo1 and PDo2 to be obtained by receiving the laser beams through the periodic filter are not used as they are for the control, but the PDo3 to be obtained by receiving the laser beam directly is utilized as the reference value, so that the fluctuations of the PDo1 and PDo2 due to the noises or aging can be compensated.

[Seventeenth Embodiment]

Figure 34:
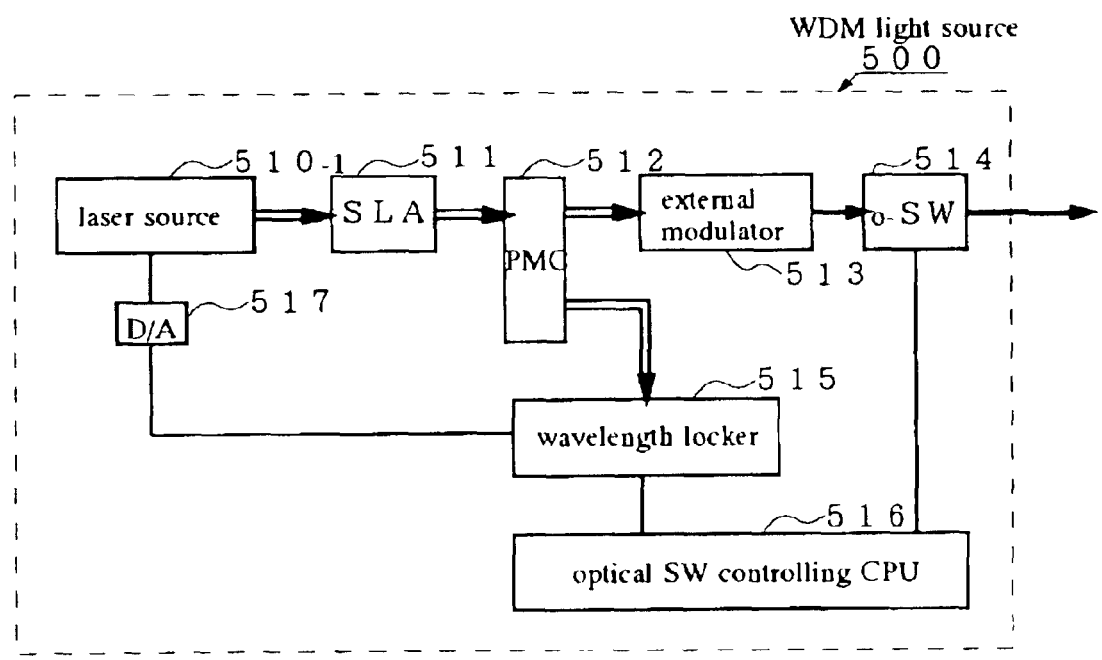
FIG. 34 is a diagram showing a construction of a seventeenth embodiment.

In FIG. 34, arrowed double lines indicate polarization maintaining fibers, and arrowed single lines indicate single-mode fibers. Single lines without any arrow indicate signal lines for transmitting electric signals.

Figure 35:
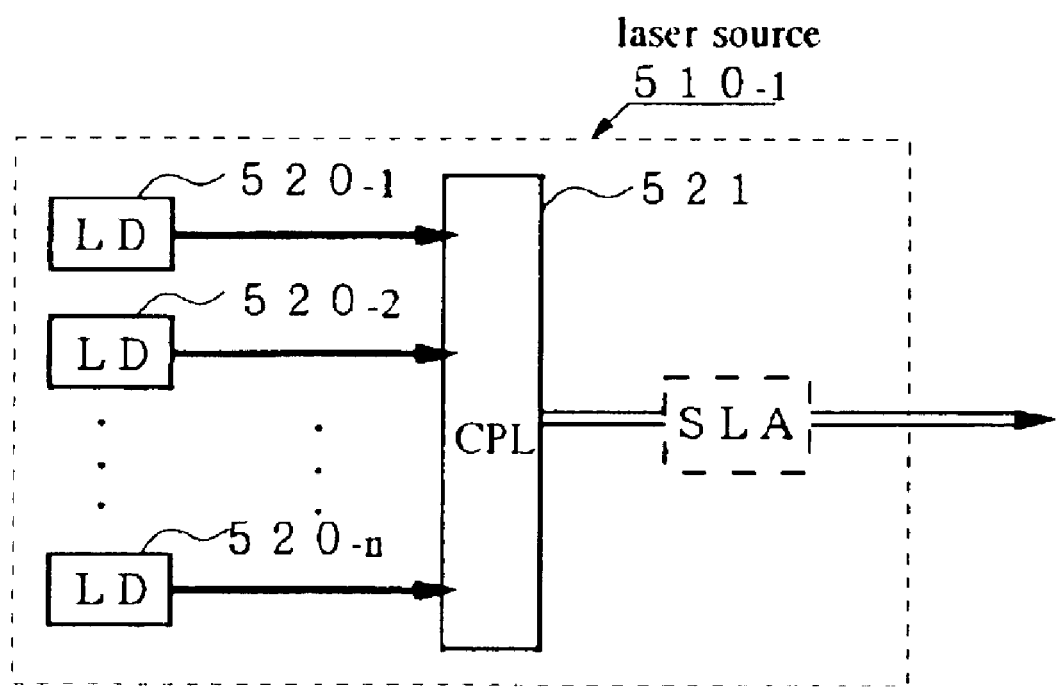
FIG. 35 is a diagram showing an example of a construction of a laser source to be used in a WDM light source.

In FIG. 34, a laser beam, as outputted from a laser source 510-1 for oscillating a laser beam of a plurality of wavelengths, is inputted through a polarization maintaining fiber for transmissions while maintaining the polarization planes, to a semiconductor laser amplifier (as will be abbreviated into the "SLA") 511. This SLA 511 amplifies the laser beam to a desired light-intensity. The laser source 510-1 is prepared by arranging laser diodes (as will be abbreviated into the "LD") 520-1 to 520-n of a single mode for oscillating different wavelengths, over a common semiconductor substrate, as shown in FIG. 35. The individual laser beams outputted from the individual LDs 520-1 to 520-n is collected to one by a coupler 521 connected with the polarization maintaining fibers. And, the laser source 510-1 is constructed to output a laser beam to be oscillated from any of the LDs 520-1 to 520-n. Moreover, this laser source 510-1 may be constructed such that a Peltier element contacts with the LDs 520-1 to 520-n so as to lock the oscillation wavelength. The SLA 511 establishes a population inversion with the injection current which is fed to the semiconductor, and amplifies the inputted beam by an induction release. The SLA 511 has a structure similar to that of a semiconductor laser excepting that a nonreflective coating is applied to the end face so as to prevent the laser oscillation.

The laser beam amplified by the SLA 511 is inputted through the polarization maintaining fibers into the polarization maintaining coupler (PMC) 512 for branching the beam, while keeping the polarization plane.

Here, the SLA 511 may also be prepared by for forming all the LDs 520-1 to 520-n and the coupler 521 over a common semiconductor substrate.

The first laser beam branched by the polarization maintaining coupler 512 is inputted into and modulated by an external modulator 513 for modulations with information to be sent, through the polarization maintaining fibers. This external modulator 513 is the Mach-Zehnder interferometer. The laser beam modulated is inputted through the single-mode fibers into an optical SW 514. This optical SW 514 is turned ON/OFF with the signal of an optical SW controlling CPU 516. The optical SW 514 is turned ON to transmit the laser beam outputted from the external modulator 513, when the laser beam has the desired wavelength, but OFF to shade the laser beam when the laser beam does not have the desired wavelength.

And, the laser beam, as outputted from the optical SW 514 through the single-mode fibers, becomes the output beam of the WDM laser source. This output beam is wavelength-multiplexed over the laser beam outputted from another WDM light source, by a multiplexer for wavelength-multiplexing a plurality of laser beams, although not shown in FIG. 34, so that it is sent out as a WDM signal to an optical communication network.

On the other hand, a second laser beam, as branched by a polarization maintaining coupler 512, is inputted through the polarization maintaining fibers into a wavelength locker 515. This wavelength locker 515 receives the second laser beam and locks it substantially at the desired wavelength in accordance with the light-intensity of the second laser beam. The wavelength locker 515 to be utilized can be any if it can lock a plurality of wavelengths at the desired wavelength. Especially, the wavelength locker 515 is properly exemplified by the wavelength lockers employed in the first to sixteenth embodiments, from a standpoint that the oscillation wavelength can be locked highly accurately at the desired wavelength. In the seventeenth embodiment, therefore, there is utilized the wavelength locker which is disclosed in the tenth embodiment.

The polarization maintaining coupler 512 for branching the laser beam to the wavelength locker 515 is connected upstream of the external modulator 513 so as to lock the oscillation wavelength highly accurately at the desired wavelength. This is because the connection downstream of the external modulator 513 the spectrum is widened by the modulation to lower the accuracy for locking the oscillation wavelength at the desired wavelength.

The optical SW controlling CPU 516 receives the signal from the wavelength locker 515 and locks the wavelength of the laser beam, as outputted from the laser source, at the desired wavelength. Moreover, the optical SW controlling CPU 516 controls the ON/OFF of the optical SW 514 in accordance with the oscillation wavelength of the laser source.

From the system controlling apparatus for controlling the WDM optical communication system, although not shown in FIG. 34, the optical SW controlling CPU 516 receives a signal for igniting the laser source 510-1 with the desired wavelength such as a wavelength corresponding to the ch5. Alternatively, the optical SW controlling CPU 516 receives a signal for changing a wavelength other than that of the ch5 in operation, to the wavelength corresponding to the ch5.

The optical SW controlling CPU 516 having received that signal sends an OFF control signal to the optical SW 514. In accordance with this control signal, the optical SW 514 shades the laser beam inputted from the external modulator 513. After this, the optical SW CPU 516 sends a desired wavelength, as exemplified by the control signal for oscillating the wavelength corresponding to the ch5, to the wavelength locker 515.

In accordance with this control signal, the wavelength locker 515 selects and oscillates such one of the LDs 520-1 to 520-n of the laser source 510-1 as corresponds to the ch5. And, the wavelength locker 515 locks the laser beam outputted from the laser source 510-1, at the wavelength of the ch5 by the operations which have been described in connection with the tenth embodiment.

When it is confirmed that the laser beam has been locked at the wavelength of the ch5, the wavelength locker 515 sends the signal indicating the locking at the wavelength of the ch5, to the optical SW controlling CPU 516.

This optical SW controlling CPU 516 having received that signal sends the ON control signal to the optical SW 514. In accordance with this control signal, the optical SW 514 transmits the laser beam inputted from the external modulator 513. The laser beam, as modulated by the external modulator 513 with the signal to be sent, is transmitted through the optical SW 514 and outputted as an output beam so that it is wavelength-multiplexed by the multiplexer over the laser beam coming from another WDM laser source and is sent out to the optical communication network.

This WDM laser source 500 is provided with the optical SW 514 for transmitting/shading a beam in dependence upon whether or not the wavelength is the desired one. At a ignition with a wavelength other than the desired wavelength when the laser source 510-1 is ignited or with a changed wavelength being not the desired one when the ch in the WDM system is changed, therefore, the laser beam is not outputted from the optical SW 514 till the wavelength is locked at the desired one. As a result, the WDM laser source 500 exerts no adverse effect such as the crosstalk on the optical signal in operation in the optical communication system.

Here in the seventeenth embodiment, the optical SW 514 is connected with the output terminal of the external modulator 513 to transmit/shade the laser beam outputted from the external modulator 513. Without the optical SW 514, however, the laser beam to be outputted can be shaded by making the external modulator 513 inactive by applying no drive voltage to the external modulator 513.

In the seventeenth embodiment, on the other hand, the SLA 511 is used, but the invention should not be limited thereto. For example, an optical fiber amplifier could be used.

Figure 36:
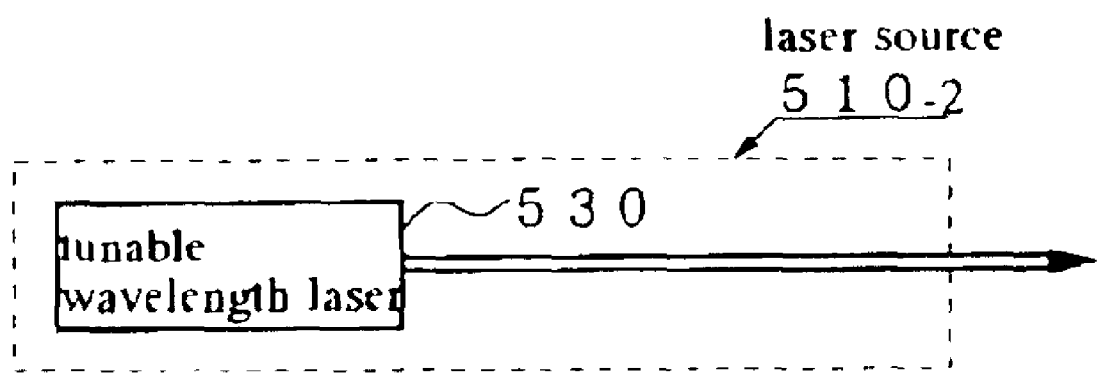
FIG. 36 is a diagram showing an example of a construction of a laser source to be used in the WDM light source.
Figure 37:
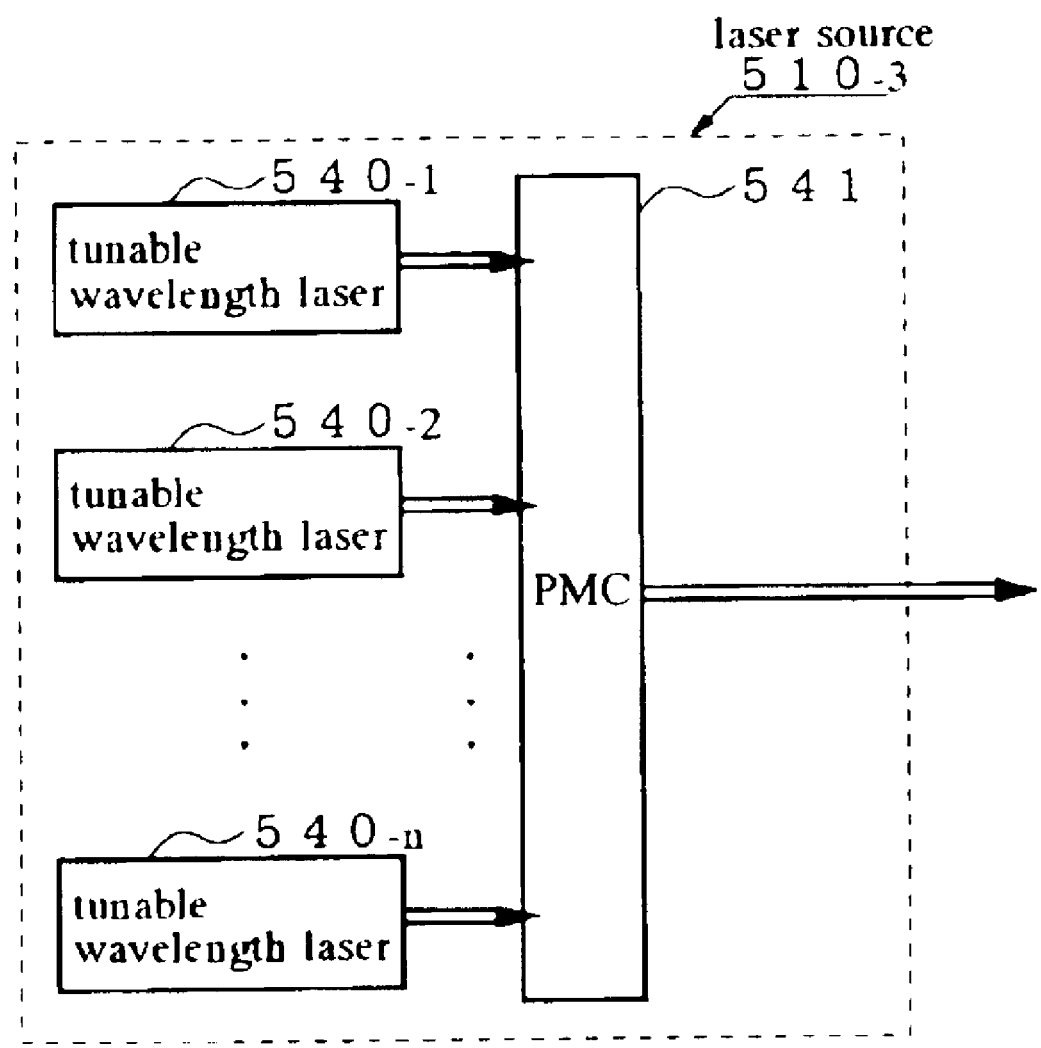
FIG. 37 is a diagram showing an example of a construction of a laser source to be used in the WDM light source.
Figure 38:
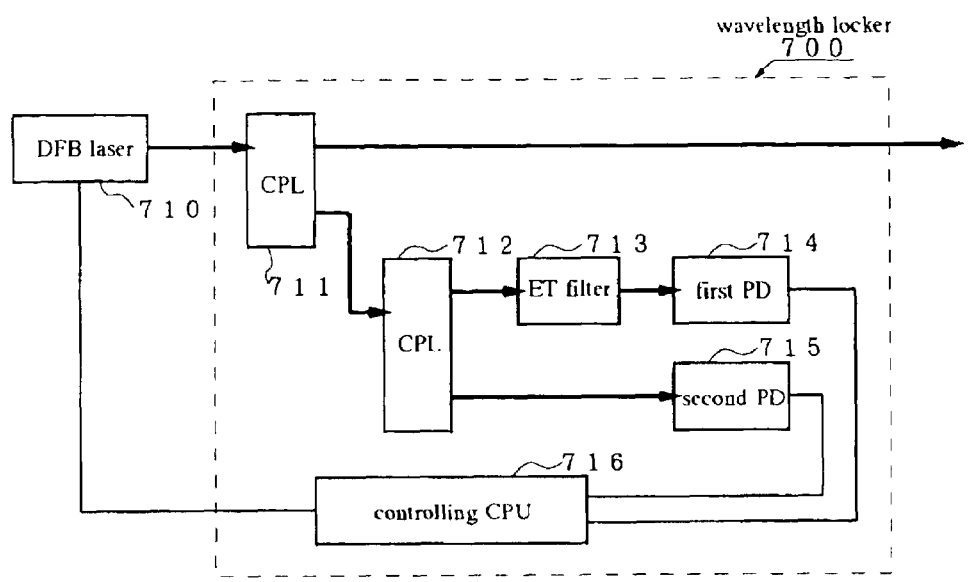
FIG. 38A is a diagram of a construction of a one-wavelength locker of the prior art.
FIG. 38B is an explanatory diagram of the case in which the wavelength is locked at ch1.
Figure 38:
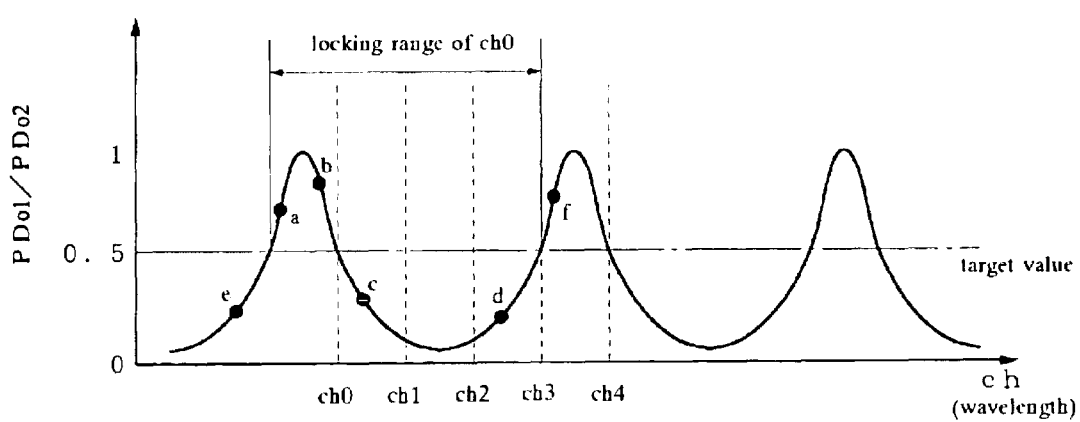
Figure 39:
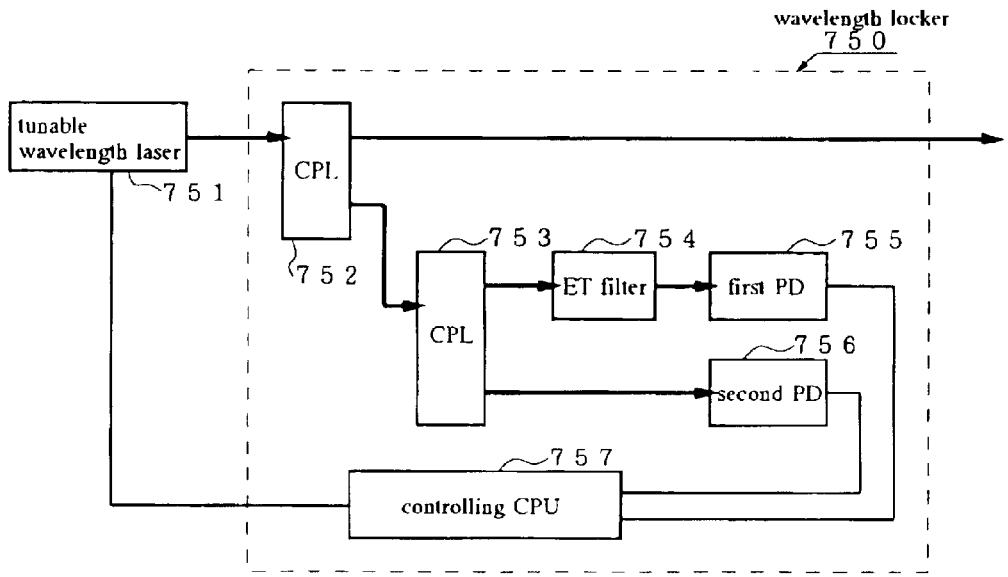
FIG. 39A is a diagram of a construction of a wavelength locker of the prior art.
FIG. 39B is a diagram of relations between individual locking ranges and an individual ch in the wavelength locker of the prior art.
Figure 39:
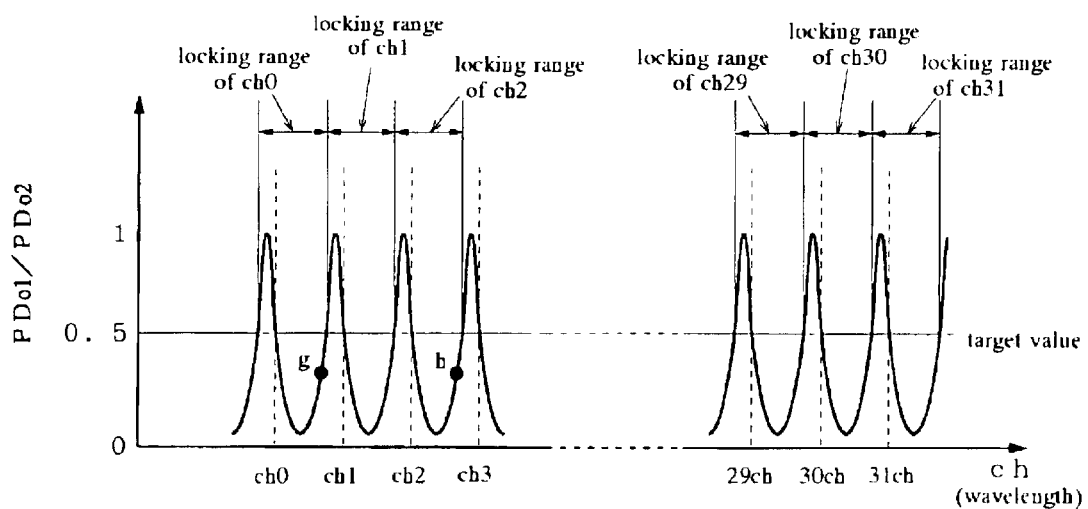

In the seventeenth embodiment, moreover, the laser source having the plurality of LDs 520-1 to 520-n formed in the array has been employed as the laser source 510-1, but the invention should not be limited thereto. A tunable wavelength laser 530, as shown in FIG. 36, may be used to oscillate a plurality of wavelengths with the single laser. The tunable wavelength laser 530 could be exemplified by a tunable wavelength DBR laser for changing the oscillation wavelength by changing the internal grating period with the injection current or by a tunable wavelength DFB laser for changing the oscillation wavelength by changing the temperature. The laser source may be constructed to have a plurality of tunable wavelength lasers 540-1 to 540-n and a polarization maintaining coupler 541, as shown in FIG. 37. In this construction, the individual laser beams, as outputted from the individual tunable wavelength lasers 540-1 to 540-n, are transmitted through the polarization maintaining fibers and are collected to one by the polarization maintaining coupler 541. With this construction, about eight oscillation wavelengths can be changed at most at the present time by one tunable wavelength laser, but more wavelengths could be oscillated. For example, a WDM light source of sixty-four waves could be satisfied by providing with eight tunable wavelength lasers for eight waves. In FIG. 37, moreover, a laser source 510-3 might be enabled to output the laser beam while selecting only the tunable wavelength lasers 540-1 to 540-n in operation by employing a polarization holding optical SW in place of the polarization maintaining coupler 541.

The case of the 8-wave WDM system has been described in connection with the tenth to fifteenth embodiments, and the case of the 32-wave WDM system has been described in connection with the sixteenth and seventeenth embodiments. However, either of these cases should not be limited to those multiplexities.

Moreover, the wavelength locker, the multi-constant wavelength light source and the WDM light source in the tenth to seventeenth embodiments could be employed as an ordinary light source and a preparatory light source in an optical transmitter of the WDM optical communication system. They could also be used as the ordinary light source and the preparatory light source in an optical ADM apparatus which is disposed between the terminal stations of the WDM optical communication system for inserting/branching/transmitting an optical signal of a specific wavelength.

The invention is not limited to the above embodiments and various modifications may be made without departing from the spirit and the scope of the invention. Any improvements may be made in part or all of the components.

What is claimed is:

1. A wavelength locker for controlling a wavelength of light from a laser, comprising:
   a filter filtering said wavelength of light having a periodic characteristic, said filter having a free spectrum range equal to an integral number of times more than a length of specific spaces between wavelengths;
   a detecting part detecting said wavelength of light received through said filter; and
   a controlling part controlling said wavelength of light to become a specific wavelength of a plurality of specific wavelengths, according to an output of said detecting part.

2. A wavelength locker according to claim 1, wherein said filter includes:
   a branching part branching the wavelength of light;
   a combining part combining the branched wavelength of light;
   a first port outputting a first interfering light from said branched wavelength of light; and
   a second port outputting a second interfering light from said branched wavelength of light.

3. A wavelength locker according to claim 2, wherein said detecting part comprises:
   a first detecting part detecting a light-intensity of said first interfering light; and
   a second detecting part detecting a light-intensity of said second interfering light.

4. A wavelength locker according to claim 1, wherein said controlling part determines whether the specific wavelength is even numbered or odd numbered based on a predetermined numbering of said plurality of wavelengths, and
   controls said wavelength of light so that said wavelength becomes the specific wavelength, according to a result of the determining and the output of said detecting part.

5. A wavelength locker according to claim 1, wherein said filter has a free spectrum range equal to twice the length of specific spaces and
   has a finesse wherein spaces of two adjacent wavelengths which obtains any value of light transmittance is equal to said specific spaces.

6. A wavelength locker according to claim 1, wherein said filter is set so that half of a free spectrum range of the filter is equal to or more than a length of space between the shortest wavelength and the longest wavelength of said plurality of specific wavelengths.

7. A wavelength locker according to claim 1, wherein said controlling part comprises:
   a storing part storing in advance a plurality of set points corresponding to each of a plurality of wavelengths, and
   controls said wavelength of light so that the output of said detecting part is at a set point corresponding to a specific wavelength stored in said storing part.

8. A wavelength locker according to claim 1, wherein said filter comprises:
   a first filter having a first free spectrum range; and
   a second filter having a second free spectrum range different from said first free spectrum range.

9. A wavelength locker according to claim 8, wherein:
   said filter comprises a first filter having a first free spectrum range, and a second filter having a second free spectrum range different from said first free spectrum range;
   said detecting part comprises a first detecting part detecting said wavelength of light inputted through said first filter, and a second detecting part detecting said wavelength of light inputting through said second filter; and
   said controlling part controls a wavelength of said wavelength of light so that it becomes a specific wavelength, in accordance to an output of said second detecting part, after controlling a wavelength of said wavelength of light according to an output of said first detecting part.

10. A wavelength locker according to claim 1, wherein said filter comprises:
    a first filter setting a first free spectrum range so that an oscillation wavelength of said laser when said wavelength of light is ignited, exists between two wavelengths closest to an initial locking wavelength which gives a light transmittance equal to a light transmittance of the initial locking wavelength, and
    a second filter setting a second free spectrum range which is different from said first free spectrum range and is equal to the length of said specific spaces.

11. A wavelength locker according to claim 8, wherein:
    said filter comprises a first filter setting a first free spectrum range so that an oscillation wavelength of said laser when said wavelength of light is ignited, exists between two wavelengths closest to an initial locking wavelength which gives a light transmittance equal to the light transmittance of the initial locking wavelength, and a second filter setting a second free spectrum range which is different from said first free spectrum range and is equal to the length of said specific spaces;
    said detecting part comprises a first detecting part detecting said wavelength of light inputted through said first filter, and a second detecting part detecting said wavelength of light inputted through said second filter; and
    said controlling part controls a wavelength of said wavelength of light so that it becomes a specific wavelength in accordance to an output of said second detecting part, after controlling a wavelength of said wavelength of light so that an output of said first detecting part is controlled to have said light transmittance.

12. A wavelength locker according to claim 1, wherein said filter comprises:
    a first filter setting so that half of a free spectrum range is equal to or more than a length of space between the shortest wavelength and the longest wavelength of said plurality of wavelengths, and
    a second filter whose free spectrum range is equal to the lengths of said specific spaces.

13. A wavelength locker according to claim 1, wherein:
    said filter comprises a first filter setting so that half of a free spectrum range is equal to or more than a length of space between the shortest wavelength and the longest wavelength of said plurality of wavelengths, and a second filter whose free spectrum range is equal to the lengths of said specific spaces;
    said detecting part comprises a first detecting part detecting said wavelength light inputted through said first filter, and a second detecting part detecting said wavelength of light inputted through said second filter; and said controlling part comprises a storing part storing in advance a plurality of set points corresponding to each of a plurality of wavelengths, and controls the wavelength of said wavelength of light so that it becomes a specific wavelength in accordance to an output of said second detecting part after controlling said wavelength of light so that an output of said first detecting part results to be at the set point corresponding to said specific wavelength which is stored in said storing part.

14. A wavelength locker according to claim 1, wherein said filter comprises:

a plurality of first filters whose free spectrum range is equal to an integral number of times more than the length of said specific spaces; and a plurality of second filters whose free spectrum range is different from that of said first filter and is equal to an integral number of times more than the length of said specific spaces.

15. A wavelength locker according to claim 1, wherein:

said filter comprises a plurality of first filters whose free spectrum range is equal to an integral number of times more than the length of said specific spaces, and a plurality of second filters whose free spectrum range is different from that of said first filter and is equal to an integral number of times more than the length of said specific spaces;

said detecting part comprises said plurality of first detecting part wherein said wavelength of light is inputted through said plurality of first filters, and a plurality of second detecting part wherein said wavelength of light is inputted through said plurality of second filters; and said controlling part controls the wavelength of said wavelength of light so that it may respectively receive an output each from a first detecting part, of said plurality of first detecting part, and a second detecting part, of said plurality of second detecting part, which respectively correspond to a specific wavelength.

16. A multi-constant wavelength light source for stably outputting a laser beam, comprising:

a laser emitting said laser beam;

a filter filtering said laser beam having a periodic characteristic, said filter having a free spectrum range equal to an integral number of times more than a length of specific spaces between wavelengths;

a detecting part detecting a light-intensity of said laser beam received through said filter; and a controlling part controlling the wavelength of said laser beam to become a specific wavelength, according to an output of said detecting part.

17. A method of controlling a wavelength of light from a laser, comprising:

filtering said wavelength of light having a periodic characteristic with a filter having a free spectrum range equal to an integral number of times more than a length of specific spaces between wavelengths;

detecting said wavelength of light received through said filter; and controlling said wavelength of light to become a specific wavelength of a plurality of specific wavelengths, according to an output of the detection.

18. A wavelength locker for controlling a wavelength of light from a laser, comprising:

a filter to filter said wavelength of light, and having a free spectrum range equal to a period of wavelength space which is at least twice a length of wavelength space provided between a plurality of wavelengths;

a detecting part to detect said wavelength of light received through said filter; and a controlling part to control said wavelength of light to become a specific wavelength according to an output of said detecting part.

* * * * *